United States Patent
Kimura et al.

(10) Patent No.: US 7,317,621 B2
(45) Date of Patent: Jan. 8, 2008

(54) LAMINATED CIRCUIT BOARD AND ITS MANUFACTURING METHOD, AND MANUFACTURING METHOD FOR MODULE USING THE LAMINATED CIRCUIT BOARD AND ITS MANUFACTURING APPARATUS

(75) Inventors: Junichi Kimura, Nishikasugai-gun (JP); Toshihiro Nishii, Hirakata (JP); Akio Ochi, Yawata (JP); Shinji Harada, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 373 days.

(21) Appl. No.: 10/991,682

(22) Filed: Nov. 18, 2004

(65) Prior Publication Data
US 2005/0117312 A1 Jun. 2, 2005

(30) Foreign Application Priority Data
Nov. 20, 2003 (JP) .............................. 2003-390528

(51) Int. Cl.
*H05K 7/00* (2006.01)
(52) U.S. Cl. ..................................... 361/760
(58) Field of Classification Search ................ 361/760, 361/737; 257/679, 787, 492, 380
See application file for complete search history.

(56) References Cited

U.S. PATENT DOCUMENTS 6,380,614 B1* 4/2002 Higuchi et al. ............. 257/679
6,882,545 B2* 4/2005 Akita et al. ................. 361/767

FOREIGN PATENT DOCUMENTS

JP 2003-86949 3/2003

* cited by examiner

*Primary Examiner*—J. F. Duverne
(74) *Attorney, Agent, or Firm*—RatnerPrestia

(57) ABSTRACT

A laminated circuit board with electronic components buried therein comprises a substrate on which a land disposed on one main surface thereof is connected and fixed by solder to an integrated circuit (or the like). A sheet is laminated on the upper surface of the substrate. A filling portion by fluid resin is formed by clearance at the outer periphery of the integrated circuit (or the like). The sheet maintains its shape by woven or non-woven cloth having a hole in which the integrated circuit (or the like) is buried. The woven or non-woven cloth is impregnated with resin having heat fluidity and is thermally compressed. Thus, the electrical and mechanical connections between the laminated circuit board and electronic component can be enhanced in reliability.

25 Claims, 39 Drawing Sheets

LAMINATED CIRCUIT BOARD AND ITS MANUFACTURING METHOD, AND MANUFACTURING METHOD FOR MODULE USING THE LAMINATED CIRCUIT BOARD AND ITS MANUFACTURING APPARATUS

TECHNICAL FIELD

The present invention relates to a laminated circuit board with electronic components buried therein and its manufacturing method, and a manufacturing method for a module using the laminated circuit board and its manufacturing apparatus.

BACKGROUND ART

A laminated circuit board with electronic components buried therein will be described with reference to FIG. 67. Laminated circuit board 670 with electronic components buried therein is such that substrates 2a to 2e formed from thermoplastic resin are laminated on one main surface of substrate 1 formed of a metallic base member.

The words "one main surface" and "the other main surface" used in the following description respectively stand for one surface in the direction of thickness and the opposite side surface in those being relatively less in thickness than the sizes of length and width such as resin boards or various sheets. Accordingly, the word "one main surface" does not mean only a "surface" of a resin board or sheet, and the word "the other main surface" does not mean only a "back" of a resin board or sheet.

In FIG. 67, hole 4 for burying electronic component 3 therein is formed in substrate 2c, 2d. Pattern 5 is provided on one main surface or the other main surface of substrates 2a to 2e. Conductive paste 6 is filled into via-hole 7 formed in substrates 2a to 2e. Electrode 8 is provided at both ends of electronic component 3, and it is conducting with conductive paste 6.

Here, conductive paste 6 includes tin particles and silver particles. Also, for precisely aligning electrode 8 to via-hole 7 filled with conductive paste 6, the clearance between hole 4 and electronic component 3 is 20 μm over the entire periphery of electronic component 3, which is nearly the same in size as the outside dimension of electronic component 3.

A laminated circuit board having such a configuration is heated under pressure at temperature 250° C. to 350° C. and pressure 1 to 10 MPa for 10 to 20 minutes to complete laminated circuit board 670. As it is heated under pressure in this way, tin is melted and integrated with silver, and electrode 8 of electronic component 3 is connected to conductive paste 6, then electronic component 3 is electrically and mechanically fixed on laminated circuit board 670.

As prior art documents related to this kind of technology, for example, a patent is disclosed in the publication of Japanese Patent Laid-Open Application No. 2003-86949.

However, in such a conventional laminated circuit board 670 with electronic component 3 buried therein, as the mounting density of electronic component 3 is increased, there arises the following problem. That is, as shown in FIG. 68, for example, if electronic components 3a to 3e are mounted on substrate 2c with narrow pitch 9 of 100 μm, as in FIG. 69 showing the cross-section, width 11 of crosspiece 10a disposed between electronic components 3a and 3b is 60 μm (100 μm–20 μm×2). On the other hand, thickness 12 of substrate 2c is 75 μm, and width 11 of crosspiece 10a is less in thickness than substrate 2c. Therefore, it is physically difficult to manufacture laminated circuit board 670.

As shown in the plan view of electronic components 3 (3a to 3e) in FIG. 70 and the sectional view of electronic components 3 (3a to 3e) in FIG. 71, it can be considered that there is provided hole 13 including electronic components 3a to 3e mounted with narrow pitch 9. However, since substrate 2c is thermoplastic, for example, resin 15 is not sufficiently filled between electronic components 3a and 3b, causing air 16 to remain therein.

After that, if circuit board 670 is subjected to reflow soldering, air 16 is expanded due to the reflow temperature, causing a great stress to be applied between electronic component 3a and electronic component 3b.

A great stress then applied is the cause of a problem such that the connection of electronic components 3 is affected. That is, the conduction of conductive paste 6 shown in FIG. 67 is cut off or cracking takes place after resin sealing, and water intrudes through such crack causing electrode 8 to get rusted, which leads to defective insulation.

On the other hand, it can be considered that the heat fluidity of resin is increased for enhancing the filling efficiency of resin. However, in this case, there is a problem that the shape of thermoplastic substrate 2c itself cannot be maintained.

DISCLOSURE OF THE INVENTION

The purpose of the present invention is to provide a laminated circuit board which may assure high reliability in electric connection and mechanical connection with electronic components.

In order to achieve this purpose, the laminated circuit board of the present invention is such that the shape of the sheet is maintained by woven or non-woven cloth provided with openings, having clearance between it and the outer periphery of the electronic component, and the woven or non-woven cloth is impregnated with resin having heat fluidity. Thus, even with the mounting density of electronic components increased, resin can be sufficiently filled into a large opening having no crosspiece, and it is possible to improve the reliability of the laminated circuit board and electronic components without affecting the electric and mechanical connections.

Also, the laminated circuit board of the present invention is a laminated circuit board with electronic components buried therein, comprising a substrate on which a land provided on one main surface thereof is connected and fixed to the electrode of the electronic component by using a connecting and fixing material. Further, it comprises a first sheet laminated on one main surface of the substrate and provided with a filling portion by fluid resin at the outer periphery of the electronic component. The first sheet of the present invention is provided with an opening having clearance between it and the outer periphery of the electronic component at a portion corresponding to the electronic component, and is formed of plate-like woven or non-woven cloth impregnated with heat-fluid resin. And, the first sheet and the substrate are compressed under heat and integrated. Woven or non-woven cloth is suitable for maintaining the shape of the sheet. Here, the resin fluid filling portion is a clearance to be filled with heat-fluid resin which has been soaked into the first sheet. By using such a configuration, no air or the like will remain in the resin fluid filling portion because sufficient resin is fully filled therein. Also, the electrical connection and mechanical connection are not affected by stresses generated when the air or bubbles are thermally expanded, thereby improving the reliability of the laminated circuit board and electronic components.

Also, since electronic components are mounted in a substrate, they can be inspected in a state of being mounted in the substrate, and the non-defective percent after completion of the laminated circuit board is improved. Further, resin is sufficiently filled into even narrow clearances because the resin softens during thermo-compression bonding.

Also, the laminated circuit board of the present invention is a laminated circuit board with electronic components buried therein, and comprises electronic components formed in pattern disposed on one main surface of the board, and a first sheet laminated on one main surface of the substrate and provided with a filling portion by fluid resin around electronic components. The first sheet is provided with an opening having clearance between it and the outer periphery of electronic component at a portion corresponding to the electronic component, and is formed of plate-like woven or non-woven cloth impregnated with heat-fluid resin, and the first sheet and the substrate are compressed under heat and integrated into a laminated circuit board. Around the electronic components formed in pattern, resin flowing out of the first sheet is filled into the opening, causing the dielectric constant to become higher than at main body of the first sheet, and consequently, the value of inductance can be increased. Also, the size can be reduced if not needed to increase the value of inductance.

Also, the laminated circuit board of the present invention is a laminated circuit board with electronic components buried therein, comprising a substrate on which a land disposed on one main surface thereof is connected and fixed to the electrode of electronic component by using a connecting and fixing material. Also, it comprises a pattern inductor in the vicinity of electronic component, and a first sheet laminated on one main surface of the substrate and provided with a filling portion by fluid resin at the outer periphery of electronic component and pattern inductor.

Further, electronic components are connected by reflow solder, and the first sheet is provided with an opening having clearance between the electronic component and the outer periphery of pattern inductor at a portion corresponding to the electronic component and pattern inductor, and of formed of plate-like woven or non-woven impregnated with heat-fluid resin, and the first sheet and substrate are compressed under heat and integrated into a laminated circuit board. The shape of the sheet is maintained by woven or non-woven cloth, and the woven or non-woven cloth is impregnated with heat-fluid resin, and sufficient resin is fully filled into the resin fluid filling portion, allowing no air or the like to remain. Accordingly, the electrical and mechanical connections between the laminated circuit board, electronic component, and pattern inductor will not be affected by stresses generated when the air or bubbles are thermally expanded, thereby improving the reliability of the laminated circuit board and electronic components.

Also, since electronic components are connected by reflow solder, it assures high productivity and good quality. Also, electronic component is mounted only at a predetermined position because of the self-alignment effect.

Further, since electronic components are mounted in a substrate, they can be inspected in a state of being mounted in the substrate, and the non-defective percent after completion of the laminated circuit board is improved. Also, resin can be sufficiently filled into even narrow clearances of the laminated circuit board because the resin sufficiently softens during thermo-compression bonding.

Also, the laminated circuit board of the present invention is a laminated circuit board with electronic components buried therein, comprising a substrate on which a land disposed on one main surface thereof is connected and fixed to the electrode of electronic component by using a connecting and fixing material. It comprises a first sheet laminated on one main surface of the substrate and provided with a filling portion by fluid resin at the outer periphery of electronic component, and a plurality of fine electronic components are arranged with narrow pitches. The first sheet is plate-like woven or non-woven cloth impregnated with resin and is provided with an opening having clearance between it and the outer periphery of the electronic component at a portion corresponding to the electronic component. Resin having heat fluidity is used, and the first sheet and the substrate are compressed under heat and integrated into a laminated circuit board. The shape of the sheet is maintained by woven or non-woven cloth, and the woven or non-woven cloth is impregnated with resin having heat fluidity, and sufficient resin is fully filled into the resin fluid filling portion, allowing no air or the like to remain. Accordingly, the connections will not be affected by stresses generated when the air or bubbles are thermally expanded, thereby improving the reliability of the connections.

Also, since a plurality of fine electronic components are arranged in one opening with narrow pitches, electronic components can be mounted in high density. Accordingly, it is possible to realize the reduction of size.

Further, since electronic components are mounted in a substrate, they can be inspected in a state of being mounted in the substrate, and the non-defective percent after completion of the laminated circuit board is improved. Also, resin can be fully filled into narrow clearances because the resin sufficiently softens during thermo-compression bonding.

Also, another invention of the present invention is a manufacturing method for a laminated circuit board with electronic components buried therein, comprising the steps of laminating a substrate on which a land disposed on one main surface thereof is connected and fixed to the electrode of electronic component by using a connecting and fixing material, and a first sheet laminated on one main surface of the substrate and provided with a filling portion by fluid resin at the outer periphery of the electronic component. Further, after the laminating step, it comprises the step of integrating the first sheet and the substrate by thermo-compression bonding. The first sheet is provided with an opening having clearance between it and the outer periphery of electronic component at a portion corresponding to the electronic component and is formed of plate-like woven or non-woven cloth impregnated with heat-fluid resin, and the first sheet and the substrate are compressed under heat and integrated into a laminated circuit board.

Since electronic components are mounted in a substrate before the substrate and the first sheet are integrated, it is not necessary to perform positioning of the electronic component and the substrate once again when integrating the substrate and the first sheet. Accordingly, it is very easy to carry out the assembling job. Also, since the first sheet is provided with opening having clearance between it and the electronic component, it is easy to assemble even when an electronic component protruding from the substrate is mounted.

Also, the shape of the sheet is maintained by woven or non-woven cloth, and the woven or non-woven cloth is impregnated with resin having heat fluidity, and therefore, sufficient resin is fully filled into the resin fluid filling portion, and no air or the like will remain at the outer periphery of the electronic component. Accordingly, the electrical and mechanical connections are not affected by stresses generated when the air or bubbles are expanded, thereby improving the reliability of the laminated circuit board and electronic components.

Further, since electronic components are mounted in a substrate, and they can be inspected in a state of being mounted in the substrate, and the non-defective percent after completion of the laminate circuit board is improved.

Also, the manufacturing method for a laminated circuit board of the present invention comprises the steps of laminating electronic components formed in pattern disposed on one main surface of a substrate, and a first sheet having a filling portion by fluid resin around the electronic component on upper surface of the substrate. Also, after the laminating step, the first sheet and the substrate are compressed under heat and integrated. The first sheet is provided with opening having clearance between it and the outer periphery of electronic component at a portion corresponding to the electronic component and is formed of plate-like woven or non-woven cloth impregnated with heat-fluid resin, and the first sheet and the substrate are compressed under heat and integrated into a laminated circuit board. Around the electronic component formed in pattern, resin flowing out of the first sheet is filled into the opening, causing the dielectric constant to become higher than at main body of the first sheet, and the value of inductance of the electronic component formed in pattern can be increased. Also, the size can be reduced if not needed to increase the value of inductance.

Also, another invention of the present invention is a manufacturing method for a module formed by dividing a sub-substrate from main substrate having a plurality of sub-substrates connected to each other. It comprises the steps of laminating a substrate on which a land disposed on one main surface thereof is connected and fixed to the electrode of electronic component by using a connecting and fixing material, and a first sheet laminated on one main surface of the substrate and provided with a filling portion by fluid resin at the outer periphery of electronic component. The laminating step is followed by the step of thermo-compression bonding in which the first sheet and the substrate are compressed under heat and integrated into a laminated circuit board. Further, the step of thermo-compression bonding is followed by the component mounting step in which components are mounted on the other surface of the laminated circuit board. Further, the component mounting step is followed by the step of setting a cover in which a cover is set on each sub-substrate so as to cover the components mounted. Further, the cover setting step is followed by the step of affixing a sheet in which the upper side of the cover is affixed to an adhesive sheet to make a sheet part. Further, after the sheet affixing step, it comprises a dividing step in which the laminated substrates are electrically isolated from each other and divided into sub-substrates mechanically connected to each other by the adhesive sheet. Also, after the dividing step, it comprises an inspecting step in which the sub-substrates are inspected, which is followed by a peeling step for peeling sub-substrates from the sheet. The first sheet is provided with opening having clearance between it and the outer periphery of electronic component at a portion corresponding to the electronic component, and the first sheet is formed of plate-like woven or non-woven cloth impregnated with heat-fluid resin in the module manufacturing method. Since main substrate maintains the shape of the sheet by woven or non-woven cloth, and the woven or non-woven cloth is impregnated with resin having heat fluidity, sufficient resin is fully filled into the resin fluid filling portion, allowing no air or the like to remain. Accordingly, the electrical and mechanical connections are not affected by stresses generated when the air or bubbles are thermally expanded, thereby improving the reliability of the laminated circuit board and electronic components.

Also, in the module manufacturing method, the dividing step is inserted before the inspecting step and therefore troubles caused by the dividing step can be inspected in the inspecting step, making it possible to realize a high-quality module.

Further, since the dividing step is provided before the inspecting step, and the sheet affixing step is provided before the dividing step, individual sub-substrates at the inspecting step are affixed to the sheet, keeping a state of being connected to each other, and neighboring sub-substrates are electrically isolated from each other. Accordingly, the inspection can be collectively performed on a laminated circuit board in the inspecting step, and it is possible to realize a module manufacturing method that assures excellent productivity.

Also, the present invention is a manufacturing method for a module formed by dividing sub-substrates from main substrate having a plurality of sub-substrates connected to each other. It comprises a substrate on which a land disposed on one main surface of a laminated circuit board is connected and fixed to the electrode of electronic component by using a connecting and fixing material. It comprises the steps of a first sheet laminated on one main surface of the substrate and provided with a filling portion by fluid resin at the outer periphery of electronic component, and after the laminating step, the step of thermo-compression bonding in which the first sheet and the substrate are compressed under heat and integrated into a laminated circuit board. Further, the step of thermo-compression bonding is followed by a component mounting step in which components are mounted on one main surface of the laminated circuit board, and the component mounting step is followed by a cover setting step in which a cover is set on each sub-substrate so as to cover the components mounted. After the cover setting step, it comprises the step of affixing a sheet in which one main surface of the cover is affixed to an adhesive sheet to make a sheet part, and after the sheet affixing step, it comprises a dividing step in which the laminated substrates are electrically isolated from each other and divided into sub-substrates mechanically connected to each other by the adhesive sheet. After the dividing step, it comprises a laser trimming step for adjusting coil inductor by executing laser trimming from the surface opposite to the components mounted surface of the laminated circuit board, followed by a sub-substrate inspecting step, and after the inspecting step, it comprises a peeling step for peeling sub-substrates from the sheet. The first sheet is provided with opening having clearance between it and the outer periphery of electronic component at a portion corresponding to the electronic component, and the first sheet is formed of plate-like woven or non-woven cloth impregnated with heat-fluid resin in the module manufacturing method.

According to the module manufacturing method of the present invention, since laser trimming is executed from the surface opposite to the component mounted surface in order to adjust the value of coil inductance, it is possible to make the adjustment after setting the cover. Accordingly, it is unnecessary to carry out accurate adjustment again.

Further another invention of the present invention is a module manufacturing apparatus for manufacturing a module formed of main substrate having a plurality of sub-substrates connected to each other. It comprises a laminated circuit board manufacturing device for manufacturing a laminated circuit board as main substrate, a component mounting device for mounting components on one main surface of the laminated circuit board, and a cover setting device for setting a cover on each sub-substrate so as to cover the components mounted by the component mounting device. Further, it comprises a sheet affixing device for affixing an adhesive sheet to the cover side, a dividing device for dividing the sub-substrates, an inspecting device, and a peeling device for peeling the adhesive sheet. The laminated circuit board manufacturing device comprises a substrate on which a land disposed on one main surface thereof is connected and fixed to the electrode of electronic component, and a first sheet laminated on one main surface of the substrate and provided with a filling portion by fluid resin at the outer periphery of the electronic component. The first sheet is provided with opening having clearance between it and the outer periphery of electronic component at a portion corresponding to the electronic component and is formed of plate-like woven or non-woven cloth impregnated with heat-fluid resin, and the first sheet and the substrate are compressed under heat and integrated into a module.

Main substrate of this module maintains the shape of the sheet by woven or non-woven cloth, and the woven or non-woven cloth is impregnated with resin having heat fluidity, and therefore, sufficient resin is fully filled into the resin fluid filling portion, allowing no air or the like to remain. Accordingly, the electrical and mechanical connections are not affected by stresses generated when the air or bubbles are thermally expanded, thereby improving the reliability of the laminated circuit board and electronic components. That is, the reliability of the module is improved.

Also, since a dividing device is prepared before the inspecting device, trouble generated due to the dividing device can be inspected by the inspecting device and it is possible to realize a high-quality module.

In such a module manufacturing apparatus of the present invention, the shape of the sheet is maintained by woven or non-woven cloth provided with opening having clearance between it and the outer periphery of electronic component, and the woven or non-woven cloth is impregnated with resin having heat fluidity. Thus, sufficient resin is fully filled into the resin fluid filling portion, and no air or the like will remain therein. Accordingly, the electrical and mechanical connections are not affected by stresses generated when the air or bubbles are thermally expanded, thereby improving the reliability of the module.

Also, since electronic components are mounted in a substrate, they can be inspected in a state of being mounted in the substrate, and the non-defective percent after completion of the laminated circuit board is improved. Further, resin is sufficiently filled into even narrow clearances because the resin softens during thermo-compression bonding.

DETAILED DESCRIPTION OF THE PREFERRED EMBODIMENTS

The preferred embodiments of the present invention will be described in the following with reference to the drawings.

Preferred Embodiment 1

Figure 1:
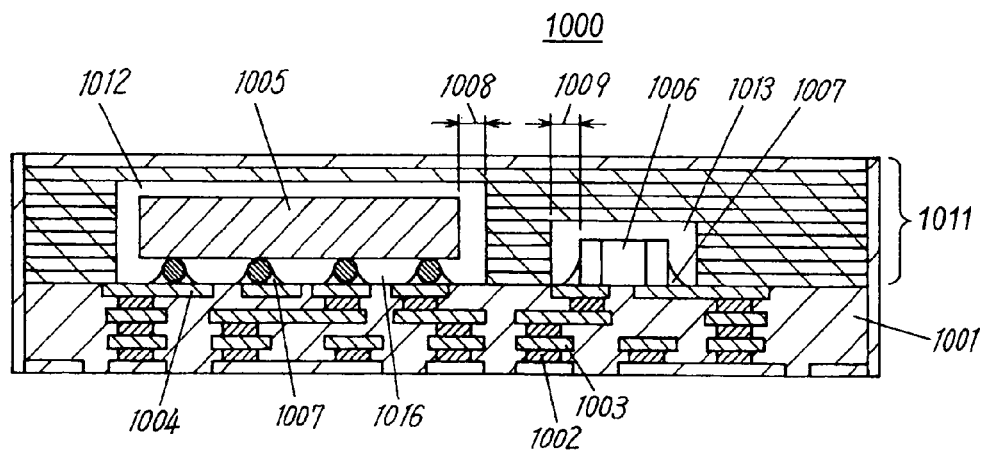
FIG. 1 is a sectional view of a laminated circuit board in the preferred embodiment 1 of the present invention.

FIG. 1 is a sectional view of laminated circuit board 1000 in the preferred embodiment 1 of the present invention. In FIG. 1, thermosetting resin substrate 1001 is formed in multiple layers. And, the interior of thermosetting resin substrate 1001 is inner-via 1002, and one main surface of each layer is electrically connected to the opposite side or the other main surface. Each layer is provided with copper foil pattern 1003, thereby forming various electronic circuits. And, on one main surface of resin substrate 1001 is formed land pattern 1004. Further, electronic components such as integrated circuit 1005 and resistor 1006 for example are connected to this one main surface by solder 1007.

Lead-free solder using tin, silver or copper is used as solder 1007, which contains no substance harmful to human body and gives no bad influences to the environment. Also, a conductive bonding agent of thermosetting type can be used instead of solder 1007. When a conductive bonding agent is used, since the conductive bonding agent is higher in melting temperature than solder, for example, even if the temperature is increased due to soldering in the vicinity of electronic components, it will not cause integrated circuit 1005 or resistor 1006 to be disconnected from resin substrate 1001.

Also, as a connecting method by solder 1007, soldering is executed by using a reflow process. This enables the execution of high-quality soldering. Also, by this reflow soldering, the electronic component connected by reflow soldering can be fixed in only the predetermined position. Accordingly, the electronic component is reliably fixed and, as a result, the length of pattern line that follows the electronic component is constant and the inductance component of the pattern line can be kept within a certain range. Thus, it is possible to keep the lowering of electric performance within the allowable range. This is especially important for a high-frequency circuit.

Thermosetting sheet 1011 of laminated structure is provided with hole 1012 for integrated circuit 1005 and hole 1013 for resistor 1006 separately at predetermined positions. Also, hole 1012 has clearance 1008 as a filling portion by fluid resin between it and integrated circuit 1005. Accordingly, sheet 1011 can be easily laminated on resin substrate 1001 with integrated circuit 1005 mounted therein. Also, since clearance 1009 as a filling portion by fluid resin is provided between hole 1013 and the outer periphery of resistor 1006, sheet 1011 can be easily laminated on resin substrate 1001 with resistor 1006 mounted therein.

Figure 2:
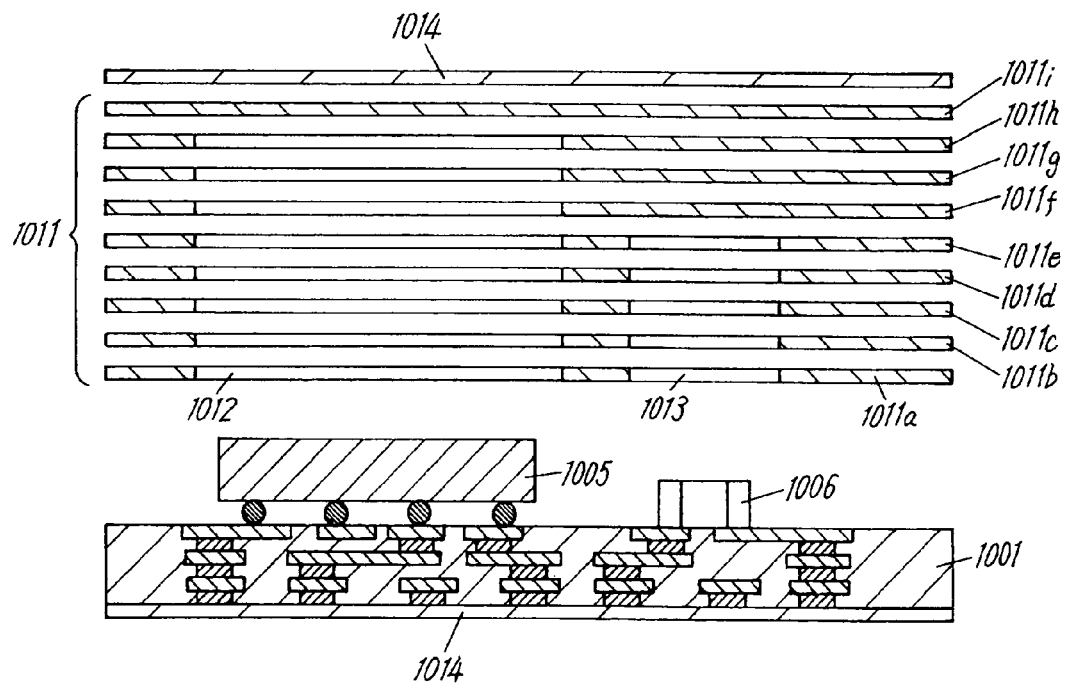
FIG. 2 is an assembling sectional view of the laminated circuit board.

FIG. 2 shows a laminated state of sheet 1011. Sheets 1011 formed of nine sheets of sheets 1011a to 1011i are laminated in this order on one main surface of resin substrate 1001. Out of the sheets, five sheets of 1011a to 1011e are laminated in this order on one main surface of resin substrate 1001. At the predetermined positions of these sheets, hole 1012 for integrated circuit 1005 and hole 1013 for resistor 1006 are separately formed.

Also, hole 1012 for integrated circuit 1005 is provided in sheets 1011f to 1011h laminated on one main surface of sheet 1011e. However, these sheets are not provided with hole 1013 for resistor 1006. That is, holes according to the height of electronic component are at the predetermined portions of sheets 1011a to 1011i.

Sheet 1011i without any one of holes 1012 and 1013 is placed on one main surface of sheet 1011h. Also, copper foil 1014 is disposed on the whole or part of one main surface of sheet 1011i.

And, resin substrate 1001, sheet 1011 and copper foil 1014 are integrated by thermo-compression bonding at such temperatures as not to melt solder 1007. The conditions for thermo-compression bonding in the preferred embodiment 1 are, for example, such that the heating temperature ranges from 180° C. to 200° C., the pressing pressure is about 30 kg per square centimeter (30 kg/cm$^2$), and the pressing time is about one hour. The press-fitting is executed in a vacuum chamber. This is important for sufficiently filling resin, fully removing the air or bubbles out of holes 1012 and 1013.

Figure 3:
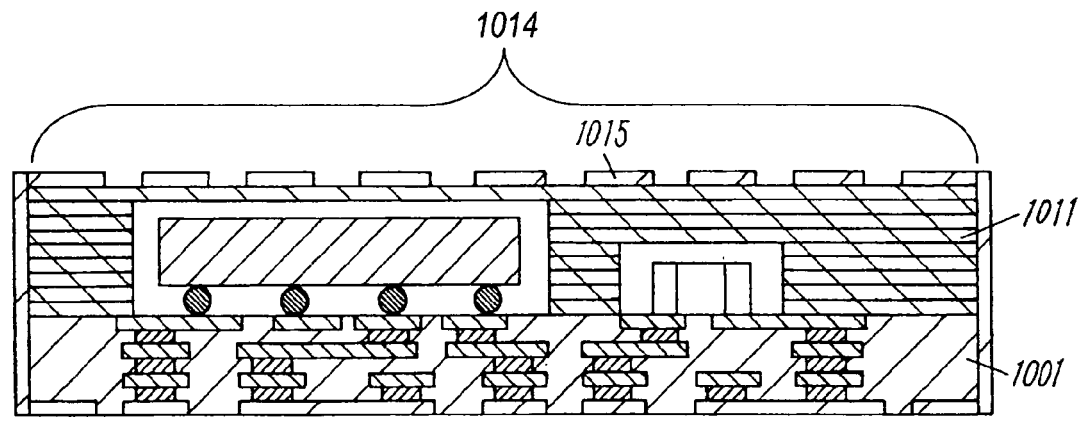
FIG. 3 is a completion diagram of the laminated circuit board.

FIG. 3 shows a laminated circuit board formed by thermo-compression bonding of resin substrate 1001 and sheet 1011. In FIG. 3, copper foil 1014 disposed at the uppermost layer of sheet 1011 is etched to form predetermined wiring pattern 1015. An electric circuit, its wiring and terminal can be formed by using pattern 1015. Also, without etching the whole or part of copper foil 1014, remaining a relatively large area of the copper foil as it is, the remaining copper foil, by grounding it for example, can be used as a ground plane or shield.

Figure 4:
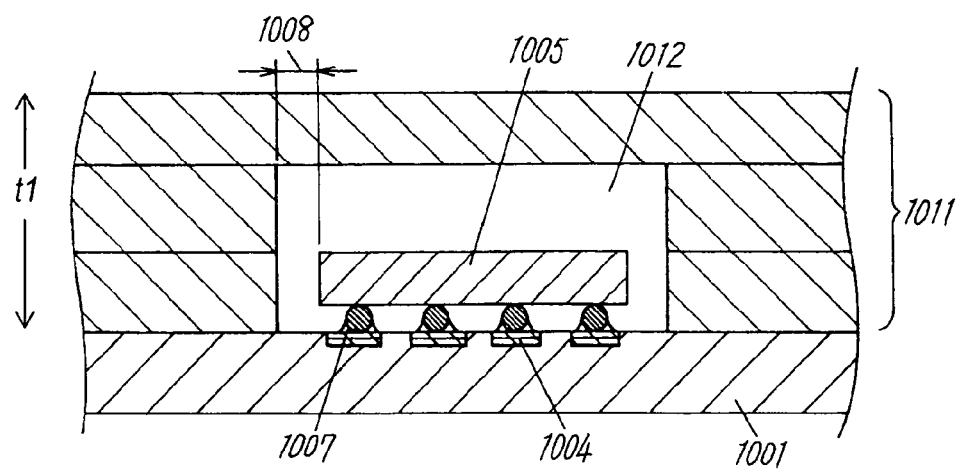
FIG. 4 is a sectional view of an essential portion before press-fitting a laminated circuit board in the preferred embodiment 1 of the present invention.
Figure 5:
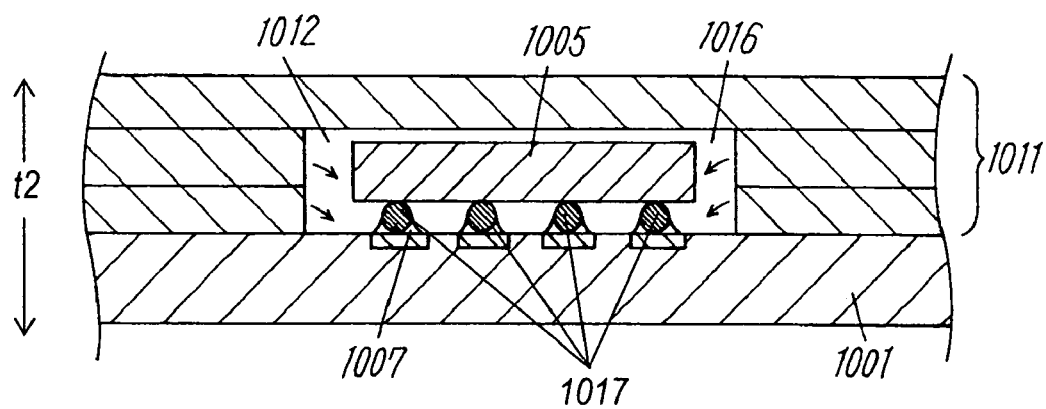
FIG. 5 is a sectional view of an essential portion after press-fitting the laminated circuit board.

FIG. 4 is a sectional view of an essential portion showing a state before thermo-compression bonding of sheet 1011. FIG. 5 is a sectional view of an essential portion after thermo-compression bonding. The thermo-compression bonding of a laminated circuit board is described by using FIG. 1, FIG. 4 and FIG. 5.

First, integrated circuit 1005 is connected by solder 1007 to land pattern 1004 on one main surface of resin substrate 1001 or the surface on which elements are mounted. Also, sheet 1011 formed from porous glass fiber impregnated with resin and having thermosetting property is laminated on one main surface of resin substrate 1001.

Sheet 1011 is plate-like woven or non-woven cloth impregnated with resin having heat fluidity. Sheet 1011 is provided with openings having clearances 1008, 1009 as resin fluid filling portions, that is, holes 1012, 1013, at portions corresponding to the outer peripheries of integrated circuit 1005 and resistor 1006.

And, integrated circuit 1005 is inserted in hole 1012 formed in sheet 1011, having clearance 1008. The thickness before thermo-compression bonding of sheet 1011 is shown by t1.

FIG. 5 shows a state of a laminated circuit board after thermo-compression bonding. After thermo-compression bonding, thickness t2 of sheet 1011 becomes about one third (⅓) of thickness t1 before thermo-compression bonding. Then, resin 1016 contained in the porous glass fiber of sheet 1011 flows out and is uniformly filled into the whole clearance between hole 1012 and integrated circuit 1005. Accordingly, air or the like will not remain in the laminated circuit board. Also, the electrical and mechanical connections of the electrode of electronic component and land pattern are not affected due to stresses generated when the air or the like is expanded, thereby improving the reliability of the laminated circuit board and electronic components.

Since sheet 1011 is thermosetting resin, it will not return to a state of being plastic even when reheated after heat curing. Accordingly, integrated circuit 1005 sealed by resin 1016 is reliably held on the laminated circuit board.

Figure 6:
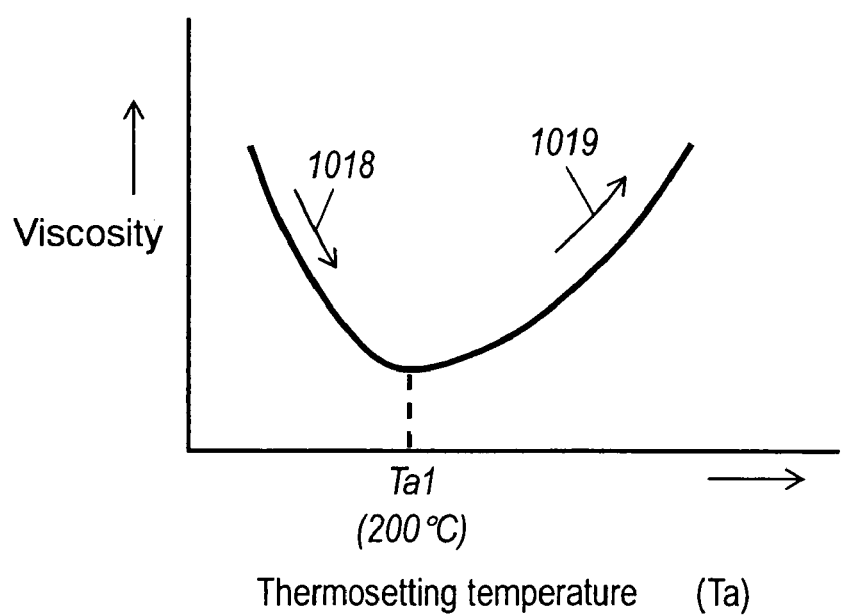
FIG. 6 is a viscosity characteristic diagram of resin used on a laminated circuit board in the preferred embodiment 1 of the present invention.

FIG. 6 shows the viscosity characteristic to the temperature of resin 1016 shown in FIG. 5. That is, as shown by reference numeral 1018, with increase in temperature of resin 1016, the viscosity of resin 1016 gradually becomes lower. In such a range of thermosetting temperatures, resin 1016 increases in fluidity and is sufficiently filled into hole 1012 having narrow clearance. However, when the temperature of resin 1016 is about 200° C. or higher than Ta1, the viscosity becomes higher with increase in temperature of resin 1016 as shown by reference numeral 1019. That is, resin 1016 gradually hardens.

When executing thermo-compression bonding, it is important to make the ambient temperature of solder 1007 lower than the melting temperature of solder 1007. In other words, when the ambient temperature of solder 1007 increases and the internal temperature of solder 1007 becomes higher than the melting point (about 200° C.), there arises a problem that solder 1007 is melted and mixed in with resin 1016. In the worst case, terminals 1017 of integrated circuit 1005 might be short-circuited with each other. In order to avoid such trouble, the melting point of solder 1007 is preferable to be higher than the ambient temperature. For example, it is preferable to use tin or silver-based solder with high melting point as solder 1007.

As is obvious in the above description, one of the features of the preferred embodiment 1 is that integrated circuit 1005 and resistor 1006 are mounted by using solder 1007 on resin substrate 1001 before integrating resin substrate 1001 and sheet 1011. Accordingly, when integrating resin substrate 1001 and sheet 1011, it is not necessary to carry out the positioning of integrated circuit 1005 and resistor 1006 to resin substrate 1001 as in a conventional method, and thereby, it becomes very easy to assemble. Also, since sheet 1011 is provided with holes 1012, 1013 respectively having clearances 1008, 1009 between integrated circuit 1005 and resistor 1006, they can be easily inserted and assembled even in case electronic components protruding from resin substrate 1001 are mounted.

Also, the ambient temperature for integrating resin substrate 1001 and sheet 1011 is as low as not melting the solder for connecting integrated circuit 1005 and resistor 1006, for example, they are integrated in an atmosphere of 180° C. to 200° C. Accordingly, the fixed connections will not be broken down, and integrated circuit 1005 and resistor 1006 are able to maintain a reliable state of connection electrically and mechanically.

Further, in the softening process during thermo-compression bonding, resin 1016 is sufficiently filled into narrow clearances 1008, 1009 as well. Also, sheet 1011 used has thermosetting property, it will not return to a state of being plastic even when heated after heat curing, and the fixed state of integrated circuit 1005 and resistor 1006 sealed can be reliably maintained.

Furthermore, since integrated circuit 1005 and resistor 1006 are mounted in resin substrate 1001, they can be subjected to electrical and mechanical tests in a state of being mounted in resin substrate 1001, thereby improving the non-defective percent after completion of the laminated circuit board.

Preferred Embodiment 2

Figure 7A:
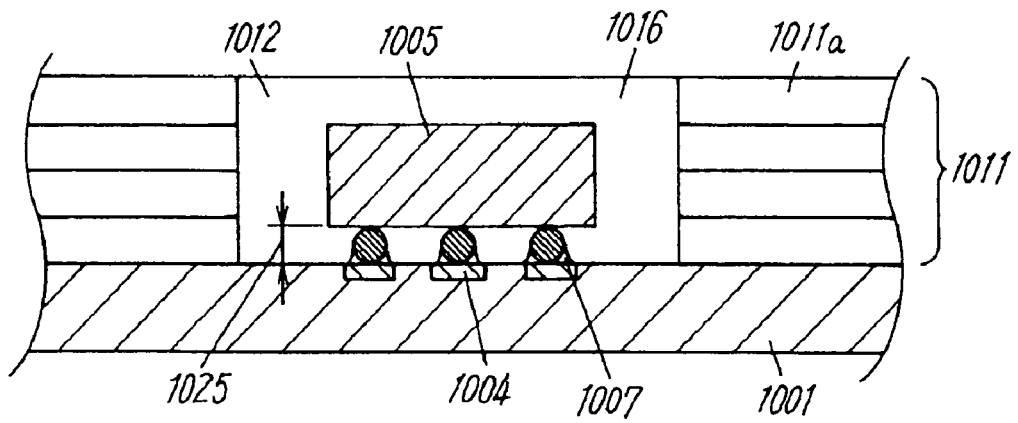
FIG. 7A is a sectional view showing the vicinity of an integrated circuit mounted in a laminated circuit board in the preferred embodiment 2 of the present invention.

FIG. 7A is an enlarged sectional view of an essential portion in the vicinity of integrated circuit 1005 of a laminated circuit board in the preferred embodiment 2 of the present invention. In the preferred embodiment 2, holes (openings) formed in sheet 1011 will be described in detail.

Hole 1012 is disposed in sheet 1011. Also, hole 1012 is set to a size having a pace and some clearance capable of storing integrated circuit 1005 soldered to resin substrate 1001. In this condition, when thermo-compression bonding is executed under the predetermined bonding conditions, resin 1016 having heat fluidity flows out of main body 1011a of sheet 1011, then the density of porous fiber (glass fiber) forming woven or non-woven cloth increases at main body 1011a side. Also, hole 1012 is filled with resin 1016. Incidentally, the predetermined bonding conditions can be set, as described in the preferred embodiment 1, for example such that the thermo-compression bonding temperature is 180° C. to 200° C., the pressure is 30 kg/cm², and the thermo-compression bonding time is about one hour.

Resin 1016 is considerably lowered in viscosity and increased in fluidity under the thermo-compression bonding condition as shown in FIG. 6. Resin 1016 thus lowered in viscosity is fully filled into narrow clearances. For example, resin 1016 is filled even into clearance 1025 under integrated circuit 1005 which is a clearance of about 0.03 mm (one third of 0.1 mm) without being subjected to great stresses. Accordingly, even in case fine electronic components are built in, no stress is given to the electronic components, and also, no damage is given to the electronic components. Also, after heat setting, integrated circuit 1005 is firmly fixed and sealed by resin 1016, thereby stabilizing integrated circuit 1005.

Figure 7B:
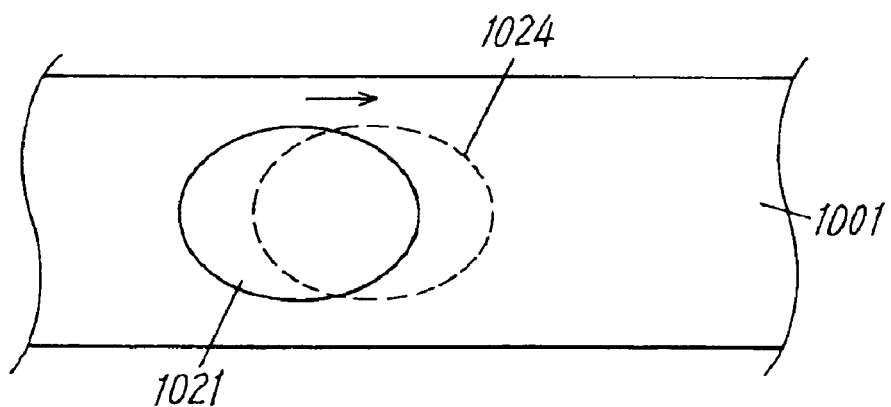
FIG. 7B is a plan view of an essential portion of pattern disposed on the laminated circuit board.
Figure 7C:
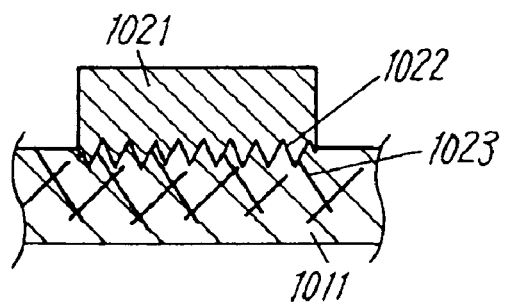
FIG. 7C is a sectional view of an essential portion thereof.

In FIG. 7B, pattern 1021 is disposed on one main surface of sheet 1011. Pattern 1021 is, as shown in FIG. 17C, such that fiber 1023 gets involved in fine irregularity 1022 disposed on one main surface of sheet 1011 of pattern 1021. Thus, as shown by dotted line 1024 in FIG. 7B, pattern 1021 will not move during thermo-compression bonding.

Accordingly, even when undesired stress is applied to pattern 1021, the pattern 1021 will not be shifted and short-circuited with adjacent pattern, nor changed in inductance value, nor changed in electrostatic capacity.

Preferred Embodiment 3

Figure 8:
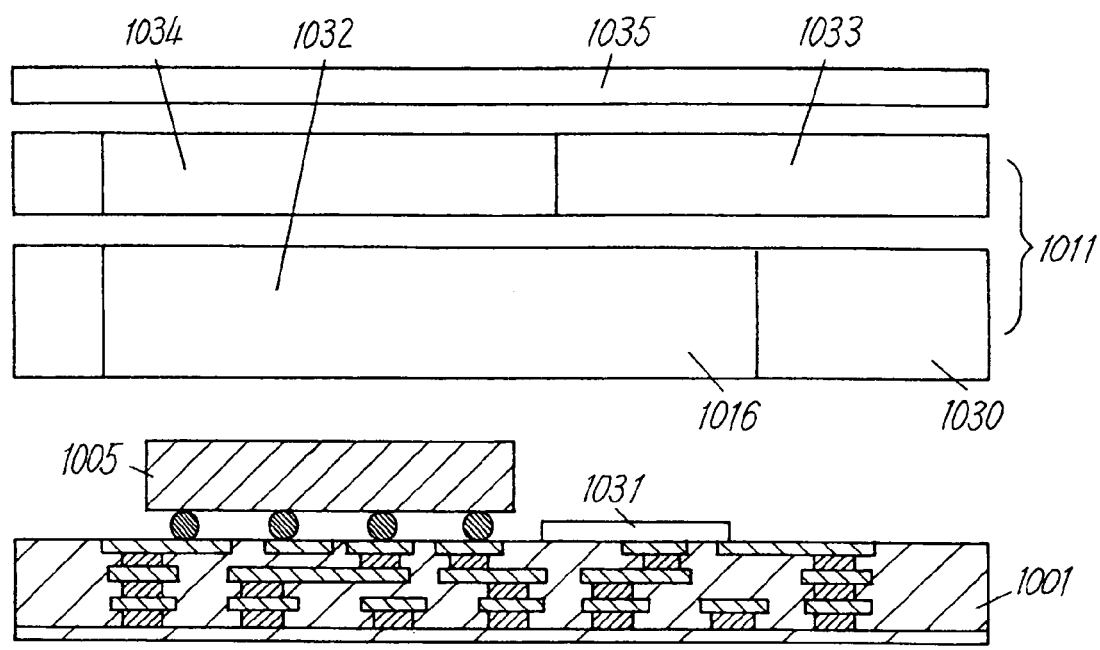
FIG. 8 is a sectional view showing a state before thermo-compression bonding of a laminated circuit board in the first example of the preferred embodiment 3 of the present invention.
Figure 9:
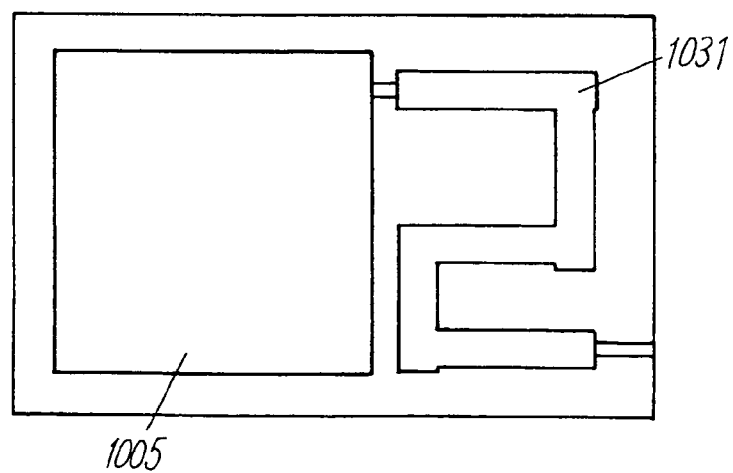
FIG. 9 is a plan view of an essential portion thereof.

FIG. 8 is a sectional view of a laminated circuit board in the preferred embodiment 3. Integrated circuit 1005 is connected by soldering onto one main surface of resin substrate 1001. Also, next to integrated circuit 1005 is placed inductor 1031 as an example of circuit pattern as shown in FIG. 9.

Hole 1032 is an opening disposed in sheet 1030 of sheet 1011. Hole 1032 is provided so as to cover integrated circuit 1005 and inductor 1031. That is, integrated circuit 1005 is mounted in a position eccentric to hole 1032. Since hole 1032 is formed in this way, resin 1016 is sufficiently filled even around inductor 1031.

The dielectric constant of resin 1016 is selected to be in a range of about 6.5 to 9.5. Therefore, it is larger by about 2.3 as compared with the dielectric constant of conventional porous fiber, and it is possible to reduce the size of inductor 1031.

The impedance of inductor 1031 is in reverse proportion to the square root of specific inductive capacity and in proportion to the length of inductor 1031. Accordingly, it is possible to enhance the development efficiency by previously calculating the impedance of inductor 1031. Also, since inductor 1031 is disposed adjacent to integrated circuit 1005, hole 1032 can be made smaller than those individually disposed for inductor 1031 and integrated circuit 1005.

Substrate 1033 is laminated on one main surface of sheet 1030, forming a part of sheet 1011. Substrate 1033 is provided with hole 1034 formed so that integrated circuit 1005 can be inserted therein at predetermined intervals, communicating with hole 1032. Also, sheet 1035 which closes holes 1032, 1034 is laminated on one main surface of substrate 1033. Also, a circuit pattern can be formed on most part or a part of at least one main surface of sheet 1035.

Figure 10:
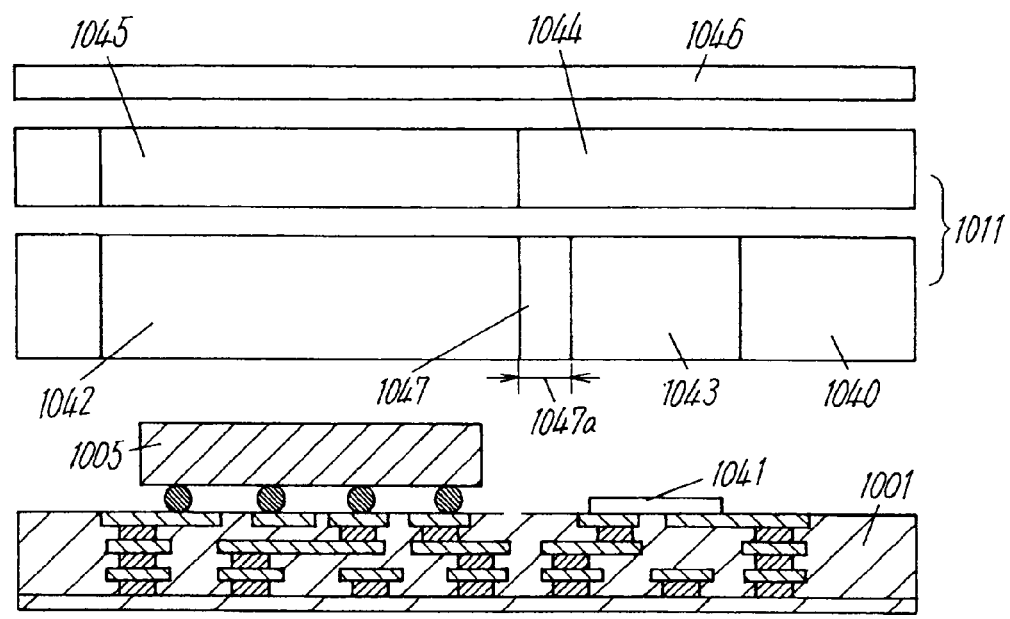
FIG. 10 is a sectional view before thermo-compression bonding of a laminated circuit board in the second example of the preferred embodiment 3 of the present invention.
Figure 11:
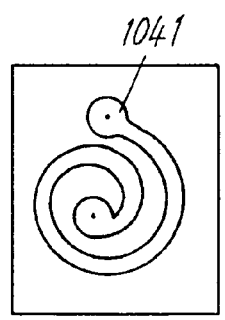
FIG. 11 is a plan view of an essential portion thereof.

FIG. 10 is a sectional view of a laminated circuit board in the second example of preferred embodiment 3. Integrated circuit 1005 is connected by soldering onto one main surface of resin substrate 1001. Also, inductor 1041 as shown in FIG. 11 is disposed as an example of circuit pattern at a position away from integrated circuit 1005.

Hole 1042 is a so-called opening disposed in sheet 1040 of sheet 1011. Integrated circuit 1005 is inserted in hole 1042 at predetermined intervals. Also, hole 1043 is an opening disposed in a position corresponding to inductor 1041.

Thus, since hole 1043 is formed, resin 1016 is sufficiently filled around inductor 1041 as well. The dielectric constant of resin 1016 is selected to be in a range of about 6.5 to 9.5. Since it is larger by about 2.3 as compared with the dielectric constant of conventional porous fiber, and it is possible to reduce the size of inductor 1041. Incidentally, width 1047a of crosspiece 1047 formed between hole 1042 and hole 1043 is desirable to be larger than the height of one sheet. Here, sheet 1040 is formed of a plurality of laminated sheets same in thickness, and the thickness of each sheet is about 0.75 μm.

Also, the impedance of inductor 1041 is in reverse proportion to the square root of specific inductive capacity and in proportion to the length of inductor 1041. Accordingly, it is possible to enhance the development efficiency by previously calculating the impedance of inductor 1041.

Sheet 1044 is formed of a plurality of laminated sheets disposed on one main surface of sheet 1040, forming a part of sheet 1011. Sheet 1044 is provided with hole 1045 same in shape as hole 1042 in communication with each other, in which integrated circuit 1005 is inserted at intervals. Also, sheet 1046 which closes holes 1042, 1045 is laminated on one main surface of sheet 1011. A circuit pattern can be formed on the whole or a part of at least one main surface of sheet 1046.

Preferred Embodiment 4

Figure 12:
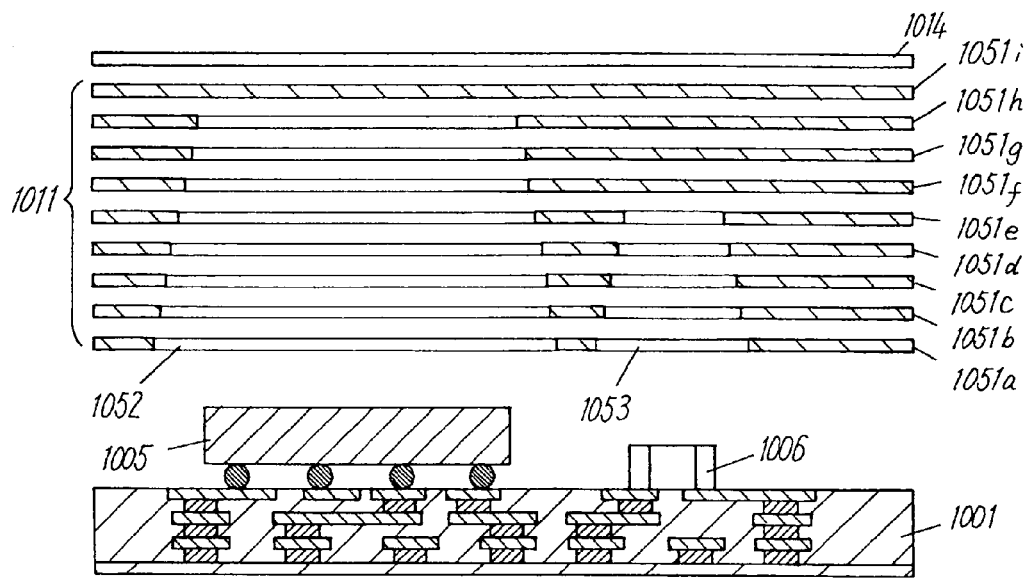
FIG. 12 is a sectional view showing a state before thermo-compression bonding of a laminated circuit board in the first example of the preferred embodiment 4 of the present invention.

In the preferred embodiment 4, the shape of sheet 1011 will be mainly described. In FIG. 12, sheets 1051a to 1051i are laminated in this order from resin substrate 1001 side to form sheet 1011. These nine sheets 1051a to 1051i are nearly same in thickness. Accordingly, it is possible to standardize the sheet.

Also, eight sheets 1051a to 1051h are provided with hole (opening) 1052 for inserting integrated circuit 1005 therein with clearance (resin fluid filling portion). Also, five sheets 1051a to 1051e are provided with hole 1053, opening for inserting resistor 1006 therein with clearance in addition to hole 1052.

Sheet 1051i not provided with holes 1052, 1053 is laminated on one main surface of sheet 1051h, and copper foil 1014 is disposed on the whole or a part of the one main surface.

Sheet 1011 configured in this way is laminated on resin substrate 1001. Integrated circuit 1005 and resistor 1006 are mounted on resin substrate 1001. And, to make easier the insertion of integrated circuit 1005 and resistor 1006, hole 1052 and hole 1053 are tapered in that the holes are gradually increased in size as they are closer to resin substrate 1001 and widen out toward integrated circuit 1005 and resistor 1006 as a whole.

Figure 13:
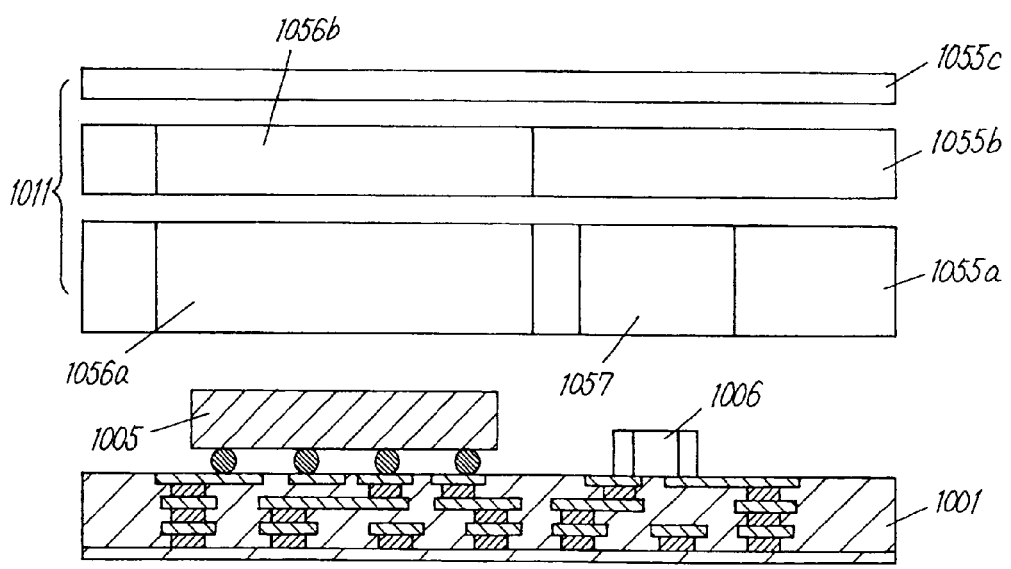
FIG. 13 is a sectional view showing a state before thermo-compression bonding in the second example of the preferred embodiment 4.

FIG. 13 is an example in which sheets 1055a to 1055c of sheet 1011 are changed in thickness according to the height of electronic component such as integrated circuit 1005 and resistor 1006. In this way, changing the sheet thickness according to the height of electronic component, it is possible to reduce the man-hour for lamination.

That is, hole 1056a for inserting integrated circuit 1005 therein with specified clearance and hole 1057 for inserting resistor 1006 therein with specified clearance are disposed in sheet 1055a laminated at resin substrate 1001 side. Also, hole 1056b communicated to hole 1056a and for inserting integrated circuit 1005 therein with specified clearance is disposed in sheet 1055b laminated on one main surface of sheet 1055a. Sheet 1055c is laminated on one main surface of sheet 1055b and closes hole 1056b.

Figure 14:
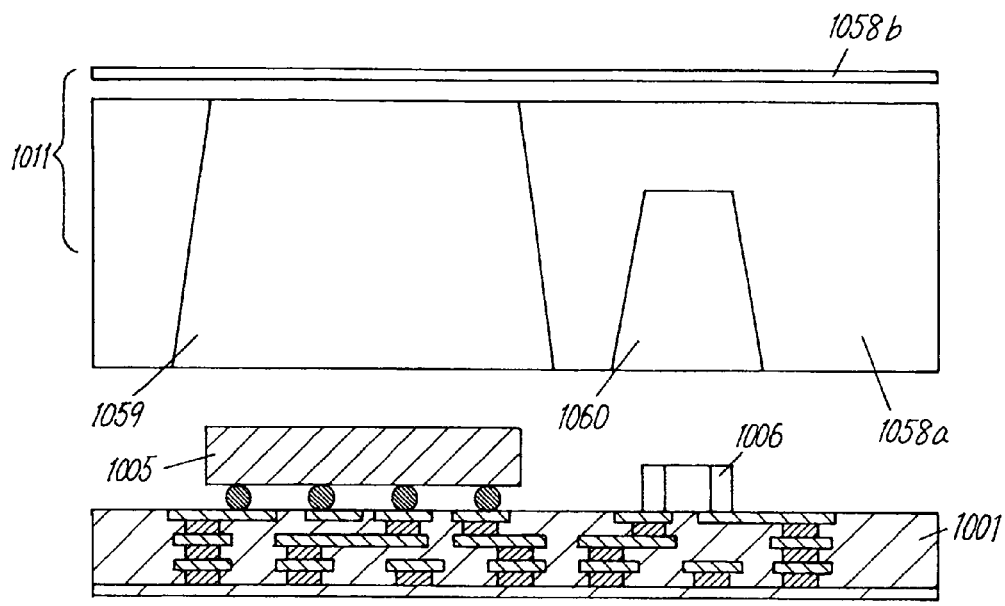
FIG. 14 is a sectional view showing a state before thermo-compression bonding in the third example of the preferred embodiment 4.

FIG. 14 is an example in which sheet 1011 is provided with tapered hole (opening), which is formed of sheet 1058a and sheet 1058b. That is, sheet 1058a is provided with hole 1059 in which integrated circuit 1005 is inserted with specified clearance and hole 1060 in which resistor 1006 is inserted with specified clearance. Both of hole 1059 and hole 1060 are tapered widening out the toward resin substrate 1001 side.

Figure 15:
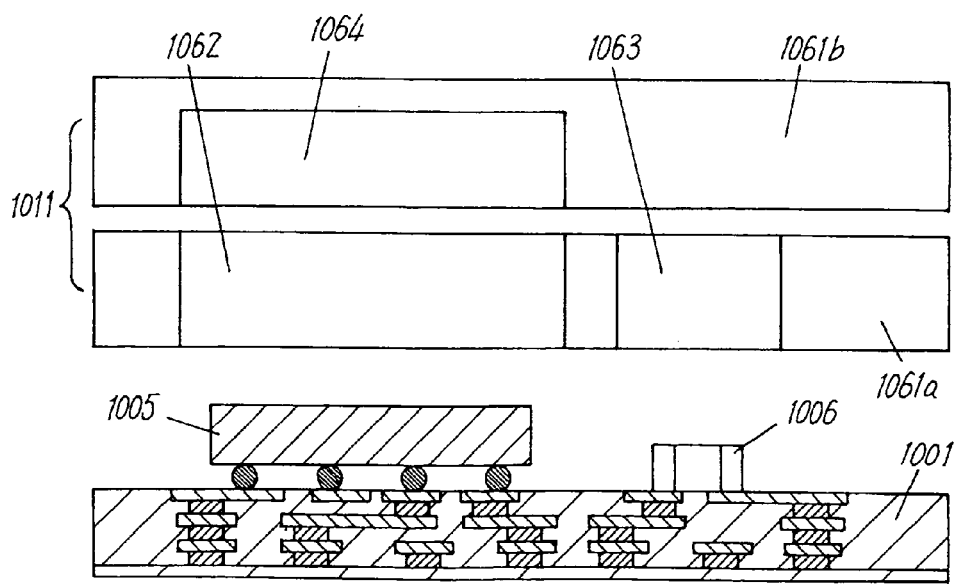
FIG. 15 is a sectional view showing a state before thermo-compression bonding in the fourth example of the preferred embodiment 4.

In FIG. 15, sheet 1061a and sheet 1061b are laminated to form sheet 1011. Sheet 1061a is provided with hole 1062 for inserting integrated circuit 1005 therein with clearance and hole (opening) 1063 for inserting resistor 1006 with clearance.

Also, sheet 1061b laminated on one main surface of sheet 1061a is provided with depression 1064 forming an opening with hole 1062 and communicated to hole 1062, in which integrated circuit 1005 is inserted with clearance.

Thus, since depression 1064 is formed in sheet 1061b, it is possible to close hole 1062 with sheet 1061b and to form electric circuits with patterns disposed on one main surface or the other main surface at the opposite side. Also, it is possible to form copper foil on the whole or a part of sheet 1061b.

Preferred Embodiment 5

Figure 16:
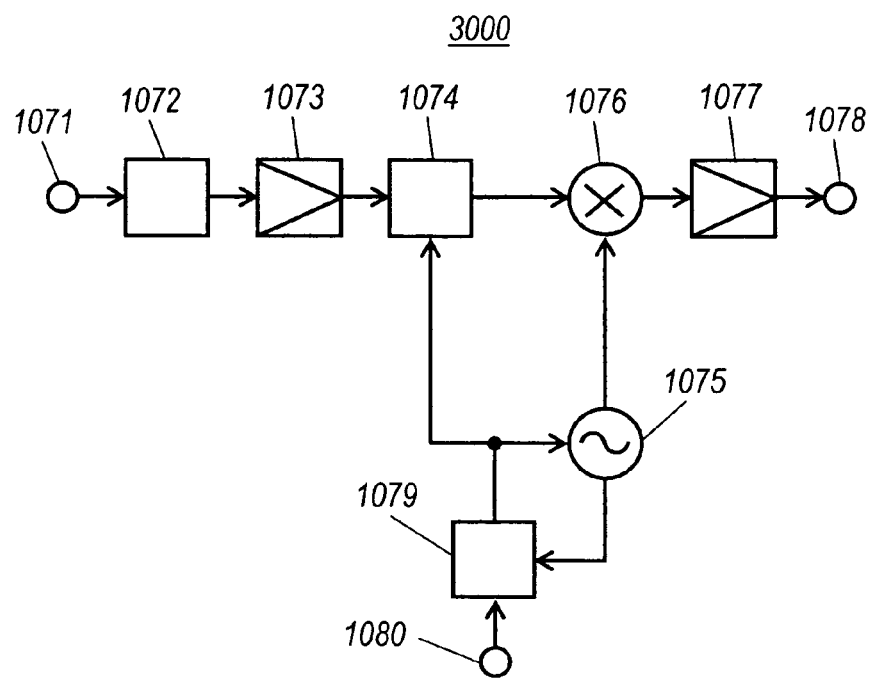
FIG. 16 is a block diagram of an electronic tuner formed at a laminated circuit board in the preferred embodiment 5 of the present invention.

In the preferred embodiment 5, the circuit formed on sheet 1011 will be described. FIG. 16 is a block diagram of an electronic tuner as a high-frequency circuit formed on sheet 1011.

In FIG. 16, electronic tuner 3000 comprises input terminal 1071 to which high-frequency signal is inputted. Further, it comprises antenna input circuit 1072 connected to input terminal 1071 and high-frequency amplifier 1073 connected to the output of antenna input circuit 1072. Further, it comprises double-tuning circuit 1074 connected to the output of high-frequency amplifier 1073, and mixer 1076 with one input connected to the output of double-tuning circuit 1074 and the other input connected to the output of local oscillator 1075. Further, it comprises output terminal 1078 connected to the output of medium frequency amplifier 1077, and PLL circuit 1079 to which the output of local oscillator 1075 is inputted and with its output connected to the input of local oscillator 1075 and the control input of double-tuning circuit 1074. Further, it comprises data input terminal 1080 for feeding tuning data to PLL circuit 1079.

The operation of an electronic tuner thus configured will be briefly described in the following. The high-frequency signal broadcast from each broadcasting station is inputted from the antenna to input terminal 1071. And the high-frequency signal is amplified by high-frequency amplifier 1073 via antenna input circuit 1072.

The amplified signal is tuned by double-tuning circuit 1074 so that the operator is able to receive the electric waves of the desired station. The tuned signal is mixed with the output of local oscillator 1075 and converted into medium frequency in mixer 1076. And, the signal converted into medium frequency is amplified by medium frequency amplifier 1077 which allows only medium frequency to pass through and also has an amplifying function, and is outputted from output terminal 1078.

In this tuning, the oscillation frequency of local oscillator 1075 and the tuning frequency of double-tuning circuit 1074 are controlled so that the electric waves of the desired station can be received by PLL circuit 1079 in accordance with the digital signal inputted from data input terminal 1080. In this way, only the electric waves of the desired broadcasting station are selected from the electric waves inputted to input terminal 1071, and the desired signal is outputted from output terminal 1078.

Figure 17:
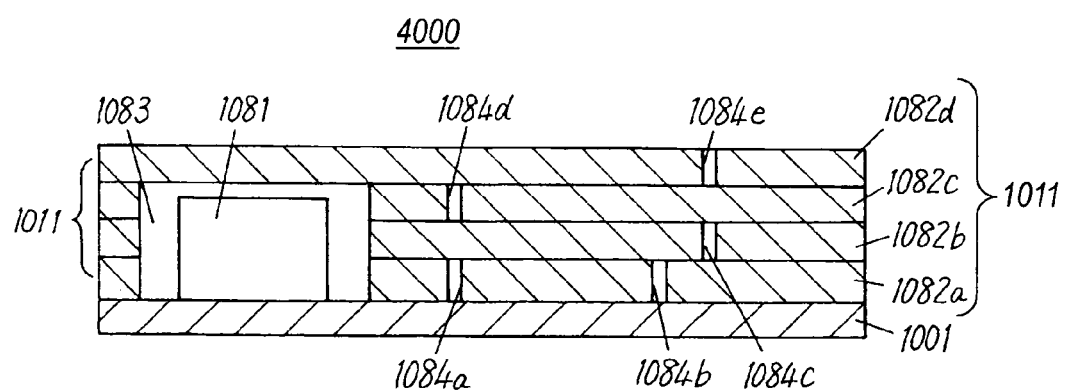
FIG. 17 is a sectional view of the laminated circuit board thereof.

FIG. 17 is a sectional view of laminated circuit board 4000 wherein an electronic tuner as an example of high-frequency circuit shown in FIG. 16 is mounted in the laminated circuit board. In FIG. 17, electronic component 1081 is mounted on one main surface of resin substrate 1001. Also, sheets 1082a to 1082d are disposed in this order on one main surface of resin substrate 1001, forming sheet 1011.

Sheet 1011 is provided with hole (opening) 1083 in which electronic component 1081 is inserted with clearance (resin fluid filling portion). Also, sheets 1082a to 1082d are thermosetting sheets formed from porous fiber impregnated with resin. And these sheets are electrically connected to each other by inner-via 1084a, 1084b, 1084c, 1084d and 1084e.

Antenna input circuit 1072 and high-frequency amplifier 1073 shown in FIG. 16 are mounted on one main surface of sheet 1082c, which are connected by inner-via 1084d to sheet 1082b laminated on the other main surface of sheet 1082e. And, double-tuning circuit 1074 is mounted on one main surface of sheet 1082b. Also, sheet 1082a is laminated on the other main surface of sheet 1082*b*, and connected thereto by inner-via 1084*c*. Also, mixer 1076 and medium frequency amplifier 1077 are mounted on one main surface of sheet 1082*a*. And, local oscillator 1075 and PLL circuit 1079 are mounted on resin substrate 1001, and the signal is connected sheet 1082*a* by inner-via 1084*a* and inner-via 1084*b*.

Since circuits different in operation frequency are mounted in layers on different sheets as described above, it is possible to improve electrical isolation between the circuits. Also, fine resistance is mixed in the filler to be filled into inner-via 1084*a* to 1084*d*, thereby further improving the isolation between the circuits. For example, by connecting double-tuning circuit 1074 to the output portion of high-frequency amplifier 1073 through inner-via 1084*d*, it is possible to lessen the influences of unnecessary high resonance frequency outputted from double-tuning circuit 1074. Accordingly, it becomes possible to stabilize as high-frequency amplifier 1073. Further, the same holds true with respect to the high-frequency amplifier and resonance circuit of local oscillator 1075.

Next, inner-via 1084 is described in the following. Inner-via 1084*a* to 1084*e* are represented by inner-via 1084, and sheets 1082*a* to 1082*d* are represented by sheet 1082 in the description.

Figure 18:
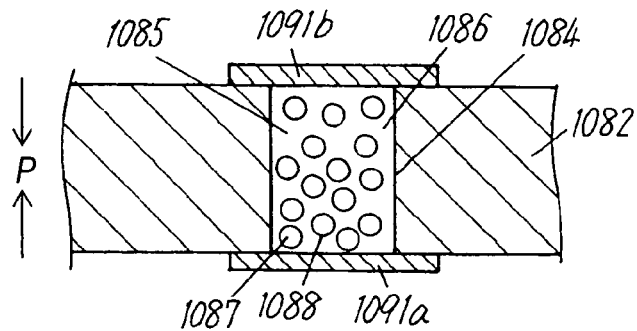
FIG. 18 is a sectional view of an essential portion showing a state before thermo-compression bonding of inner via thereof.

FIG. 18 is a sectional view of an essential portion before forming inner-via 1084. Hole 1085 is formed in sheet 1082 by using a laser beam. And, filler 1088, paste-like mixture of resin 1086 and conductive powder 1087, is filled into hole 1085. Copper, silver or the like can be used for conductive powder 1087. Copper foil patterns 1091*a*, 1091*b* are formed on both of one main surface and the other main surface of sheet 1082.

Figure 19:
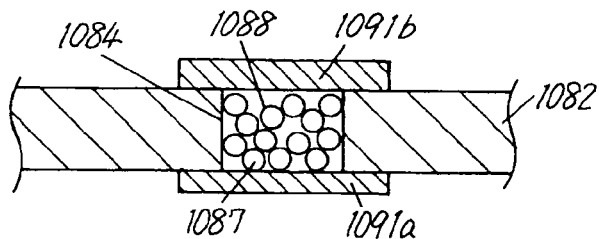
FIG. 19 is a sectional view of an essential portion showing a state after press-fitting thereof.

Sheet 1082 thus filled with fitter 1088 is subjected to thermo-compression bonding in the direction of thickness as shown by sign P, for example, setting the temperature to 180° C. to 200° C., the pressure to 30 kg/cm$^2$, and the time to about one hour, then inner-via 1084 is completed as conducting connection is established between copper foil pattern 1091*a* and copper foil pattern 1091*b* with fine conductive powder 1087 as shown in FIG. 19. Here, by mixing a resistance agent in hole 1085 or reducing the amount of conductive powder 1087 mixed, it is possible to provide inner-via 1084 with a predetermined resistance component.

Figure 20:
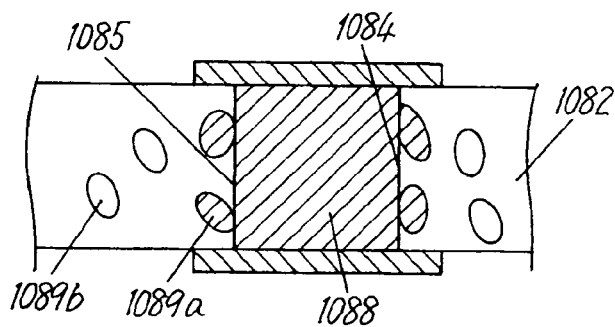
FIG. 20 is a sectional view of the first essential portion showing a connected state of filler and sheet.

Now, the completed inner-via 1084 is, as shown in FIG. 20, filled in hole 1089*a* of porous fiber existing on the wall of hole 1085 formed in porous sheet 1082, thereby firmly bonding filler 1088 to sheet 1082. Reference numeral 1089*b* is a hole located apart from hole 1085, and filler 1088 is not filled in this hole 1089*b*.

Figure 21:
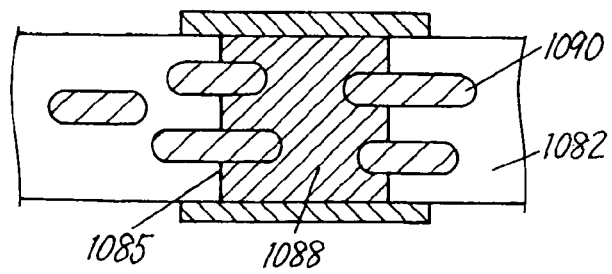
FIG. 21 is a sectional view of the second essential portion showing a connected state of filler and sheet.

Also, during thermo-compression bonding, porous fiber 1090 of sheet 1082 gets into hole 1085 as shown in FIG. 21. Accordingly, it also causes filler 1088 to be firmly bonded to sheet 1082.

Preferred Embodiment 6

In the preferred embodiment 6, an essential section of a laminated circuit board will be described.ABrielectric or magnetic material is filled into the hole formed in sheet 1011 to make a sheet partially different in dielectric constant or magnetic permeability.

Figure 22:
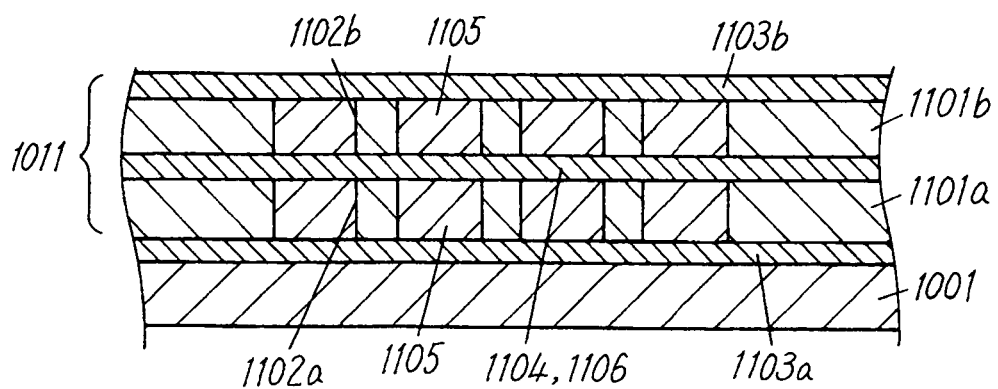
FIG. 22 is a sectional view of an essential portion of a laminated circuit board in the preferred embodiment 6 of the present invention.

In FIG. 22, sheets 1101*a* and 1101*b* of sheet 1011 are laminated on one main surface of resin substrate 1001. And, holes 1102*a*, 1102*b* penetrating these sheets 1101*a*, 1101*b* are formed, for example, by laser beam machining. A plurality of holes 1102*a* and holes 1102*b* are respectively formed in sheet 1101*a* and sheet 1101*b* at equal intervals.

Also, between resin substrate 1001 and sheet 1101*a* is disposed copper foil 1103*a* on the whole or a part thereof. Similarly, copper foil 1103*b* is disposed on the whole or a part of one main surface of sheet 1111*b*. And, these copper foils 1103*a*, 1103*b* are connected to ground (not shown). Also, between sheet 1101*a* and sheet 1101*b* is disposed wiring pattern 1104. And, holes 1102*a*, 1102*b* are filled with dielectric 1105.

In such a configuration, wiring pattern 1104 displays a function as a strip line. When the dielectric constant of dielectric 1105 is smaller than the dielectric constant of sheets 1101*a*, 1101*b*, a material being less in dielectric constant is generally less in high-frequency loss, and therefore, the Q value of wiring pattern 1104 is improved.

Also, for wiring pattern 1104, at least one electrode of capacitor can be used. In this case, capacitor is formed between electrode 1106 and copper foil 1103*a*, and between electrode 1106 and copper foil 1103*b*. Here, when the dielectric constant of dielectric 1105 is smaller than the dielectric constant of sheet 1101*a*, 1101*b*, parasitic capacity is decreased and Q value of capacitor is improved. Also, when the dielectric constant of dielectric 1105 is larger than the dielectric constant of sheets 1101*a*, 1101*b*, the capacity of capacitor can be increased. Accordingly, it is possible to miniaturize the capacitor.

Figure 23:
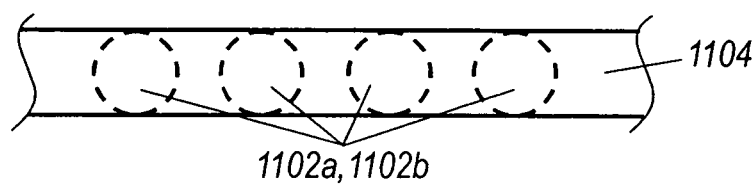
FIG. 23 is a plan view of an essential portion in the first example thereof.

FIG. 23 is a plan view of an essential portion of a sheet in the first example of preferred embodiment 6. There are provided wiring pattern 1104, and holes 1102*a*, 1102*b* perpendicular to wiring pattern 1104. Holes 1102*a*, 1102*b* are same in diameter, and are close to each other at equal intervals. And, these holes 1102*a*, 1102*b* are filled with dielectric 1105.

Thus, holes 1102*a*, 1102*b* are formed, and these holes 1102*a*, 1102*b* are filled with dielectric 1105 having dielectric constant different from that of sheets 1101*a*, 1101*b*, and thereby, it is possible to relatively easily obtain sheets 1101*a*, 1101*b* having partially different dielectric.

Figure 24:
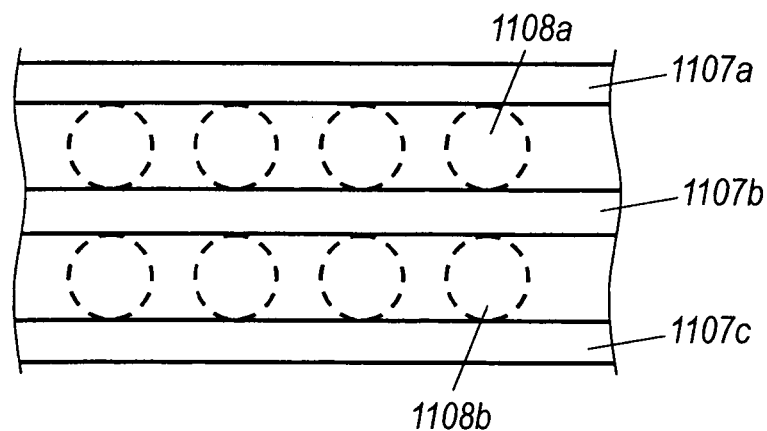
FIG. 24 is plan view of an essential portion in the second example thereof.

FIG. 24 is a plan view of an essential portion of a sheet in the second example of preferred embodiment 6. In FIG. 24, for example, patterns 1107*a*, 1107*b* and 1107*c* are disposed on sheet 1101*b*, and between patterns 1107*a*, 1107*b* and 1107*c* are disposed a plurality of holes 1108*a*, 1108*b* in a row, perpendicular to patterns 1107*a*, 1107*b* and 1107*c*. And, by filling holes 1108*a*, 1108*b* with magnetic material, the value of inductance of patterns 1107*a*, 1107*b* and 1107*c* can be increased. That is, it is possible to miniaturize the inductor.

Figure 25:
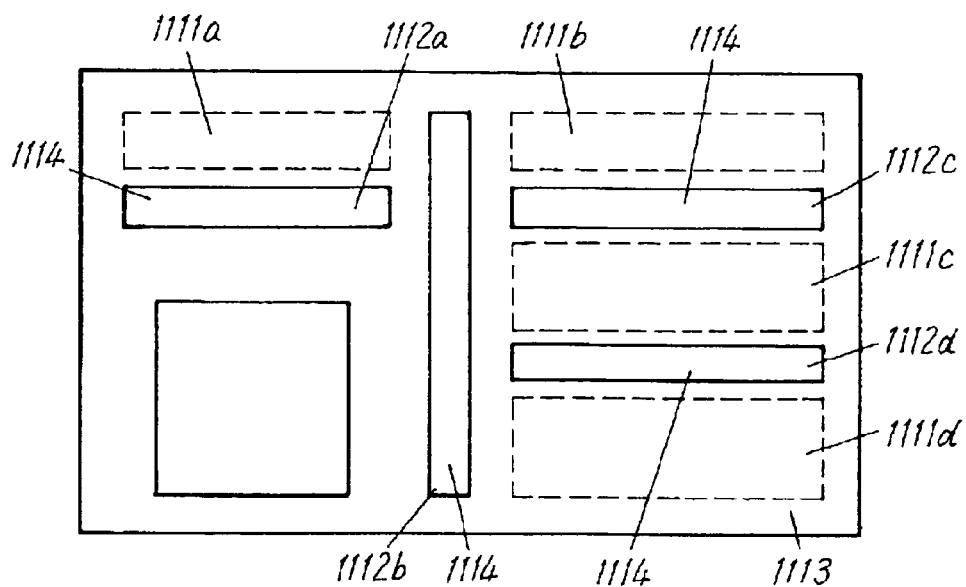
FIG. 25 is a plan view in the third example thereof.

FIG. 25 is a plan view of an essential portion in the third example of preferred embodiment 6. Not shown in FIG. 25, but electronic circuits 1111*a* to 1111*d* are formed on one main surface of resin substrate 1001 shown in FIG. 22, and holes 1112*a* to 1112*d* are formed in sheet 1113 so as to establish these electronic circuits 1111*a* to 1111*d*. And, sheet 1113 is laminated on one main surface of resin substrate 1001. And, holes 1112*a* to 1112*d* are filled with magnetic material 1114. In this way, electrical isolation between electronic circuits 1111*a* to 1111*d* can be improved. Also, each block of electronic tuner used in the preferred embodiment 5 can be divided by magnetic material 1114 to make the configuration.

Figure 26:
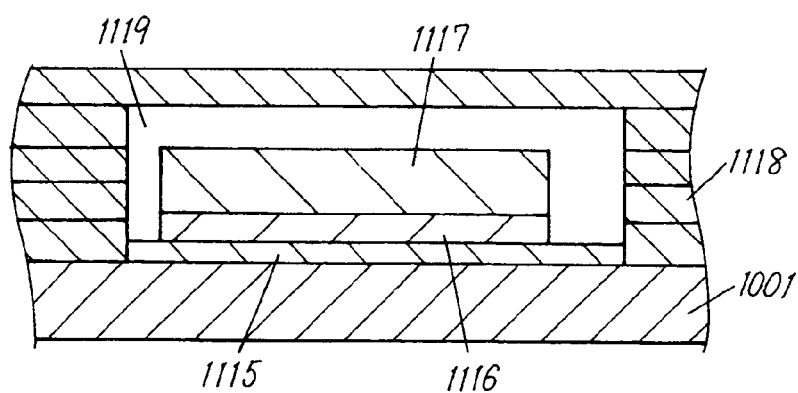
FIG. 26 is a sectional view of an essential portion in the fourth example thereof.

FIG. 26 is a sectional view of an essential portion of a substrate in the fourth example of preferred embodiment 6. In FIG. 26, coil pattern 1115 is formed, and one main surface of coil pattern 1115 is covered with resist layer 1116, on which magnetic material 1117 is placed. Sheet 1118 is a thermosetting sheet formed from porous fiber impregnated with resin which is laminated on one main surface of resin substrate 1001. And, hole 1119 is an opening provided in the sheet 1118, which is formed so as to cover coil pattern 1115.

Thus, since magnetic material 1117 is placed on coil pattern 1115, the coil pattern 1115 is magnetically shielded from other circuits. Accordingly, when coil pattern 1115 is employed as the oscillation coil of local oscillator 1075 (see FIG. 16) in the preferred embodiment 5, it is possible to improve the electrical isolation between local oscillator 1075 and other circuits. Also, since there is provided resist 1116 between coil pattern 1115 and magnetic material 1117, the distance between coil pattern 1115 and magnetic material 1117 is expanded, thereby increasing the Q value of coil pattern 1116. Also, when magnetic material 1117 has conductivity, it can be used as an insulator.

Preferred Embodiment 7

Figure 27:
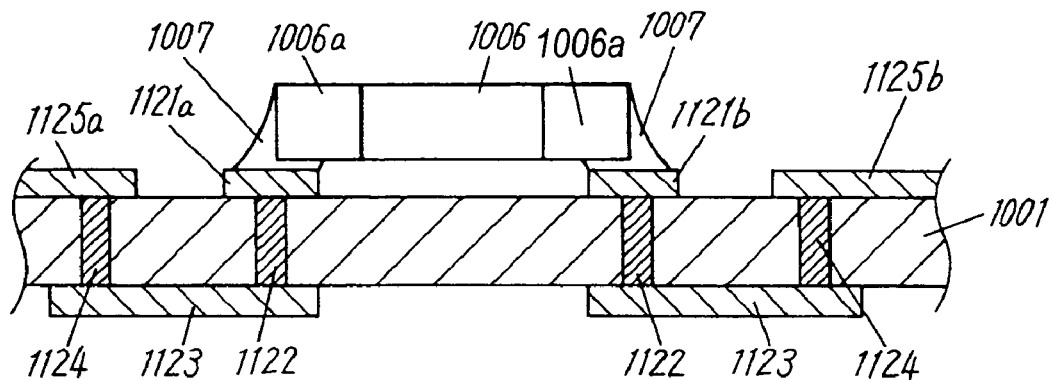
FIG. 27 is a sectional view of an essential portion of a laminated circuit board in the preferred embodiment 7 of the present invention.

FIG. 27 is a sectional view of an essential portion of a laminated circuit board in the preferred embodiment 7. Lands 1121a, 1121b are disposed on one main surface of resin substrate 1001. Lands 1121a, 1121b are connected to bottom pattern 1123, respectively leading them by inner-via 1122 to the opposite side of one main surface or the other main surface of resin substrate 1001. And again, they are respectively electrically connected to patterns 1125a, 1125b formed on one main surface of resin substrate 1001 via inner-via 1124.

Resistor 1006 is connected by solder 1007 to lands 1121a, 1121b, connecting them to electrode 1006a of resistor 1006.

Thus, land 1121a and land 1121b connected to resistor 1006 are once led to the other main surface of resin substrate 1001, and again connected to patterns 1125a, 1125b formed on one main surface of resin substrate 1001, and thereby, the generation of so-called Manhattan phenomenon can be prevented such that resistor 1006 is inverted when resistor 1006 is soldered or repaired even without resist printed on one main surface of resin substrate 1001.

That is, even in case patterns 1125a and 1125b connected to the ends of resistor 1006 are extremely different in area from each other, they can be thermally balanced by making lands 1121a and 1121b connected to the ends of resistor 1006 nearly equal in area, and therefore, there is no such problem that resistor 1006 is inverted.

Preferred Embodiment 8

Figure 28:
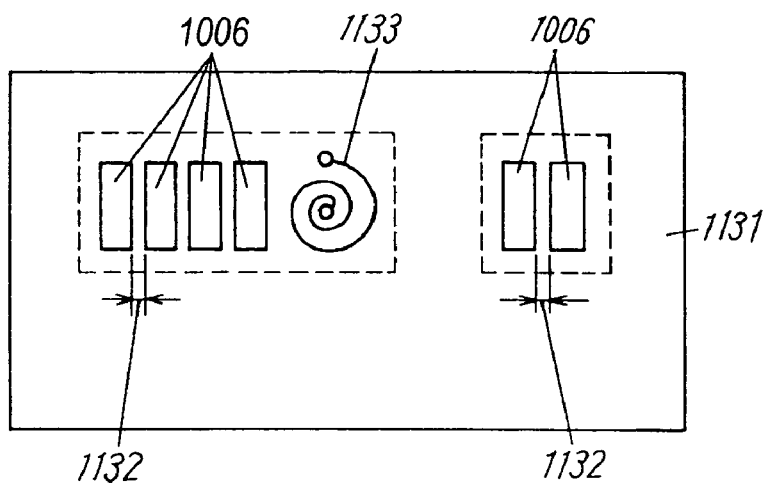
FIG. 28 is a plan view of a laminated circuit board in the preferred embodiment 8 of the present invention.
Figure 29:
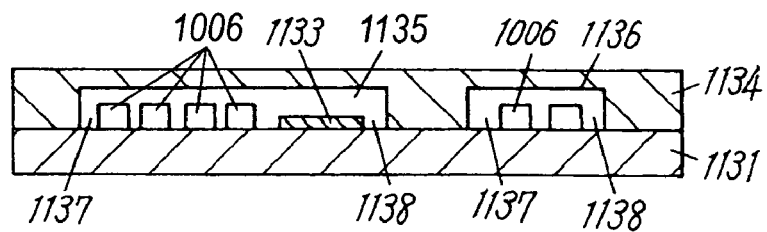
FIG. 29 is a sectional view thereof.

FIG. 28 is a plan view showing a laminated circuit board in the preferred embodiment 8. FIG. 29 is a sectional view of a laminated circuit board in the preferred embodiment 8. In FIG. 28, substrate 1131 is a thermosetting substrate, which corresponds to resin substrate 1001 used in the preferred embodiment 1. Resistors 1006, four pieces for example, are mounted at narrow intervals 1132 of about 100 µm on one main surface of substrate 1131. Also, there is provided pattern inductor 1133 in the vicinity of resistor 1006. Also, at a predetermined distance from pattern inductor 1133, two pieces of resistors 1006 for example are mounted at narrow intervals 1132. Used here is resistor 1006, but it is also preferable to use integrated circuit 1005.

FIG. 29 shows a state of sheet 1134 laminated on substrate 1131. The sheet 1134 corresponds to sheet 1011 employed in the preferred embodiment 1. In sheet 1134 are separately formed opening 1135 against four pieces of resistors 1006 and pattern inductor 1133, and opening 1136 against two resistors 1006.

Also, clearance 1137 is formed between the outer periphery of resistor 1006 and opening 1135, which functions as a so-called resin fluid filling portion. Also, there is provided clearance 1137 between the wall of opening 1136 and resistor 1006. Resin 1138 is resin flowing out of woven or non-woven cloth of sheet 1134 due to thermo-compression bonding.

As described above, in the preferred embodiment 8, a plurality of electronic components are mounted at narrow intervals, and it is possible to realize further miniaturization. Also, it has a secondary effect the same as in the preferred embodiment 1. That is, since the woven or non-woven cloth is impregnated with resin 1138 having heat fluidity while maintaining the shape of sheet 1134 by woven or non-woven cloth, sufficient resin 1138 is fully filled into the resin fluid filling portion, and no air or the like will remain therein. Accordingly, the electrical and mechanical connections will not be affected due to stresses generated when air or bubbles are expanded, thereby improving the reliability of the laminated circuit board and electronic components.

Also, since resin 1138 softens during thermo-compression bonding, resin 1138 is sufficiently filled into even narrow clearance between the electrodes of electronic components and between the electronic component and the wall of opening. Also, since sheet 1134 has thermosetting property, it does not return to a state of being plastic even when heated again after heat curing, and a stable state of sealed resistor 1006 is maintained.

Further, since resistors 1006 are mounted in substrate 1131, they can be inspected in a state of being mounted in substrate 1131, and the non-defective percent after completion of the laminated circuit board is improved.

Preferred Embodiment 9

Figure 30:
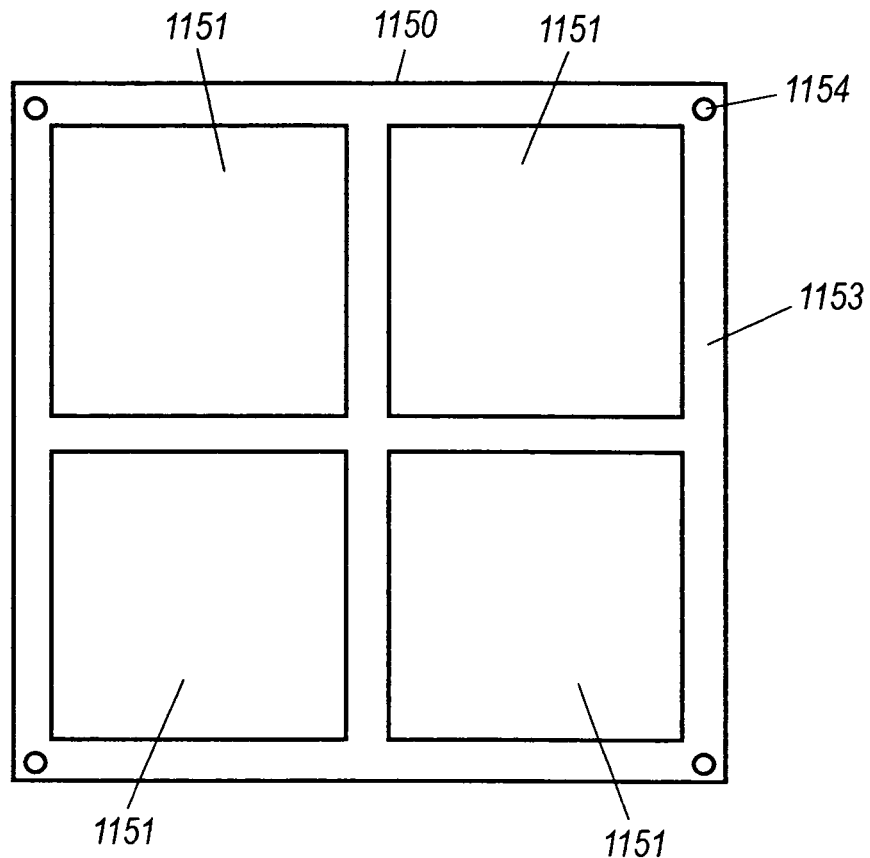
FIG. 30 is a plan view of a large main substrate in the preferred embodiment 9 of the present invention.
Figure 31:
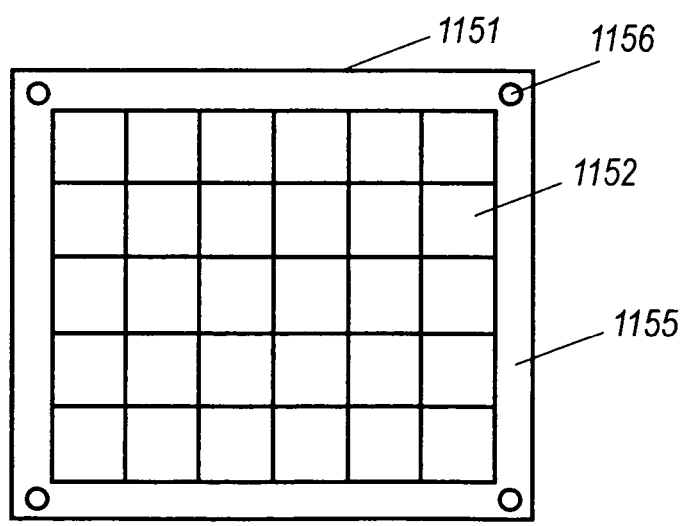
FIG. 31 is a plan view of a medium main substrate thereof.

FIG. 30 is a plan view of a laminated circuit board manufactured in the preferred embodiment 9. In FIG. 30, large main substrate 1150 is a worksheet-like substrate having a relatively large area. The large main substrate 1150 is for example divided into four parts which respectively becomes medium main substrate 1151. Also, medium main substrate 1151 is, for example, divided into 30 pieces (5×6) of sub-substrate 1152 as shown in FIG. 31. Those described earlier on a sub-substrate 1152 basis are preferred embodiments 1 to 8.

In FIG. 30, crosspiece 1153 connects medium main substrates 1151 to each other, and hole 1154 is a hole for positioning. Also, in FIG. 31, crosspiece 1155 is disposed around sub-substrate 1152, and hole 1156 is a hole for positioning. That is, hole 1156 has same function as that of hole 1154 shown in FIG. 30.

Figure 32:
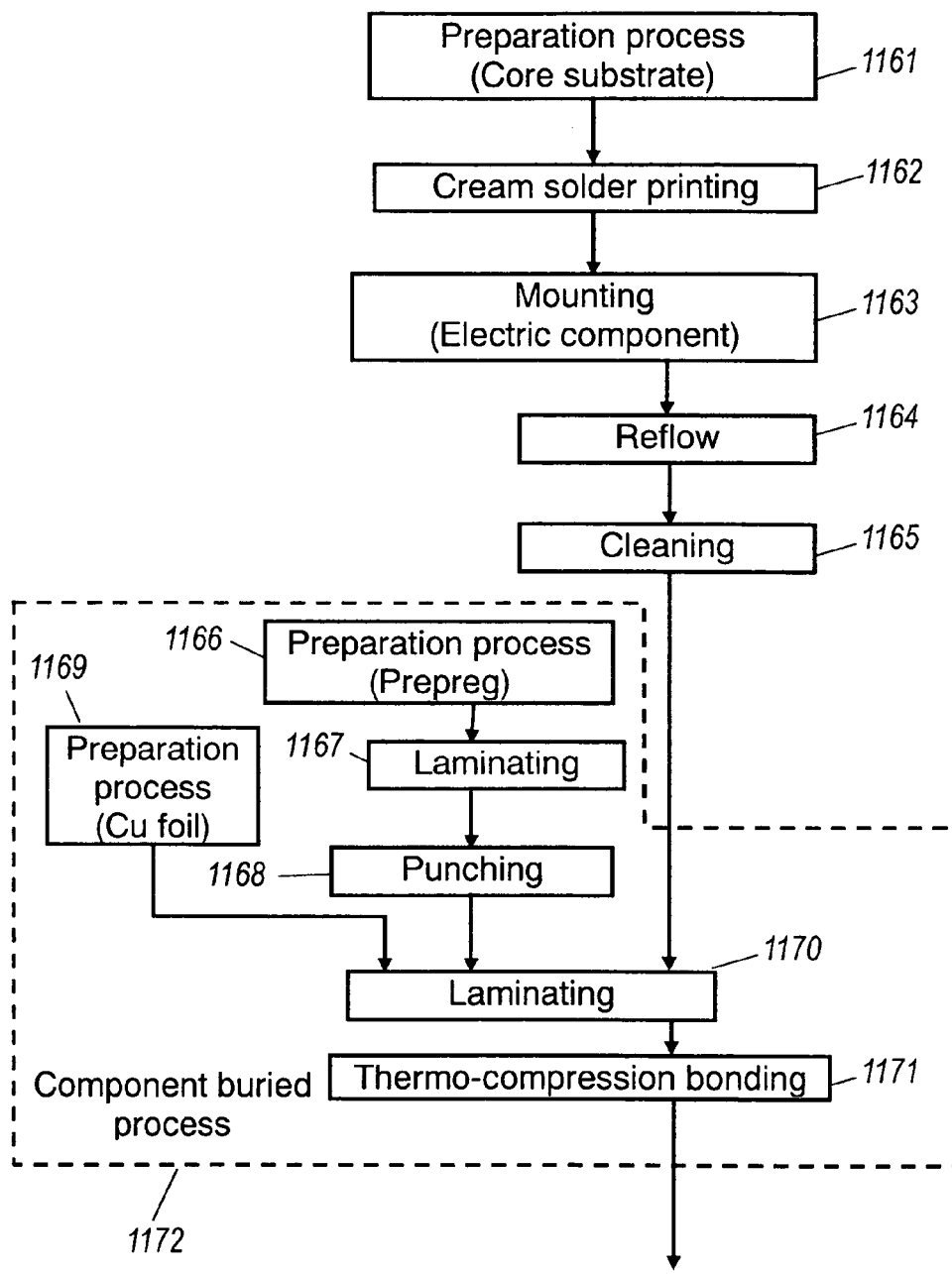
FIG. 32 is a manufacturing process chart of a laminated circuit board thereof.
Figure 33:
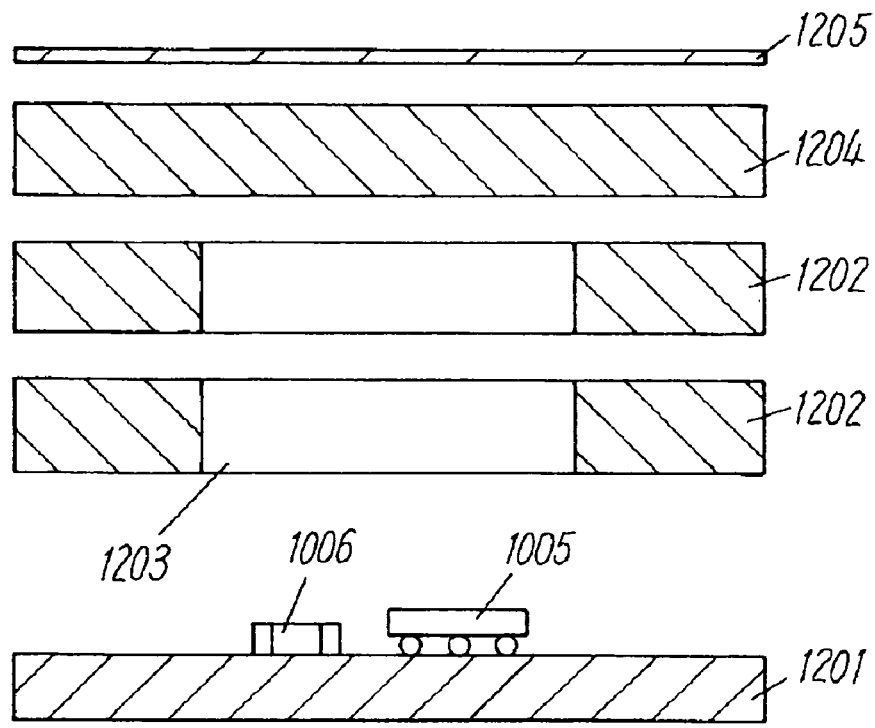
FIG. 33 is a sectional view before heating step thereof.

FIG. 32 and FIG. 33 show a manufacturing method for a laminated circuit board with electronic components mounted therein. The laminated circuit board shown in the preferred embodiment 9 is manufactured on a large main substrate 1150 basis as in FIG. 30. However, this is eventually a set of sub-substrates 1152, which is therefore shown in FIG. 33 on a sub-substrate 1152 basis. Regarding these matters, the same holds true for the preferred embodiments 1 to 8 so far described.

For the manufacture of a laminated circuit board, core substrate 1201 is first prepared in preparation process 1161. Subsequently, cream solder printing is executed in cream solder printing process 1162. After cream solder printing process 1162, built-in electronic components such as integrated circuits and resistors are mounted in core substrate 1201 in built-in electronic component mounting process

1163. After that, reflow soldering of the built-in electronic component is executed by cream solder on core substrate 1201 in reflow process 1164. After reflow process 1164, core substrate 1201 reflow-soldered is cleaned in cleaning process 1165.

Thus, the manufacturing process of substrate 1201 with resistor 1006 and integrated circuit 1005 connected and fixed electrically and mechanically thereon is completed as shown in FIG. 33.

Core substrate 1201 shown in FIG. 33 corresponds to resin substrate 1001 in the preferred embodiment 1.

Next, a prepreg laminating process will be described, in which thermosetting sheet 1202 formed from porous fiber impregnated with resin is laminated on one main surface of substrate 1201 with resistor 1006 and integrated circuit 1005 connected and fixed thereon.

Non-hardened thermosetting sheet (prepreg sheet) 1202 is prepared in preparation process 1166, and non-hardened thermosetting sheet 1202 is laminated in laminating process 1167. And, after laminating process 1167, hole 1203 for inserting resistor 1006 and integrated circuit 1005 therein as built-in electronic components is formed by punching in punching process 1168. Hole 1203 corresponds to holes 1012, 1013 in the preferred embodiment 1. And, subsequently, non-hardened sheet 1204 not provided with hole 1203 is laminated on one main surface of sheet 1202. And, copper foil 1205 prepared in preparation process 1169 is disposed on one main surface of the laminated sheet 1204, and it is laminated on substrate 1201 in laminating process 1170. In FIG. 32 component buried process 1172 comprises, preparation process 1166,1169 and laminating process 1167, punching process 1168 and thermo-compression bonding process 1171.

Next, substrate 1201 with resistor 1006 and integrated circuit 1005 connected and fixed thereon is compressed under heat in thermo-compression bonding process 1171 in which it is compressed under heat and vacuum. In this case, the thermo-compression bonding conditions are nearly the same as in the preferred embodiment 1. These are the prepreg process and the conditions.

Figure 34:
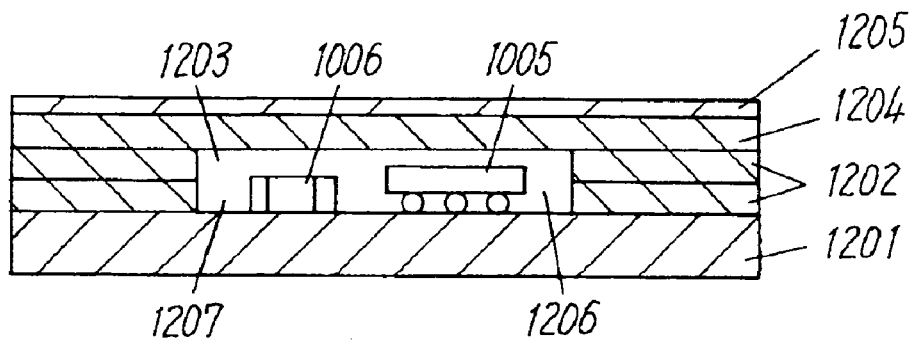
FIG. 34 is a sectional view after heating step thereof.

According to the process and conditions, as shown in FIG. 34, sheets 1202, 1204 are thermally compressed to a size nearly one third of the original thickness. Also, in this case, resin 1207 flowing out of sheet 1202 is fully filled into the clearance (resin fluid filling portion) 1206 in hole (opening) 1203.

Since the laminated circuit board is manufactured through the processes as described above, it brings about the following advantages. That is, the woven or non-woven cloth is impregnated with resin 1207 having heat fluidity, while maintaining the shape of sheet 1202 by woven or non-woven cloth having hole 1203, sufficient resin 1207 is filled into clearance 1206 forming a filling portion by fluid resin during thermo-compression bonding, and no air or the like will remain therein. Accordingly, the connections of electronic components and lands are not affected by stresses generated when the air or bubbles are thermally expanded, thereby improving the reliability of electrical and mechanical connections.

Also, since integrated circuit 1005 and resistor 1006 are mounted in substrate 1201 before sheet 1202 and substrate 1201 are integrated, it is very easy to assemble as compared with the conventional method. Also, since substrate 1202 has clearance 1206 between integrated circuit 1005 and resistor 1006, it is easy to insert them even when integrated circuit 1005 and resistor 1006 protruding from substrate 1201 are mounted.

Also, the temperature for integrating substrate 1201 and sheet 1202 is at a level such that the solder for connecting and fixing integrated circuit 1005 and resistor 1006 is not melted. That is, the temperature selected will be lower than the melting point of the solder. The soldered connections are not broken down due to integration, and integrated circuit 1005 and resistor 1006 are able to maintain a state of stable connections.

Further, due to softening during thermo-compression bonding, no air or the like will be contained in narrow clearance, and resin 1207 is fully filled into the clearance (resin fluid filling portion). Here, sheet 1202 has thermosetting property, and therefore, even when heated again after heat curing, it will not return to a state of being plastic, and integrated circuit 1005 and resistor 1006 sealed maintain a stable state.

Furthermore, since integrated circuit 1005 and resistor 1006 are mounted in substrate 1201, they can be inspected on a substrate 1201 basis, and the non-defective percent after completion of the laminated circuit board is improved.

Also, together with substrate 1201 and sheets 1202, 1204, worksheet-like large main substrate 1150 with a plurality of sub-substrates 1152 connected to each other as shown in FIG. 30, FIG. 31 can be manufactured, and it is possible to improve the manufacturing efficiency.

Also, since a plurality of sheets 1202 are laminated in accordance with the height of integrated circuit 1005 and resistor 1006, copper foil 1205 is disposed on the whole or a part of the uppermost layer, and therefore, circuit patterns and electric circuits can be formed by etching copper foil 1205.

Also, since copper foil 1205 is disposed on the whole or a part of the uppermost layer of sheet 1202 to 1204, copper foil 1205 when connected to ground displays a shielding function, which will not interfere with other circuits nor will it be interfered by other circuits.

Further, in hole 1203 of sheet 1202, as shown in preferred embodiment 3, a filler is sufficiently filled into narrow clearance between integrated circuit 1005 and resistor 1006. Accordingly, integrated circuit 1005 and resistor 1006 sealed are able to maintain a state of stable connection.

Also, with a circuit pattern disposed in the vicinity of integrated circuit 1005 on substrate 1201, resistor 1006 and integrated circuit 1005 are disposed in an eccentric position of hole 1203, and therefore, when sheet 1202 is thermally compressed, resin 1207 lowered in viscosity due to the temperature during thermo-compression bonding will flow into hole 1203. Since the dielectric constant of resin 1207 is higher than that of air, the dielectric constant of the circuit pattern disposed in the vicinity of integrated circuit 1005 and resistor 1006 becomes higher than that of air, and it is possible to miniaturize the circuit pattern.

Also, if a pattern inductor is disposed on substrate 1201, and a second hole is formed in sheet 1202 opposing to the pattern inductor, then resin 1207 of porous fiber will flow into the second hole, and around the pattern inductor, resin 1207 flowing out of sheet 1202 is filled into the hole, causing the dielectric constant to become higher than at main body of substrate, and it is possible to increase the value of inductance. Also, the size can be reduced if not needed to increase the value of inductance.

Also, with a high-frequency circuit including an inductor disposed on substrate 1201, a second hole formed in sheet 1202 opposing to the inductor, and dielectric filled into the second hole, the electrical isolation between the inductor and other circuits will be improved. Accordingly, there is no interference with other circuits due to high-frequency waves emitted from the inductor.

Also, after thermo-compression bonding process 1171, if a through-hole is formed at the end of substrate 1201 and sheet 1202 to lead the signals of circuits disposed on substrate 1201 and sheet 1202, the signals of the substrate and sheet can be connected to the electrode at the end.

Also, as shown in FIG. 31, crosspiece 1155 is disposed at the outer periphery of medium main substrate 1151 which is a set of a plurality of sub-substrates 1152. Crosspiece 1153 is also disposed at the outer periphery of large main substrate 1150 which is a set of medium main substrates 1151. Accordingly, even when hole 1203 formed in sheet 1202 of sub-substrate 1152 is large, the resin is also filled from the portions of crosspieces 1153, 1155, and consequently, hole 1203 is filled up with resin 1207.

Preferred Embodiment 10

The preferred embodiment 10 will be described with reference to the drawings. A module manufacturing apparatus is described in the preferred embodiment 10.

Figure 35:
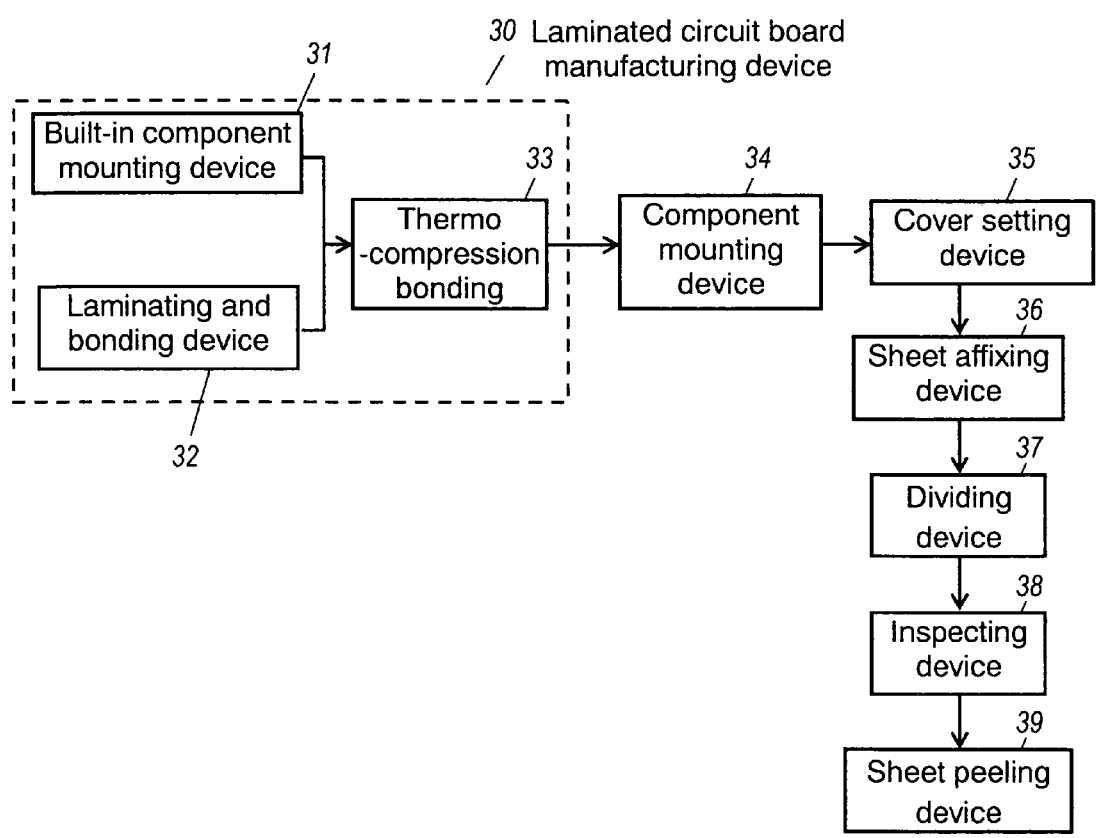
FIG. 35 is a block diagram of a module manufacturing apparatus in the preferred embodiment 10 of the present invention.

FIG. 35 is a block diagram of a module manufacturing apparatus. In FIG. 35, laminated circuit board making device 30 serves to make the laminated circuit boards of preferred embodiments 1 to 9 so far described. That is, the laminated circuit board making device 30 comprises built-in electronic component mounting device 31, laminating and boring device 32, and thermo-compression bonding device 33. Built-in electronic component mounting device 31 is a device for mounting electronic components built into the core substrate of the module. Laminating and boring device 32 is a device for making holes for inserting electronic components in a thermosetting non-hardened resin sheet and for laminating the resin sheet. Also, thermo-compression bonding device 33 disposed in the downstream thereof is set to nearly the same thermo-compression bonding conditions described in the preferred embodiment 1 with respect to the substrate with electronic components buried therein and the sheet laminated. That is, the thermo-compression bonding temperature is 180° C. to 200° C., the pressure is 30 kg/cm², and the thermo-compression bonding time is set to one hour.

The laminated circuit board employed in the preferred embodiment 10 is preferable to be large main substrate 1150 shown in FIG. 30. Copper foil 1205 of large main substrate 1150 is etched, and after that, it is divided into medium main substrates 1151.

Component mounting device 34 is disposed in the downstream from laminated circuit board making device 30, and it is a device for soldering electronic components to the pattern etched on medium main substrate 1151. And, cover setting device 35 located in the downstream thereof is a device for setting shield case (cover) on every sub-substrate 1152 of medium main substrate 1151.

Sheet affixing device 36 disposed in the downstream from cover setting device 35 is a device for integration which affixes an adhesive sheet to one main surface or its opposite side, that is, the other main surface of the shield case disposed on medium main substrate 1151.

Dividing device 37 disposed in the downstream from sheet affixing device 36 is a device for dividing medium main substrate 1151 into sub-substrates 1152 disposed in the substrate. As it is cut by dividing device 37, sub-substrates 1152 are electrically isolated from each other. However, they are mechanically connected to each other by the adhesive sheet. At inspection device 38 located in the downstream from dividing device 37, the inspection can be performed every medium main substrate 1151 connected by adhesive sheet. Accordingly, the inspecting efficiency is greatly improved. Also, since inspection device 38 is located in the downstream from dividing device 37, the level of stress applied during operation of dividing device 37 or its influences can also be inspected.

And, the adhesive sheet affixed by sheet affixing device 36 is removed by sheet peeling device 39 disposed in the downstream from inspection device 38.

Thus, a module is completed.

Figure 36A:
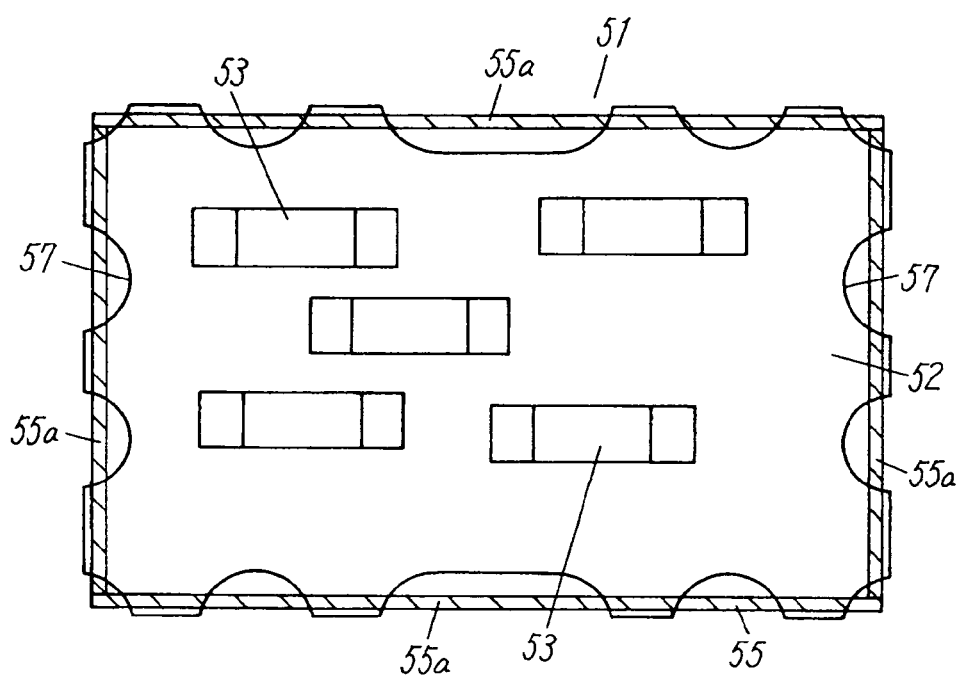
FIG. 36A is a sectional view of a voltage controlled type oscillator as viewed from above.
Figure 36B:
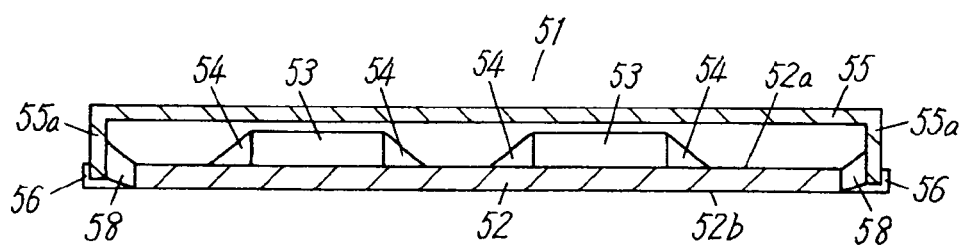
FIG. 36B is a sectional view of a voltage controlled type oscillator as viewed from side.

A completed module is shown in FIG. 36A, FIG. 36B. Here, a voltage controlled type oscillator (VCO) is described as one module. FIG. 36A is a sectional view of VCO 51 in the preferred embodiment 10 as viewed from above, and FIG. 36B is a sectional view of VCO 51 as viewed from side.

In FIG. 36A and FIG. 36B, a high-frequency circuit of VCO 51 is formed on sub-substrate 52. Sub-substrate 52 is for example a 4-layer substrate of 0.4 mm in thickness.

Figure 37:
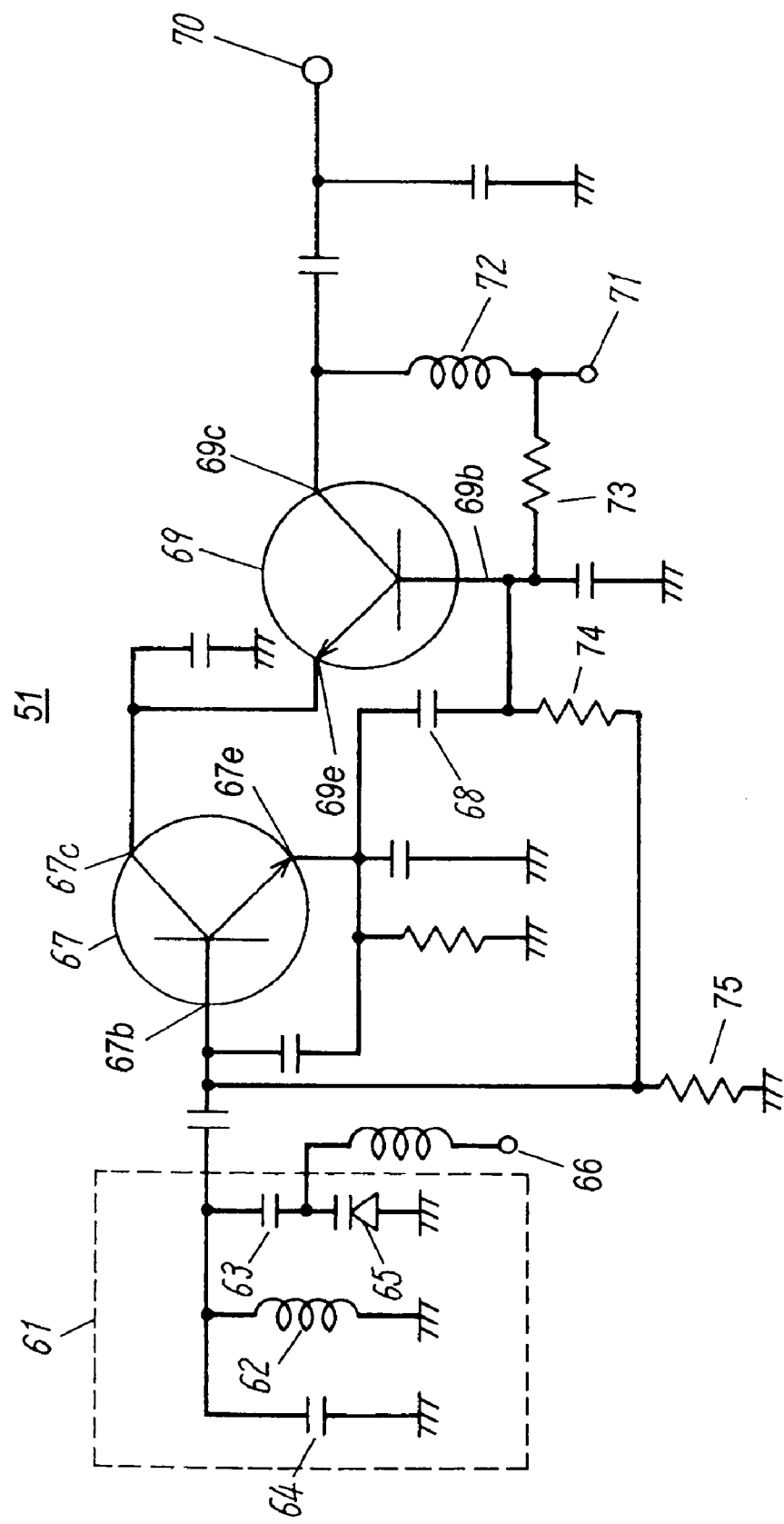
FIG. 37 is a circuit diagram of the voltage controlled type oscillator.

Electronic component 53 as an example of component is mounted on one main surface 52a of sub-substrate 52. The opposite side of one main surface 52a, that is, the other main surface of sub-substrate 52 is shown by reference numeral 52. Electronic component 53 is electrically and mechanically connected by solder 54 to sub-substrate 52. Cover 55 is a metal cover bent in box-like shape, which is a casing for electronic component 53. Leg 56 disposed at the side 55a of cover 55 is inserted in semi-circular through-hole 57 of sub-substrate 52, and is electrically and mechanically connected by solder 58. Nickel silver of 0.15 mm thick is used for cover 55. FIG. 37 is a circuit diagram of VCO 51 employed in the preferred embodiment 10. In FIG. 37, resonance circuit 61 comprises, for example, one pattern inductor 62, two sets of capacitors 63, 64, and variable capacitance diode 65.

Control terminal 66 is a control voltage applying terminal for varying the capacity of variable capacitance diode 65. By changing the voltage applied to control terminal 66, the resonance frequency of resonance circuit 61 is controlled and the oscillation frequency of VCO 51 is varied.

Also, the output of resonance circuit 61 is supplied to base terminal 67b of oscillation transistor 67. Further, the output of resonance circuit 61 is applied to the emitter 67e of oscillation transistor 67, and the output is inputted to the base terminal 69b of buffer amplifier transistor 69 via signal transmission capacitor 68. The output amplified by buffer amplifier transistor 69 is taken out from collector terminal 69c, then signal of about 3.8 GHz is further outputted from output terminal 70.

Also, the supply voltage to buffer amplifier transistor 69 and oscillation transistor 67 is supplied from power supply terminal 71. That is, it is supplied to collector terminal 69c of transistor 69 via inductor 72. Also, the supply voltage is supplied to the collector terminal 67c of oscillation transistor 67 via emitter terminal 69e of buffer transistor 69.

Also, for the operation of buffer amplifier transistor 69 and oscillation transistor 67, base bias voltage is individually supplied to base terminals 69b, 67b via bleeder resistors 73, 74 and 75.

In the preferred embodiment 10, pattern inductor 62 is separately disposed on one main surface 52a of sub-substrate 52 and on the third layer of sub-substrate 52, and between these is connected by through-hole. Also, capacitors 63, 64 and 68 are chip capacitors, which are connected by solder 54 to sub-substrate 52 according to a reflow soldering process.

By reflow soldering based on a reflow soldering process, capacitors 63, 64 and 66 can be fixed in predetermined positions because of the self-alignment effect. Accordingly, the impedance including pattern inductor 62 becomes constant, and the oscillation frequency also becomes constant, making it possible to obtain reliable electric characteristics.

Preferred Embodiment 11

Figure 38:
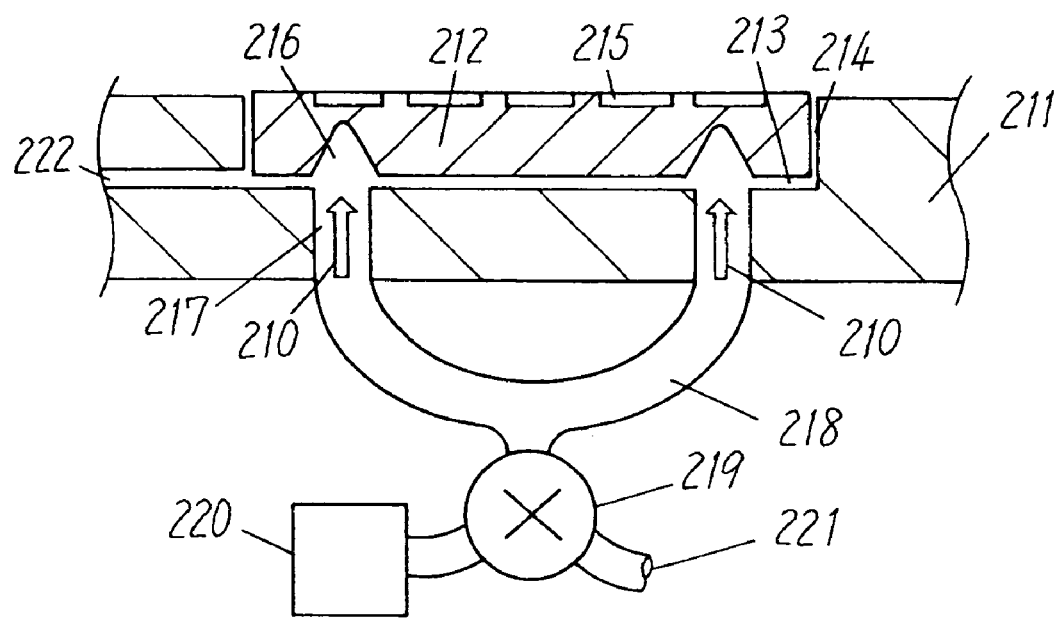
FIG. 38 is a sectional view of a component setting cassette removing portion in the preferred embodiment 11 of the present invention.

FIG. 38 is a sectional view of a component setting cassette removing portion in the preferred embodiment 11. This is included in cover setting device 35 described in the preferred embodiment 10, and a component setting cassette which is a part of an aligning device for aligning component (such as cover) 209 mounted on sub-substrate 52.

In FIG. 38, depression 213 for inserting component setting cassette 212 is formed in one main surface of plate 211. Faucet engagement portion 214 is formed at the side of depression 213, which engages component setting cassette 212 with fine clearance. Faucet engagement portion 214 is tapered and widens out toward one main surface side or in the direction of component setting cassette 212. Thus, it is easy to insert and remove component setting cassette 212 from one main surface side of plate 211.

Figure 42:
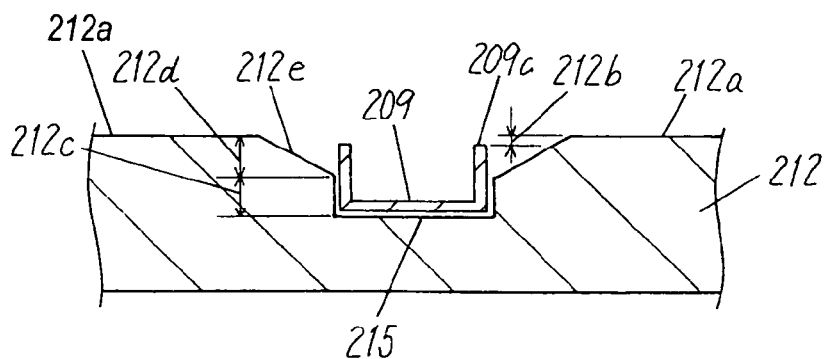
FIG. 42 is a sectional view of an essential portion of the component setting cassette.

One main surface of component setting cassette 212 is provided with depression 215 for aligning component 209 (see FIG. 42). Also, the other main surface of component setting cassette 212 is provided with hole 216 which is tapered and inwardly narrows in width in the direction of thickness. The shape of hole 216 is provided as an example of depression.

Toward the other main surface of plate 211 from the bottom of depression 213 of plate 211, that is, at the opposite side of component setting cassette 212, there is provided feed hole 217 for air 210 going through plate 211. The air is used as an example of fluid. Feed hole 217 is formed opposing to hole 216, and air 210 flowing out of feed hole 217 is spouted toward hole 216 and pushes component setting cassette 212 upward. Thus, since component setting cassette 212 is pushed up by air 210 even in a state of faucet engagement, it can be easily removed from plate 211 by grasping it with the hand after component setting cassette 212 is pushed up halfway.

Pipe 218 is connected to feed hole 217, and connects to compression pump 220 via valve 219. Exhaust hole 221 is connected to valve 219. Accordingly, by controlling the valve 219, it is possible to spout compressed air 210 from pump 220 toward hole 216 of component setting cassette 212 and to push up component setting cassette 212. Also, air 210 in hole 216 can be discharged outside through exhaust hole 221.

Also, if provided with exhaust hole 222 formed through toward outside from the bottom of depression 213 of plate 211, air 210 enclosed between depression 213 and component setting cassette 212 can be discharged outside without controlling valve 219 when inserting component setting cassette 212 into depression 213. Accordingly, it is possible to easily insert component setting cassette 212 into depression 213.

Figure 39:
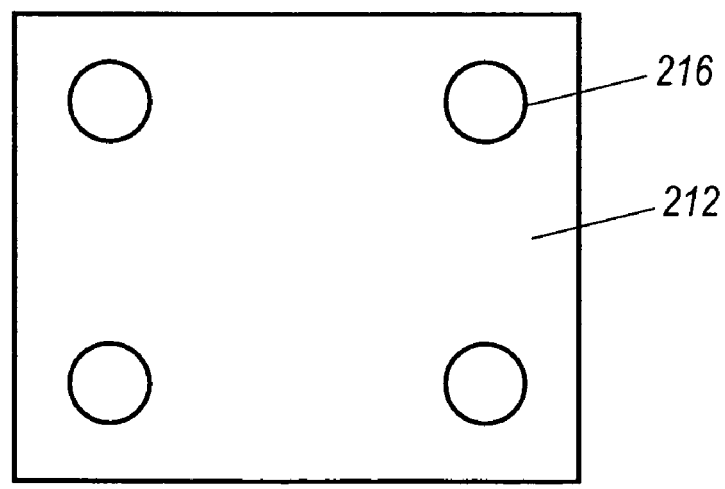
FIG. 39 is a plan view of the component setting cassette as viewed from bottom.

FIG. 39 is a plan view of component setting cassette 212 as viewed from bottom. For example, conical hole 216 is provided at one main surface side of component setting cassette 212. Holes 216 are respectively provided at four corners of square-shaped component setting cassette 212. It is important to form the holes well-balanced so that component setting cassette 212 is horizontally moved up when air 210 pushes up hole 216 via feed hole 217 with a uniform force.

Figure 40:
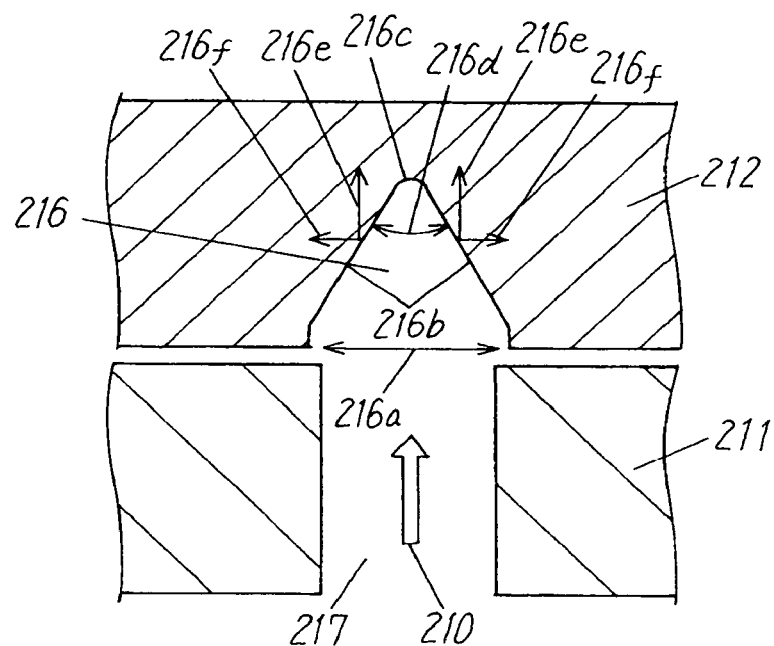
FIG. 40 is an enlarged sectional view of an essential portion of the component setting cassette.

FIG. 40 is an enlarged sectional view in the vicinity of hole 216. Hole 216 formed at the other main surface side of component setting cassette 212 is shaped as described in the following. That is, diameter 216a at the bottom is, for example, 15 mm. Also, component setting cassette 212 has taper surface 216b which inwardly narrows toward the inside of component setting cassette 212. Open angle 216d as viewed from peak 216c of taper surface 216 is less than 90° C. Peak 216c is at the center of hole 216.

Feed hole 217 is a passage of air 210 compressed at the other main surface side of plate 211, which is provided opposite to hole 216. Air 210 flowing out toward hole 216 from feed hole 217 and touches to taper surface 216b, and the push pressure turns into vertical force 216e and horizontal force 216f. Force 216f in the horizontal direction pushes up serves to keep balance in the horizontal direction, while force 216e pushes up component setting cassette 212 in the direction moving away from plate 211.

Figure 41:
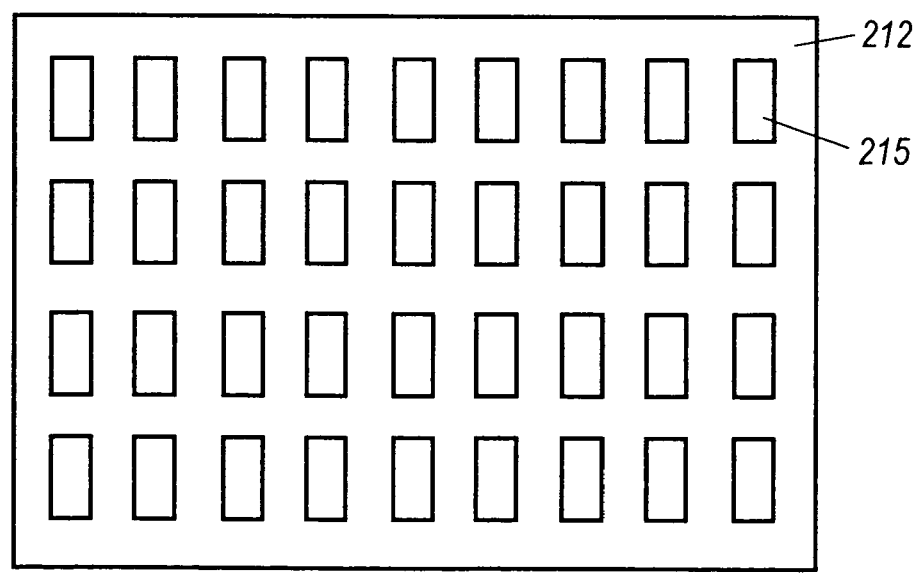
FIG. 41 is a plan view of the component setting cassette as viewed from above.

FIG. 41 is a plan view of component setting cassette 212 as viewed from top, that is, from its one main surface side. In FIG. 41, there are provided 36 (4×9) pieces of depressions 215 for example in in-line arrangement in which component 209 (see FIG. 45) to be arranged in component setting cassette 212 is fitted. Component 209 reciprocally slides on component setting cassette 212, and then component 209 is fitted in depression 215 to be arranged.

FIG. 42 is a sectional view of an essential portion of component setting cassette 212. In depression 215 of component setting cassette 212 is inserted and arranged component 209 formed from metal having a U-shaped section. The depth of depression 215 is such that when component 209 is fitted in depression 215, opening end 209a of component 209 is a little lower than top surface 212a of component setting cassette 212 as shown by reference numeral 212b (0.1 mm). Also, the side surface of depression 215 is vertical up to nearly half 212c in height of component 209, and remaining half 212d is provided with taper 212e that widens out toward top surface 212a. The purpose of this is to make easier the insertion into depression 215 when component 209 reciprocally slides on component setting cassette 212.

Preferred Embodiment 12

Figure 43:
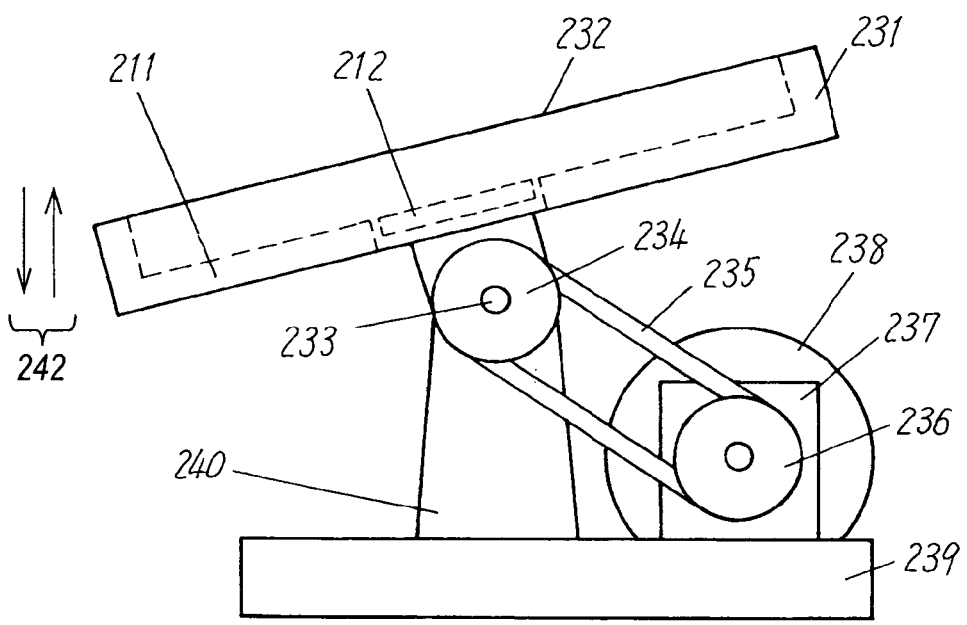
FIG. 43 is a side view of a component aligning device in the preferred embodiment 12 of the present invention.

FIG. 43 is a side view of a component aligning device using a removing portion of component setting cassette 212 in the preferred embodiment 12. This is included in cover setting device 35 described in the preferred embodiment 10, and serves to align electronic components mounted on sub-substrate 52.

In FIG. 43, depression 231 is provided at the end of plate 211, thereby forming tray 232. Component 209 to be arranged is placed in tray 232. Shaft 233 is disposed nearly at the center under plate 211. Pulley 234 is connected to shaft 233. Pulley 234 is connected to another pulley 236 via belt 235. Pulley 236 is connected to motor 238 via power converter 237 which converts rotational motion to reciprocal motion. And, motor 238 is mounted on base 239. Also, support 240 is a support disposed on base 239, which supports shaft 233 of tray 232.

In a component aligning device having such a configuration, motor 238 is rotated, and the rotation is converted by power converter 237 from rotational motion to reciprocal motion. The power converted into reciprocal motion serves to rotate pulley 234 via belt 235. Then, as shown by reference numeral 242, the ends of tray 232 interlocked with pulley 234 are alternately moved up and down about shaft 233 like a seesaw.

Accordingly, with component 209 inserted in tray 232, the component 209 reciprocally slides in tray 232. In this case, the ends of component setting cassette 212 being in faucet engagement at the center of plate 211 forming the bottom of tray 232 are also moved up and down. Then, component 209 reciprocally slides on component setting cassette 212, and is fitted in depression 215 of component setting cassette 212.

Preferred Embodiment 13

Figure 44:
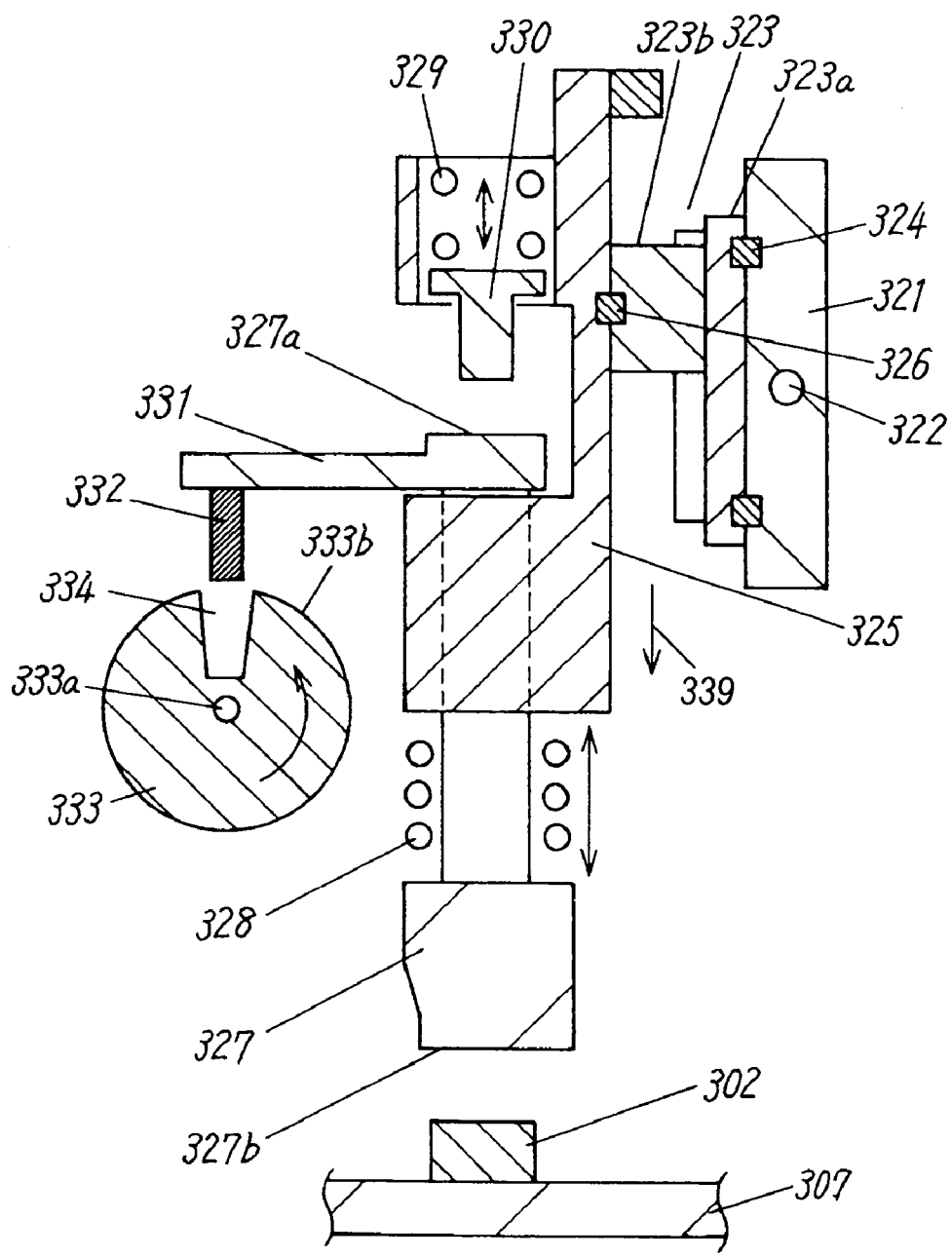
FIG. 44 is a sectional view of an essential portion of a component inserting unit in the preferred embodiment 13 of the present invention.

FIG. 44 is a sectional view of an essential portion of a component inserting unit in the preferred embodiment 13. It comprises cover setting device 35 described in the preferred embodiment 10.

Horizontal member 321 is able to slide in the horizontal direction (vertical direction on this side in the figure) by means of timing belt 322. One side 323a of slide portion 323 is fixed by fixing member 324 on horizontal member 321. Also, the other side 323b of slide portion 323 is fixed by fixing member 326 on nozzle block 325. Slide portion 323 is fixed at one side 323a and can be vertically slidably controlled at the other side 232b.

Nozzle main body 327 is freely slidable in nozzle block 325. Spring 328 activates nozzle main body 327 downward against nozzle block 325. Also, spring 329 pushes push-portion 330 downward. Springs 328, 329 are preferable to be formed from elastic material such as rubber.

Arm 331 is disposed in the horizontal direction at the upper part of nozzle main body 327. Selective rod 332 is fitted to the end portion of arm 331 in the downward direction. Also, cylinder 333 is disposed under selective rod 332. Cylinder 333 is finely controlled for its rotation about arbor 333a. Reference numeral 334 is a hole disposed in surface 333b of cylinder 333, in which inserting selective rod 332 is inserted.

As described above, a plurality of, for example, five pieces of nozzle blocks 325 including nozzle main body 327 are mounted on the other side 323b of slide portion 323. Laminated circuit board 307 is mounted under nozzle main body 327. Case 302 is an example of component inserted in laminated circuit board 307, which corresponds to component 209 of FIG. 42.

The operation of a component inserting unit is again described with reference to FIG. 44. First, the other side 323b of slide portion 323 moves down as shown by reference numeral 339, then nozzle block 325 connected to the other side 323b also moves down. In this case, if hole 334 exists under selective rod 332, nozzle main body 327 will also move down. Then, case 302 is vacuum-attracted to lower end 327b of nozzle main body 327. In this condition, when nozzle main body 327 moves down, case 302 is abutted on laminated circuit board 307. Laminated circuit board 307 corresponds to medium main substrate 1151 in FIG. 31. And, when nozzle block 325 further moves down, it is pressed against laminated circuit board 307 with the resilient force of spring 328.

Further, when nozzle block 325 moves down, push-portion 330 is abutted on upper end 327a of nozzle main body 327, and with the resilient force of spring 329 added, case 302 is pressed against laminated circuit board 307. In a series of such operations, selective rod 332 is smoothly inserted into hole 334, making it possible to relatively smoothly execute these operations.

Described next is the operation executed when hole 334 is not positioned under selective rod 332 as cylinder 333 is rotated. When hole 334 is not located under selective rod 332, and nozzle block 325 moves down, the tip end of selective rod 332 is abutted on surface 333b of cylinder 333. Accordingly, nozzle main body 327 is not allowed to move down any more. That is, even when nozzle block 325 moves down, case 302 is not inserted into laminated circuit board 307.

In this way, depending on whether hole 334 for inserting selective rod 332 therein is positioned under selective rod 332 or not, whether case 302 is inserted into laminated circuit board 307 or not is selected. Selective rod 332 and cylinder 333 make up a selecting means. Cylinder 333 can be easily attached or detached and is replaceable.

Figure 45:
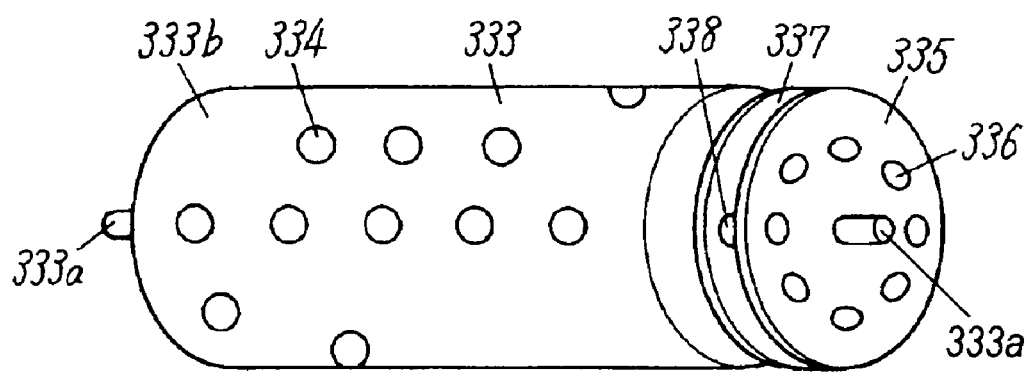
FIG. 45 is a perspective view of a cylinder forming the component inserting unit.

FIG. 45 is a perspective view of cylinder 333. In this example, cylinder 333 has a cylindrical shape, but it is not limited to a cylindrical shape, and for example, it is preferable to be polygonal prisms such as rectangular prisms. Arbor 333a is disposed in the center of cylinder 333. Cylinder 333 rotates when arbor 333a is rotated. Accordingly, disposing hole 334 in surface 333b of cylinder 333, case 302 can be inserted only for nozzle main body 327 corresponding to hole 334.

Detection plate 335 is disposed at the end side of cylinder 333, and is fixed to arbor 333a. The shape of detection plate 333 is generally circular, and holes 336 are disposed at equal intervals on the concentric circle thereof. Hole 336 is detected by photo-sensor (not shown) to detect the rotational angle of cylinder 333. Also, detection plate 337 is a detecting plate for determining the initial position of cylinder 333. The initial position of rotation of cylinder 333 is recognized by hole 338 disposed in detection plate 337. Detection plate 337 is located at the end of cylinder 333, which is a disk fixed to arbor 333a.

Cylinder 333 has detection plates 335, 337. With the detecting output of these detection plates, the rotation of cylinder 333 can be controlled, and the component inserting unit can be automated.

Figure 46:
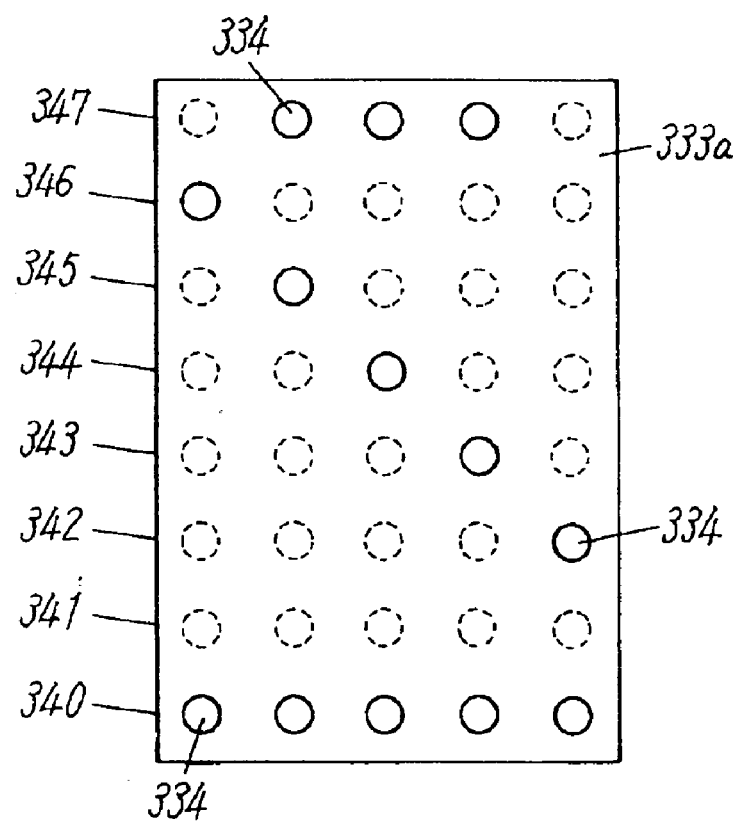
FIG. 46 is a development thereof.

FIG. 46 is a development of cylinder 333. In FIG. 46, for example, in first row 340, all lines are provided with hole 334. Accordingly, with this position selected, all nozzle main body 327 moves down and is able to insert case 302. On the other hand, in row 341, all lines are not provided with hole 334. Accordingly, with this position selected, all nozzle main body 327 does not move down and is unable to insert case 302.

Also, with any one of row 342 to row 346 selected, the corresponding nozzle main body 327 moves down and is able to insert case 302. Also, in this case, since only one nozzle main body 327 is selected, the inserting pitch of case 302 can be freely changed by controlling horizontal member 321 with timing belt 322.

Figure 51:
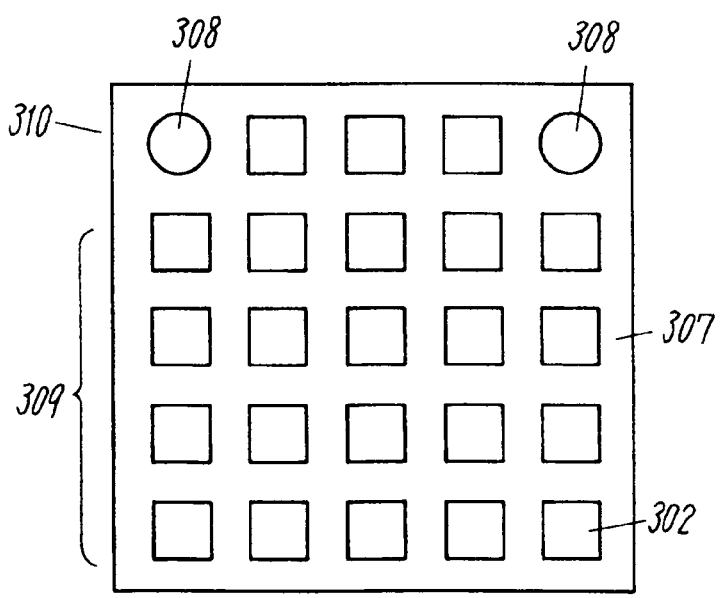
FIG. 51 is a plan view of a laminated circuit board.

Row 347 is an example of inserting case 302 in row 310 of laminated circuit board 307 shown in FIG. 51, and it is not allowed to insert case 302 in a position corresponding to hole 308. Thus, programming the position of hole 334 formed in cylinder 333, it is possible to insert case 302 by operating nozzle main body 327 to a predetermined position. Also, since cylinder 333 can be freely attached or detached and is replaceable, it is possible to readily cope with other design specifications.

Figure 47:
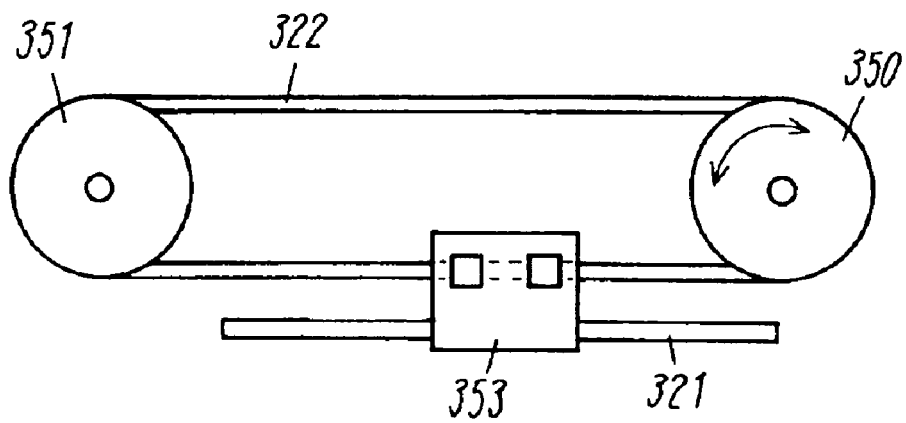
FIG. 47 is a top view of an essential portion of the component inserting unit.

FIG. 47 is a top view for describing the horizontal control of horizontal member 321. Motor 350 is provided with pulley 351. Timing belt 322 is set so as to transmit the rotation of motor 350 to pulley 351. Also, timing belt 322 and horizontal member 321 are secured by harnessing section 353. Accordingly, motor 350 is controlled to move horizontal member 321 in the horizontal direction, and the nozzle comprising nozzle block 325 and nozzle main body 327 can be horizontally moved. That is, it is possible to freely control in the horizontal direction.

Figure 48:
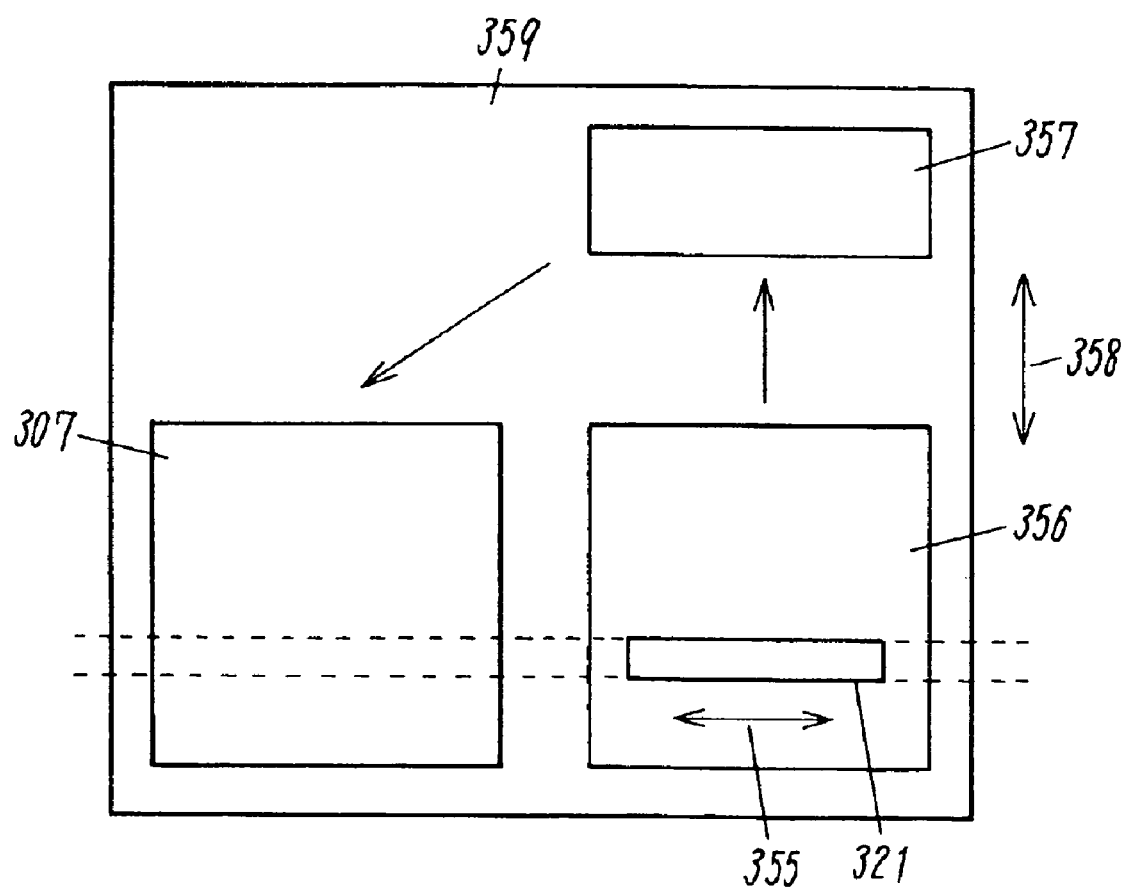
FIG. 48 is a top view of a component inserting unit including related components.

FIG. 48 is a plan view of a component inserting unit including related components. In FIG. 48, horizontal member 321 is a part of the component inserting unit, and is controlled to move in the horizontal direction, X direction 355. Feed section 356 serves to feed case 302. Case positioning section 357 and laminated circuit board 307 are disposed on table 359. Table 359 also moves horizontally, and can be controlled to move in Y direction 358, perpendicular to the moving direction of horizontal member 321.

In component insertion, case 302 is first attracted to nozzle main body 327 fitted to horizontal member 321, and the attracting position of case 302 on nozzle main body 327 is properly adjusted by case positioning section 357 within the allowable range of accuracy. This is intended to insert case 302 in the predetermined position of laminated circuit board 307. And, in this condition, the nozzle is moved onto laminated circuit board 307, and case 302 is inserted into laminated circuit board 307. The nozzle movement can be realized through control in X direction 355 by horizontal member 321 and movement in Y direction 358 by table 359.

Preferred Embodiment 14

Figure 49:
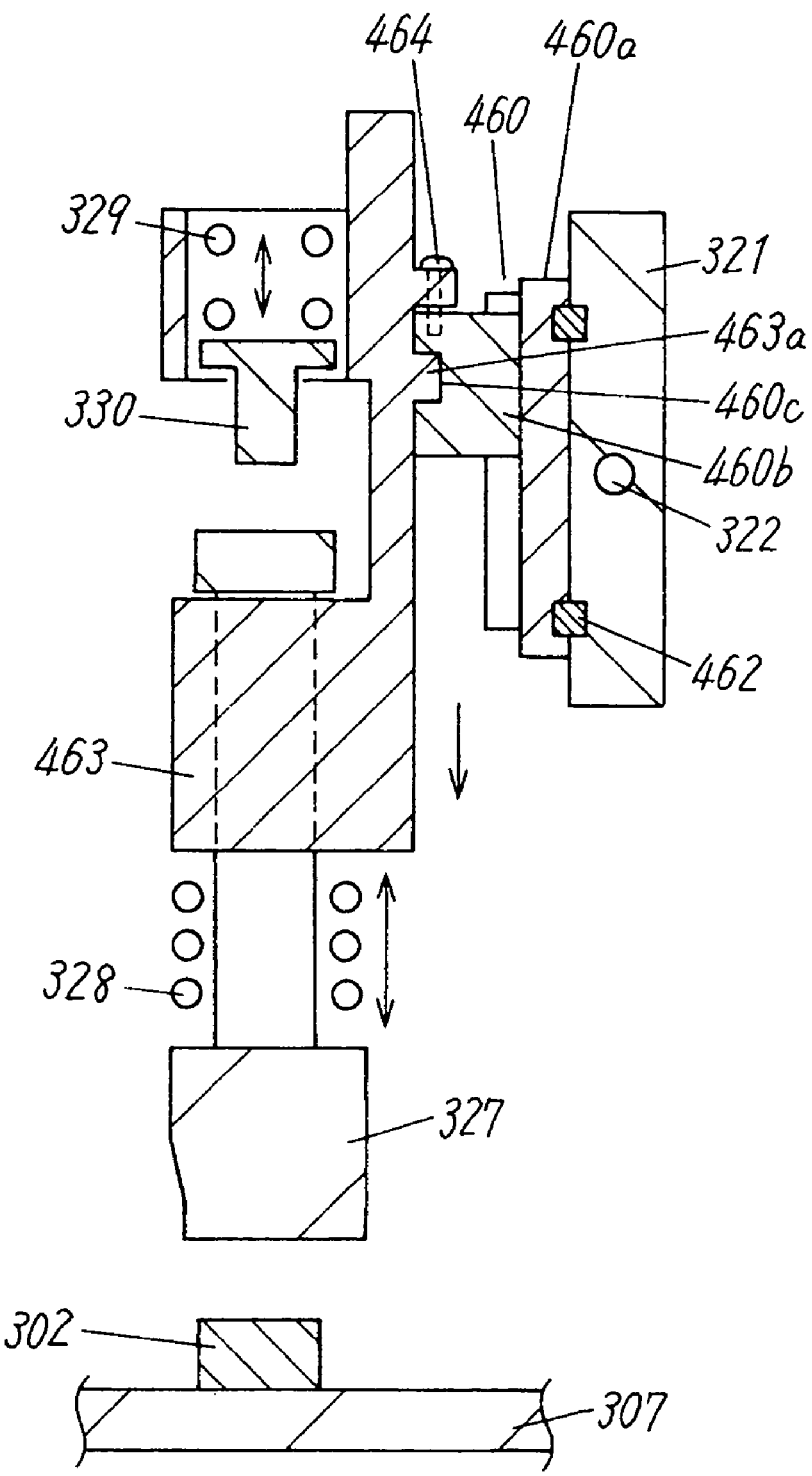
FIG. 49 is a sectional view of an essential portion of a component inserting unit in the preferred embodiment 14 of the present invention.

FIG. 49 is a sectional view of a component inserting unit in the preferred embodiment 14. This is the second example comprising cover setting device 35 (see FIG. 35) described in the preferred embodiment 10. In FIG. 49, those same as in the preferred embodiment 13 are given same reference numerals, and the description is simplified.

One side 460a of slide portion 460 is fixed on horizontal member 321 by means of fixing member 462. Also, the other side 460b of slide portion 460 is slidably connected to nozzle block 463. That is, depression 460c formed at the other side 460b slidably engages projection 463a formed at nozzle block 463. Also, reference numeral 464 is a screw, which secures the positions of the other side 460b and nozzle block 463.

That is, due to this structure, nozzle block 463 can be fixed after moving it to a proper position of the other side 460b of slide portion 460. In this way, case 302 can be inserted with a predetermined pitch on laminated circuit board 307. Moreover, one row can be simultaneously inserted.

Figure 50:
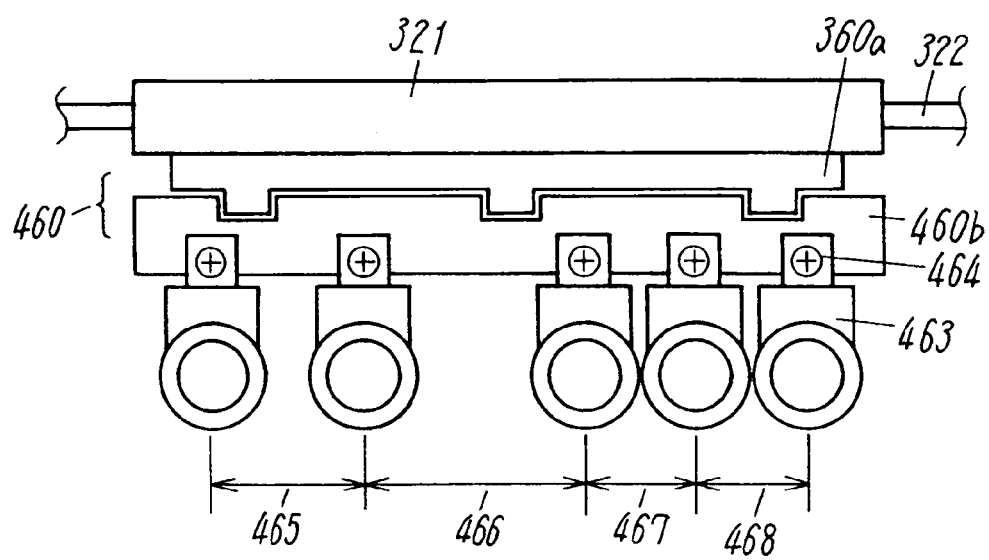
FIG. 50 is a top view of an essential portion of the component inserting unit.

FIG. 50 is a top view of a component inserting unit in the preferred embodiment 14. Nozzle block 463 slidably disposed at the other side 460b of slide portion 460 is fixed to the other side 460b with screw 464. Accordingly, pitches 465, 466, 467 and 468 between nozzle blocks 463 can be set to predetermined pitches.

Preferred Embodiment 15

Figure 52:
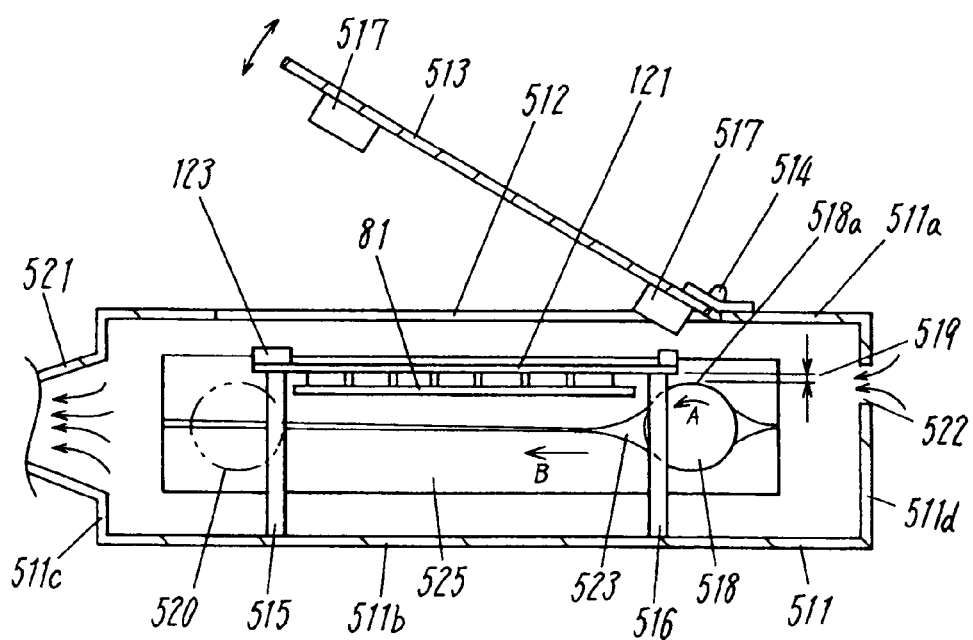
FIG. 52 is a sectional view of an essential portion of a divider in the preferred embodiment 15 of the present invention.

The preferred embodiment 15 will be described with reference to the drawings. This corresponds to dividing device 37 described in the preferred embodiment 10. FIG. 52 is a sectional view of a dividing device in the preferred embodiment 15.

Top 511a of box 511 made of metal is provided with hole 512, and cover 513 to close hole 512 is movably connected to top 511a by means of hinge 514.

Here, the size of hole 512 is larger than that of pallet 123, and with cover 513 opened, it is stored in case 511 with main substrate 81 down. In this case, box 511 is provided with reference pins 515 at two portions, and the reference pins 515 engage reference hole 127 and reference hole 128 provided at one side 123a of outer frame 122 of pallet 123, shown in FIG. 64 later, for the purpose of positioning. Holder 516 serves to hold the other side 123b of pallet 123 (see FIG. 64), keeping pallet 123 in horizontal position.

Holding portion 517 is fixed by spring on cover 513. Holding portion 517 pushes the top of pallet 123 in such a state that cover 513 is closed. Thus, pallet 123 is precisely positioned and held during the dividing operation, thereby improving the dividing accuracy.

The blade of dicing cutter 518 is about 0.3 mm thick. There is provided clearance 519 between top end 518a of dicing cutter 518 and adhesive sheet 121. And, dicing cutter 518 is rotated and moved in B direction up to position 520 to complete cutting of one row.

In the preferred embodiment 15, dicing cutter 518 is rotated in A direction (counterclockwise) so that chips will fall downward. In this way, chips fall onto bottom 511b of box 511. Therefore, duct 521 is connected to rear 511c of the box to forcibly such up chips through duct 521. And, hole 522 is also provided at the front 511d of box 511 so that the air current due to the suction flows from front 511d to rear 511c of box 511. Further, there is provided rubber 525 so as to cover hole 523 in order to control the inflow or outflow of air from hole 523 that becomes necessary for the movement of dicing cutter 518.

In the above configuration, main substrate 81 is cut off as it is connected by sheet 121. Main substrate 81 corresponds to medium main substrate 1151 with electronic component mounted therein shown in FIG. 31.

In the preferred embodiment 15, the rotating direction of dicing cutter 518 is A direction (counterclockwise), but it is preferable to be the opposite direction or clockwise. In that case, since burr caused due to dividing main substrate 81 is upward, there is no generation of floating or the like when VCO is mounted onto main substrate 81, and a problem of failure of soldering the electrode of VCO to main substrate 81 will be solved.

Preferred Embodiment 16

Figure 54:
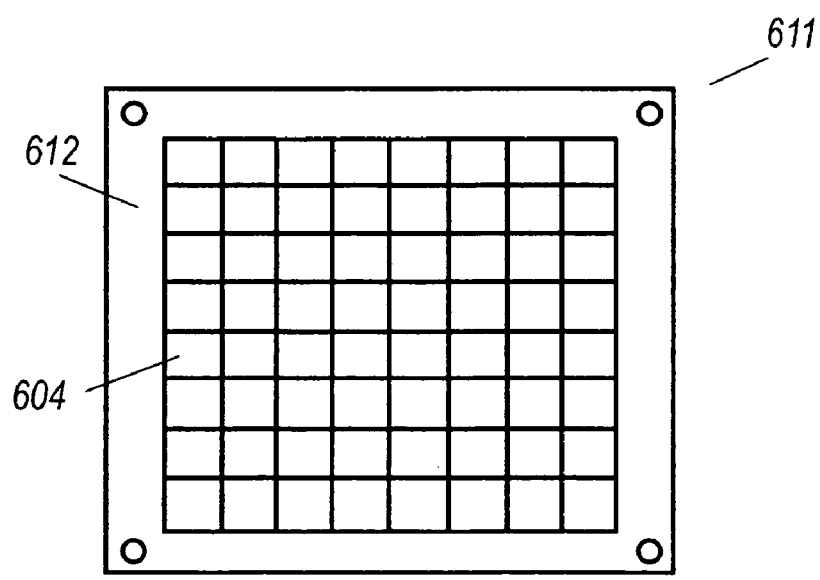
FIG. 54 is a plan view of a sheet-like part.

FIG. 54 is a plan view of sheet-like part 611. Sheet-like part 611 corresponds to medium main substrate 1151 with electronic component mounted therein shown in FIG. 31. As to sheet-like part 611, components 604 are disposed in in-line arrangement on laminated circuit board 612. In sheet-like part 611, for example, there are 8 horizontal rows and 8 vertical lines, including 64 components 604 in total. Also, in sheet-like part 611, electronic components are mounted in a sheet form. After that, it is covered with a metallic shield case. And, adhesive sheet 603 is affixed to the shield case. With adhesive sheet 603 affixed thereto, it is cut off and inspected to be completed as sheet-like part 611. In the preferred embodiment 16, as component 604, it is preferable to be VCO shown in FIG. 36A, FIG. 36B and FIG. 37, that is, a voltage controlled type oscillator.

Figure 53:
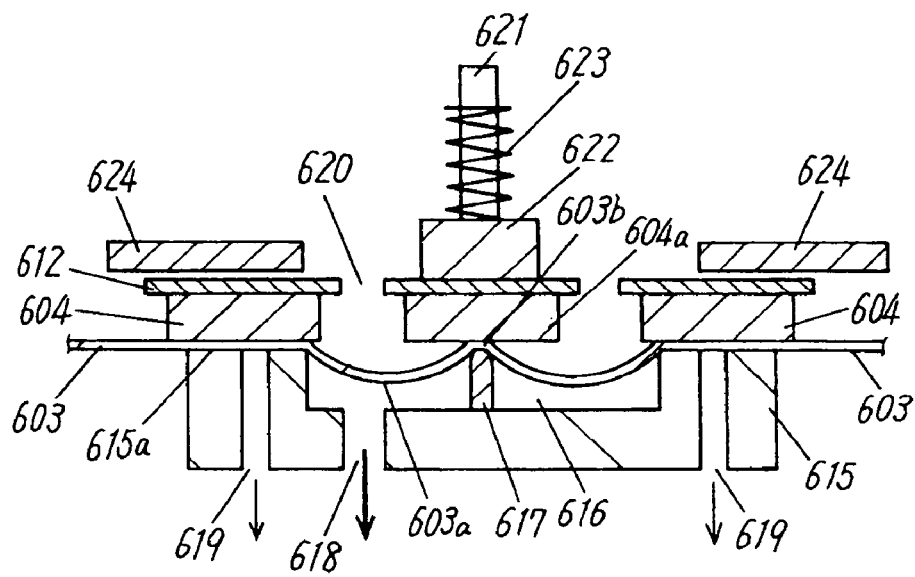
FIG. 53 is a sectional view of a sheet peeling device in the preferred embodiment 16 of the present invention.

Next, sheet peeling device 39 described in the preferred embodiment 10 will be described in the following. FIG. 53 is a sectional view of a sheet peeling device 39 for peeling component 604 sticking to adhesive sheet 603 from sheet-like part 611. In FIG. 53, peeling block 615 is, for example, made of aluminum. Depression 616 is formed facing downward from top 615a of peeling block 615. And, pin 617 is disposed nearly at the center of depression 616. Also, air hole 618 is provided at the bottom of depression 616. Air hole 618 is connected to vacuum pump (not shown). Suction hole 619 is provided adjacent to depression 616, and communicated from top 615a to the bottom of peeling block 615. Also, suction hole 619 is connected to the vacuum pump. Both of air hole 618 and suction hole 619 are air vent holes, and one vacuum pump (not shown) can be used for both of them.

And, sheet-like part 611 is placed on top 615a of peeling block 615 with sheet 693 down. In this case, pin 617 is disposed so that it touches nearly the center of component 604 to be peeled. Component 604 is mounted on laminated circuit board 612. In this condition, laminated circuit board 612 is separated every component 604 at cutting portion 620. Laminated circuit board 612 corresponds to medium main substrate 1151 with component mounted therein shown in FIG. 31.

Nozzle 621 is vertically movable and serves to execute vacuum-attraction of component 604 (such as VCO). Attracting pad 622 formed from rubber is fitted to the end of nozzle 621, and the attracting pad 622 abuts the laminated circuit board 612 side of component 604. Attracting pad 622 has a function of keeping component 604 in horizontal position and uniformly pressing component 604a. Spring 623 is a spring used as an example of elastic material. Spring 623 pushes nozzle 621 toward component 604 with a constant force and prevents excessive stresses from being applied to component 604a.

Guide 624 is a guide disposed above the component 604 adjacent to component 604a which abuts pin 617. Guide 624 serves to prevent unnecessary movement of component 604 and is disposed along component 604. And, it is provided with some clearance.

In sheet peeling device 39 configured as described above, sheet-like part 611 is placed on top 615a of peeling block 615 with adhesive sheet 603 down. In this case, it has to be placed nearly at the center of component 604a to be peeled by pin 617. And, guide 624 is lowered along component 604, then the position of component 604 is horizontally stabilized. In this case, adhesive sheet 603 is attracted by suction hole 619, inhibiting the movement of adhesive sheet 603. When component 604 is small, it is preferable not to use suction hole 619.

Here, nozzle 621 is lowered, and component 604a is held between attracting pad 622 and pin 617. And, air is removed from air vent hole 618 by means of a vacuum pump. Then, a vacuum is created in depression 616, and adhesive sheet 603 is flexed by the vacuum force to turn into curvature 603a. In this way, component 604a is peeled from adhesive sheet 603, and component 604a and adhesive sheet 603 comes in contact with each other at one point 603b on pin 617.

Thus, since the contact is made at one point 603b, the adhesion becomes lessened, and component 604a can be easily removed from adhesive sheet 603 with slight suction force of nozzle 621. Accordingly, the stress applied to component 604a is lowered, and component 604a will not be damaged.

In the above example, the area of component 604a is about 13 mm², requiring a suction force of 130 grams, and sticking it at one point 603b enables its peeling with a force of 20 grams that is nearly one sixth of same.

Figure 55:
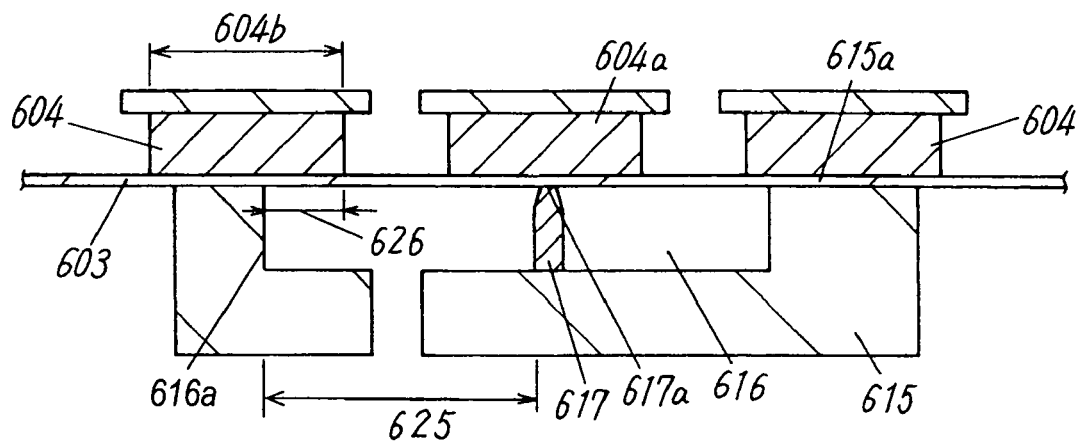
FIG. 55 is a sectional view of a peeling block forming the sheet peeling device and the vicinity thereof.

FIG. 55 is a sectional view of an essential portion of a sheet peeling device. In FIG. 55, when depression 616 is larger, curvature 603a of adhesive sheet 603 is greater, making easier to peel. Also, in the preferred embodiment 16, wall 616a is arranged inward by distance 626, one second to one third of dimension 604b of component 604, toward the inside from the end of component 604 adjacent to component 604a. Consequently, the distance between component 604 and component 604a is decreased, increasing the density of mounting component 604 onto substrate 612, and while keeping the horizontal position of component 604, it is possible to obtain sufficient flexure or curvature 603a.

In the preferred embodiment 16, the length of one side of component 604, 604a is 3.4 mm, the distance between component 604 and component 604a is 0.5 mm, and distance 625 between pin 617 and wall 616a of depression 616 is 3.9 mm.

Also, tip 617a of pin 617 is better to be a little lower than top 615a of peeling block 615. This is effective to reduce the stress applied to component 604a.

Figure 56:
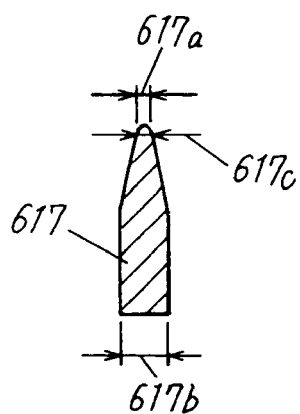
FIG. 56 is a sectional view of a pin provided in the peeling device.

FIG. 56 is a sectional view of pin 617. Tip 617a of pin 617 is semi-circular. Diameter 617c of the semi-circle is desirable to range from 0.6 mm to 1.2 mm. Setting the dimension in this range, it is possible to obtain a sufficient amount of flexure or curvature 603a without breaking adhesive sheet 603. Dimension 617b at the bottom of pin 617 is 1.5 mm.

Also, since tip 617a is semi-circular, adhesive sheet 603 is easily flexed along the semi-circle.

Figure 57A:
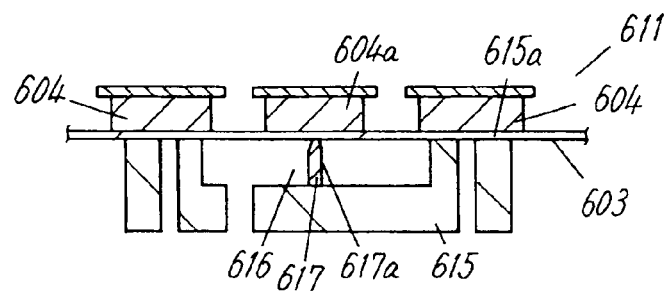
FIG. 57A is a view of the first status showing the sheet peeling step using a sheet peeling device.

FIG. 57A to FIG. 57D show a sheet peeling method using a sheet peeling device of the present invention. FIG. 57A is a step of placing sheet-like part 611 on top 615a of peeling block 615. In this step, sheet-like part 611 is placed with adhesive sheet 603 down so that the center of component 604a to be peeled is positioned at tip 617a of pin 617.

Figure 57B:
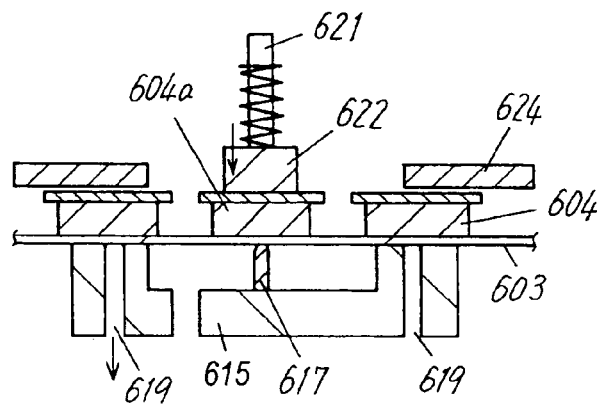
FIG. 57B is a view of the second status showing the sheet peeling step using a sheet peeling device.

Next, as shown in FIG. 57B, adhesive sheet 603 is sucked up by suction hole 619 and fixed to peeling block 615. And, guide 624 is lowered to maintain the horizontal position of component 604. Subsequently, nozzle 621 is lowered, and component 604a is held between attracting pad 622 disposed at the end of nozzle 621 and pin 617. In this way, the position of component 604a is stabilized.

Figure 57C:
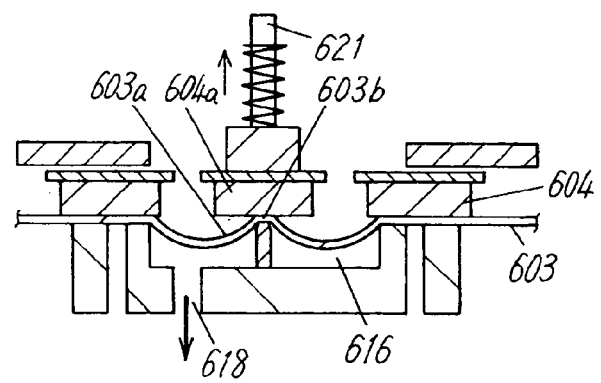
FIG. 57C is a view of the third status showing the sheet peeling step using a sheet peeling device.

Next, as shown in FIG. 57C, air in depression 616 is released from air vent hole 618. Then, adhesive sheet 603 is attracted and flexed to form curvature 603a. That is, in this condition, component 604a is sticking to adhesive sheet 603 at one point 603b. Accordingly, by moving nozzle 621 upward in this condition, it is possible to smoothly peel component 604a off from adhesive sheet 603.

Figure 57D:
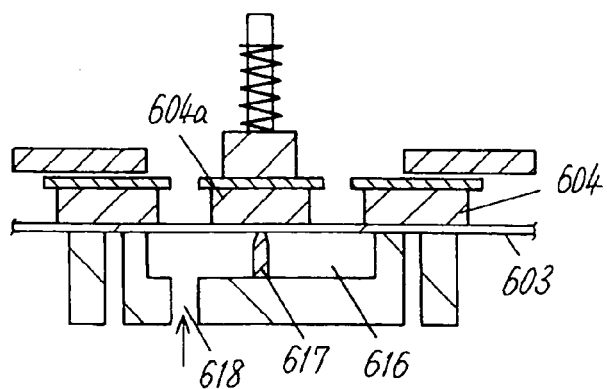
FIG. 57D is a view of the fourth status showing the sheet peeling step using a sheet peeling device.

As shown in FIG. 57D, air is applied from air vent hole 618 in this condition to make the pressure in depression 616 nearly equal to the outside pressure. Then, adhesive sheet 603 returns to the original position, and component 604a is also able to restore its original state of a sheet. This is, for example, effective when component 604a is defective, and it is possible to perform its repair or inspection in the form of sheet-like part 611.

Preferred Embodiment 17

Figure 58:
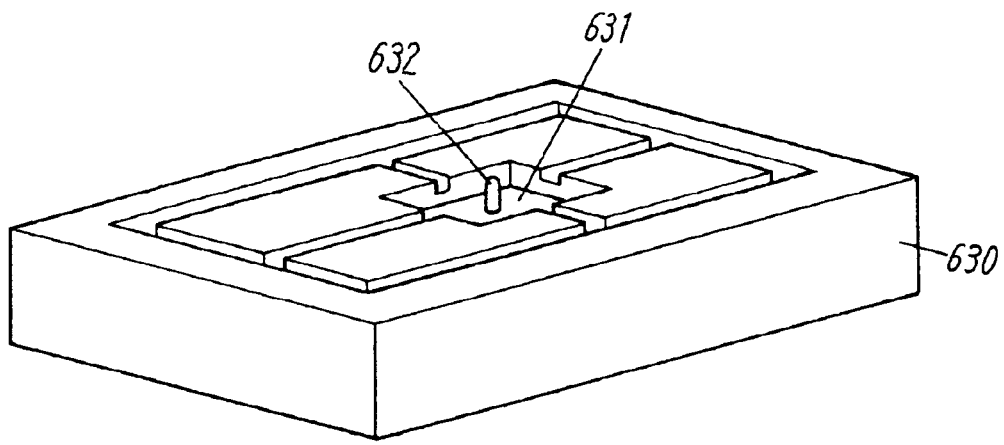
FIG. 58 is a perspective view of a peeling block of a sheet peeling device in the preferred embodiment 17.

FIG. 58 is a perspective view of peeling block 630 of sheet peeling device 39 in the preferred embodiment 17. In peeling block 630, there is one depression 631 which is capable of independently removing one component. Pin 632 is disposed nearly at the center of depression 631. The other operations are same as in the preferred embodiment 16, and the description is omitted.

Preferred Embodiment 18

Figure 59:
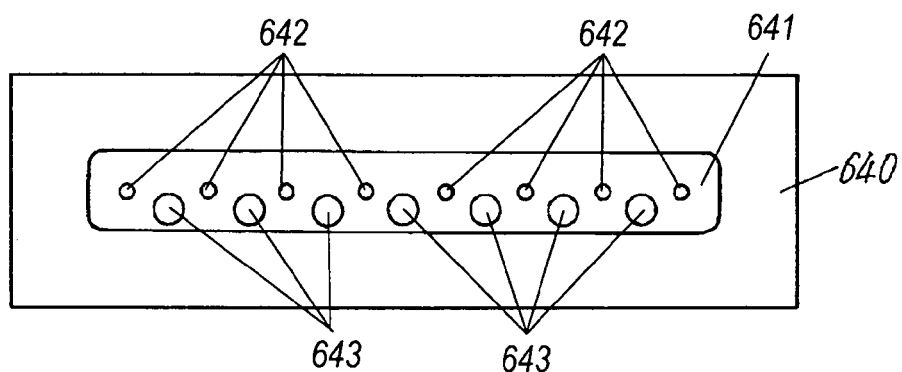
FIG. 59 is a plan view of a peeling block of a sheet peeling device in the preferred embodiment 18.

FIG. 59 is a plan view of peeling block 640 of a sheet peeling device in the preferred embodiment 18. Peeling block 640 serves to remove one row of components 604 of sheet-like part 611 all together. In the preferred embodiment 18, for example, eight components 604 can be removed at the same time. Depression 641 is provided with pin 642 nearly at the center of each component 604. Also, in depression 641, air hole 643 is provided between pin 642 and adjacent pin 642.

In the preferred embodiment 18, since one row of components 604 can be removed together, the working efficiency will be improved. The other configurations and operations are same as in the preferred embodiment 16, and the detailed description is omitted.

Preferred Embodiment 19

Figure 60:
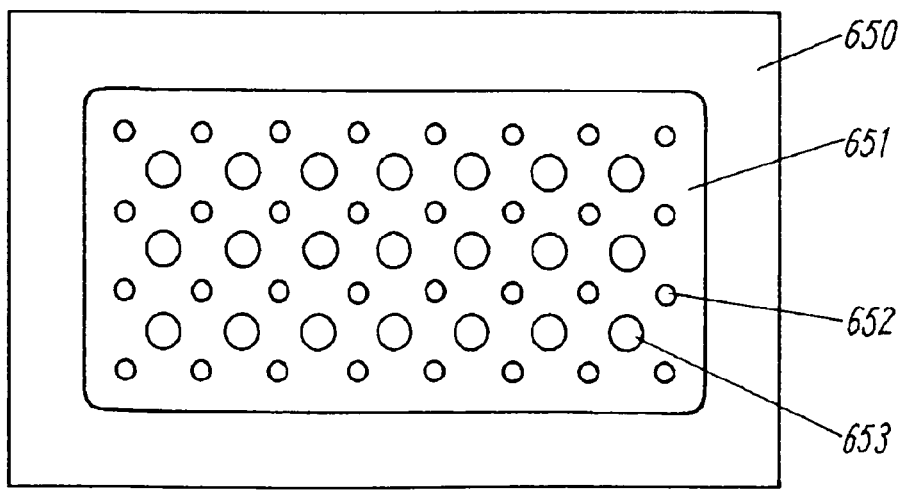
FIG. 60 is a plan view of a peeling block of a sheet peeling device in the preferred embodiment 19.

FIG. 60 is a plan view of peeling block 650 of a sheet peeling device in the preferred embodiment 19. Peeling block 650 serves to remove one row of components 604 of sheet-like part 611 for example by four lines together. In the preferred embodiment 19, for example, one row of eight components and four lines can be removed at the same time. That is, it shows an example that components 604, 32 pieces (8×4) in total, can be removed simultaneously. Depression 651 is provided with pin 652 nearly at the center of component 604. Also, there is provided air vent hole 653.

In the preferred embodiment 19, since one row of components 604 can be removed together, the working efficiency will be improved. The other configurations and operations are same as in the preferred embodiment 16, and the detailed description is omitted.

Preferred Embodiment 20

Figure 61:
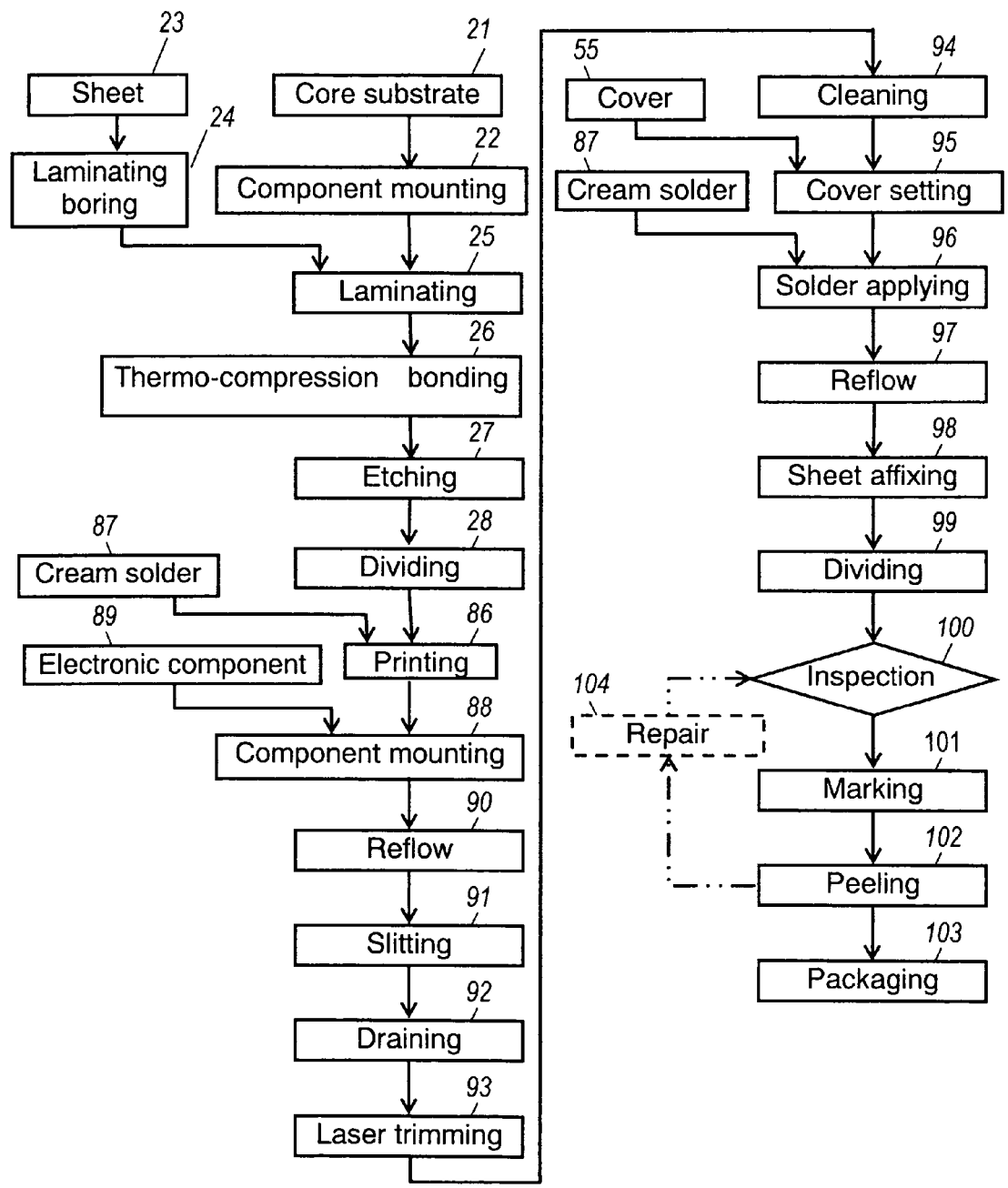
FIG. 61 is a module manufacturing process chart in the preferred embodiment 20 of the present invention.

In the preferred embodiment 20, a module manufacturing method will be described in the following with reference to the drawings. FIG. 61 shows a manufacturing process chart for the method of manufacturing VCO (voltage controlled oscillator) as an example of module of the preferred embodiment 20. Here, VCO is preferable to be VCO51 shown in FIG. 36A, FIG. 36B and FIG. 37. Also, VCO is preferable to be component 604 shown in FIG. 54 and FIG. 55. Incidentally, VCO itself is not shown in FIG. 61.

In FIG. 61, core substrate 21 corresponds to resin substrate 1001 in the preferred embodiment 1. Built-in components are mounted in core substrate 21 in component mounting process 22. The mounting process is executed by built-in component mounting device 31 shown in FIG. 35.

Non-hardened thermosetting sheet 23 corresponds to first sheet 1011 described in the preferred embodiment 1. Sheet 23 is provided with holes for built-in components and laminated in laminating and boring process 24. The laminating and boring process 24 is executed by laminating and boring device 32 shown in FIG. 35.

And, the bored sheet and core substrate 21 with components mounted therein are laminated in laminating process 25. Subsequently, they are thermally compressed in thermo-compression bonding process 26 to turn into a laminated circuit board. The laminated circuit board corresponds to, for example, large main substrate 1150 shown in FIG. 30. The thermo-compression bonding conditions are nearly same as the thermo-compression bonding conditions of the preferred embodiment 1. That is, the thermo-compression bonding temperature is 180° C. to 200° C., the pressure is 30 kg/cm$^2$, and the compression bonding time is set to about one hour. The thermo-compression bonding process 26 is executed by thermo-compression bonding device 33 shown in FIG. 35.

Next, in etching process 27, copper foil 1205 of large main substrate 1150 is etched to form a pattern. And, after that, in dividing process 28, large main substrate 1150 is divided into medium main substrates 1151 (see FIG. 31).

Figure 62:
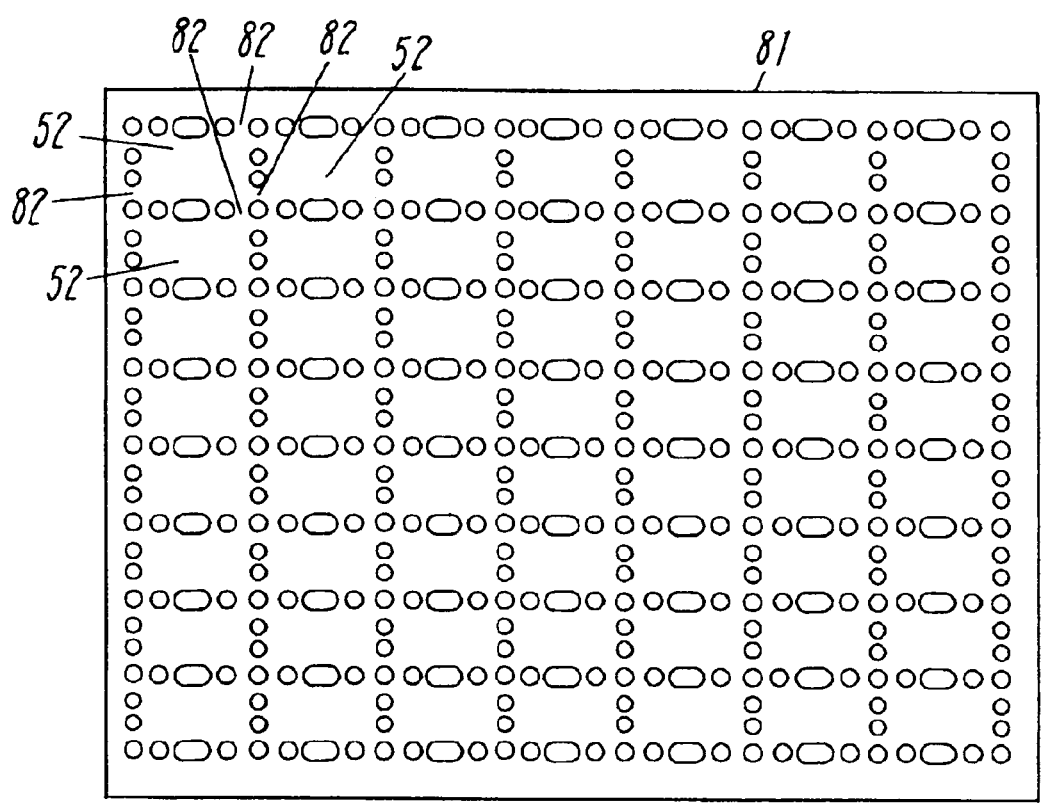
FIG. 62 is a plan view of main substrate.

FIG. 62 is a front view of a main substrate in the preferred embodiment 20. As to the main substrate, medium main substrate 1151 shown in FIG. 31 is provided with holes. In FIG. 61 and FIG. 62, main substrate 81 is a main substrate with sub-substrates 52 (sub-substrate 1152 in FIG. 31) connected to each other by a plurality of connections 82, and each of the length (width) and width (length) of main substrate 81 has outside dimensions of 91 mm×94 mm for example, in which 168 pieces of sub-substrates 52 measuring 6.5 mm×5.3 mm are formed in a state of being connected to each other. All of sub-substrates 52 are formed by same pattern wiring.

Printing process 86 serves to print cream solder 87 on main substrate 81. In printing process 86, for example, a screen made of stainless steel of 70 µm thick is placed on main substrate 81, and cream solder 87 is printed on main substrate 81 by means of a squeegee. Cream solder 87 used is lead-free solder of tin-, silver- or copper-based.

Component mounting process 88 is located in the downstream from printing process 86, and serves to mount electronic component 89 on main substrate 81. The component mounting process 88 is executed by component mounting device 34 shown in FIG. 35.

In component mounting process 88, capacitors 63, 64, 68 and variable capacitance diode 65 and transistors 67, 69 (see FIG. 37) are mounted to sub-substrate 52 by means of a general component mounting machine.

Reflow process 90 is located in the downstream from electronic component mounting process 88. In reflow process 90, main substrate 81 is heated at about 230° C., the ambient temperature of a reflow oven, and electronic component 89 is bonded by cream solder 87 onto main substrate 81.

Figure 63A:
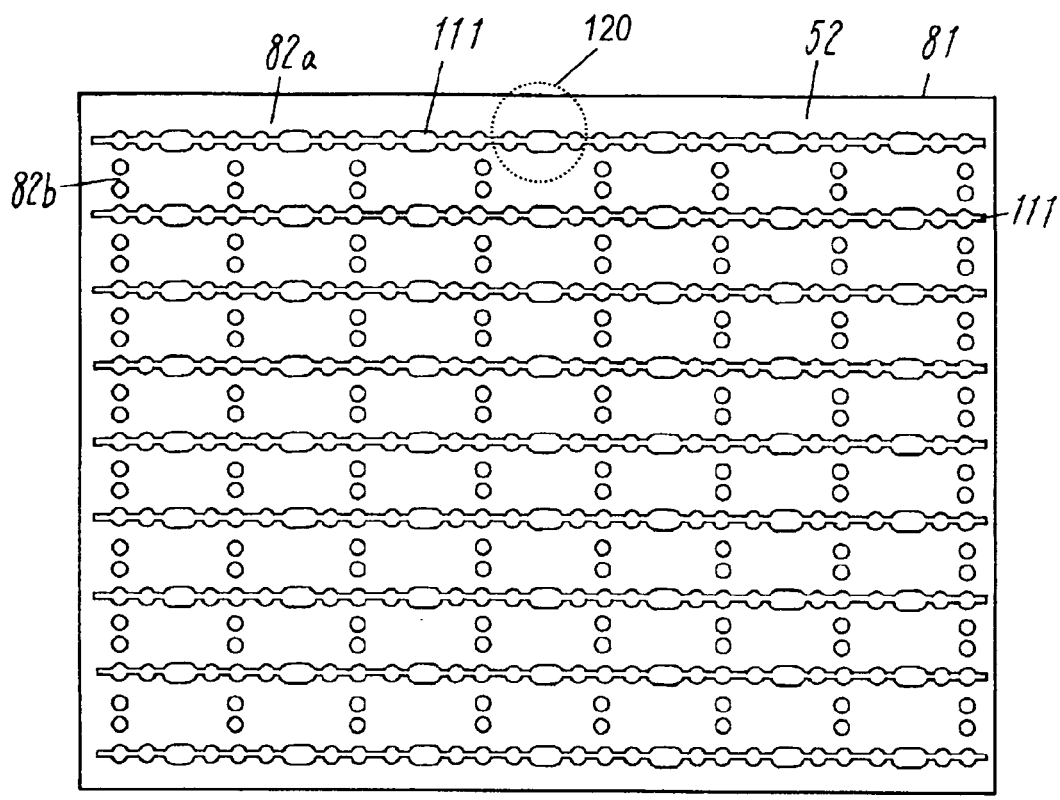
FIG. 63A is a top view of main substrate in the slit machining step.
Figure 63B:
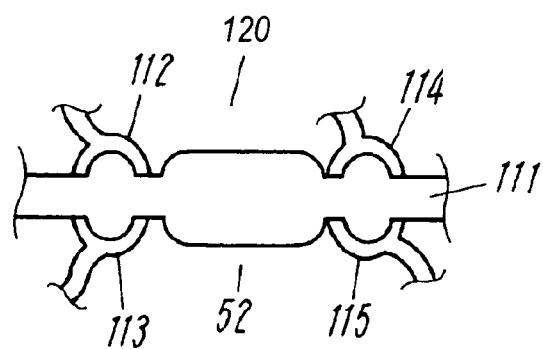
FIG. 63B is an enlarged view of an essential portion of main substrate in the slit machining step.

Slitting process 91 is located in the downstream from reflow process 90. FIG. 63A shows a plan view of main substrate 81 in the slitting process 91. FIG. 63B is an enlarged view of an essential portion shown by reference numeral 120 of main substrate 81. As shown in FIG. 63A, FIG. 63B, in the slitting process 91, slit 111 is formed by dicing at one side 82a of sub-substrate 52. Thus, as shown in FIG. 63B, adjacent electrode signal terminals 112, 113 and signal terminals 114, 115 of sub-substrate 52 are electrically and mechanically separated from each other.

In this way, since sub-substrates 52 are electrically isolated from each other in a state that sub-substrate 52 is connected by connection 82b to main substrate 81, independent signal can be applied to each of signal terminals 112, 113, 114 and 115. Accordingly, the inspection can be executed for example by individually operating VCO formed on each sub-substrate 52.

In VCO in the preferred embodiment 20, it is preferable to make frequency adjustment by laser trimming described later. Therefore, there is provided slitting process 91 so that VCO can be individually operated in the adjusting process. However, in the case of a module for which a frequency adjusting process such laser trimming is not needed, it is preferable not to provide the slitting process 91. In slitting process 91, slit 111 is formed while applying water to it. And in slitting process 91, water is removed from main substrate 81 provided with slit 111 in draining process 92.

Laser trimming process 93 is located in the downstream from draining process 92. In this process, a laser beam is applied to pattern inductor 62 on each sub-substrate 52 for the purpose of trimming. Since sub-substrates 52 are previously electrically isolated from each other in slitting process 91, each VCO can be individually operated in laser trimming process 93. Therefore, power is supplied to sub-substrate 52 to operate VCO, and trimming of pattern inductor 62 is executed while detecting the frequency of output signal from the VCO in order to adjust the inductance value. Thus, the frequency of resonance circuit 61 is varied, and the output frequency of VCO can be adjusted to the predetermined frequency.

Cleaning process 94 is located in the downstream from laser trimming process 93. Chips generated during laser trimming can be removed in cleaning process 94.

Cover setting process 95 is located in the downstream from cleaning process 94. Cover setting process 95 is executed by cover setting device 35 (see FIG. 35). In cover setting process 95, leg 56 of cover 55 is inserted into through-hole 57 of sub-substrate 52 (see FIG. 36A).

Solder applying process 96 is located in the downstream from cover setting process 95. In solder applying process 96, main substrate 81 is disposed with cover 55 side down, and lead-free cream solder 87 of tin-, silver- or copper-based is supplied through a screen. In solder applying process 96, it is disposed with cover 55 down. Accordingly, the dimension between legs 56 disposed opposite to cover 55 is for example about 0.1 mm less than the dimension of sub-substrate 52, and leg 56 of cover 55 is press-fitted into sub-substrate 52, thereby preventing cover 55 from falling off.

Reflow process 97 is located in the downstream from solder applying process 96. In reflow process 97, solder applied in the preceding process, solder applying process 96, is melted, and cover 55 is soldered to sub-substrate 52. In this way, leg 56 of cover 55 is bonded to the side surface of sub-substrate 52.

Sheet affixing process 98 is located in the downstream from reflow process 97, which is a sheet affixing process for affixing an adhesive sheet. Sheet affixing process 98 is executed by sheet affixing device 36 shown in FIG. 35.

Figure 64:
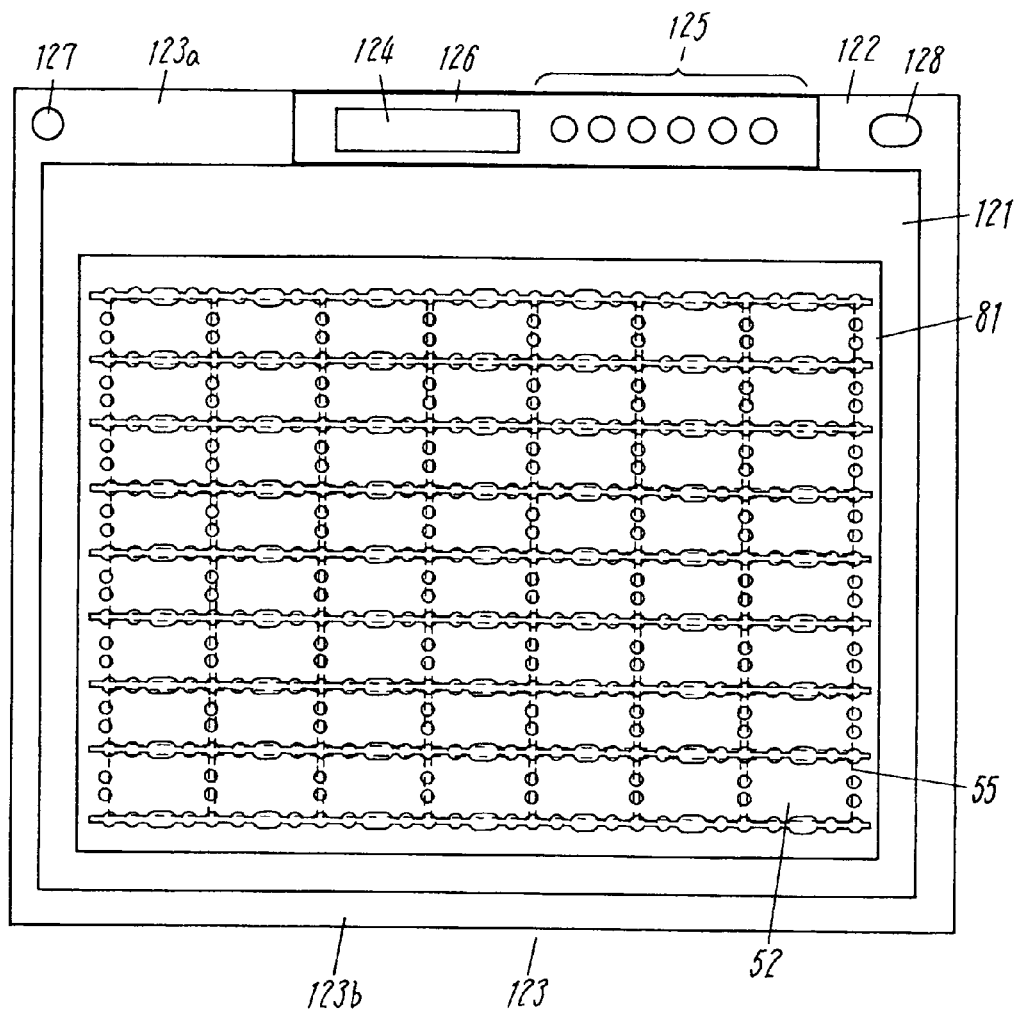
FIG. 64 is a top view of a pallet including a laminated circuit board in the sheet affixing step.
Figure 65:
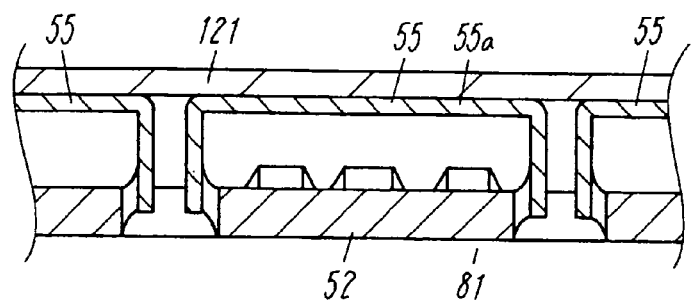
FIG. 65 is a sectional view of an essential portion of a laminated circuit board in the sheet affixing step.

FIG. 64 shows a state of main substrate 81 affixed onto an adhesive sheet in the preferred embodiment 20. FIG. 65 is an enlarged sectional view of an essential portion of VCO 51 shown in FIG. 36A as viewed from side. In FIG. 64, FIG. 65, adhesive sheet 121 is polyamide film with one side coated with adhesive. And, upper surface 55a of cover 55 is affixed in the predetermined position of pallet 123 with adhesive sheet 121 previously affixed to outer frame 122 made of metal.

Here, pallet 123 is provided with memory 124 as an example of recording medium, and connecting terminal 125 connected to memory 124. Connecting terminal 125 is copper foil formed on laminated circuit board 126. Memory 124 is mounted on laminated circuit board 126. And, laminated circuit board 126 with memory 124 mounted thereon is fitted to outer frame 122.

In this configuration, various data from connecting terminal 125 are written into memory 124, and information of for example VCO affixed to the pallet can be stored therein. For example, the frequency distribution of oscillation frequency of VCO and the like can be easily controlled by using the information.

Dividing process 99 is located in the downstream from sheet affixing process 98. Dividing process 99 is executed by dividing device 37 shown in FIG. 35. In dividing process 99, remaining connection 82b which connects sub-substrate 52 to main substrate 81 is cut off. Connection 82b is arranged perpendicular to one side 82a. In this way, each VCO is completely separated from main substrate 81. However, in dividing process 99, it is important to cut off only connection 82b with care not to cut off adhesive sheet 121.

Thus, each VCO stays in the position being connected to main substrate 81 due to adhesive sheet 121, assuring excellent positional accuracy of each VCO. Accordingly, the power supply pin (not shown) for operating VCO in the inspection process 100 described later and the inspection pin (not shown) to which output signal is inputted can be precisely abutted on terminals 112, 113, 114 and terminal 115 shown in FIG. 63B, and thereby, it is possible to prevent generation of faulty inspection and to perform proper inspections.

It is important to realize miniaturization of electronic components used for mobile communication such as portable telephones such as VCO 51 (see FIGS. 36A, 36B and FIG. 37) shown as a specific example of VCO. Also, with further miniaturization of VCO, it is very important to arrange sub-substrates 52 with great accuracy in order to prevent faulty inspections due to faulty abutment of pin in the inspection process 100 described later. Therefore, in the preferred embodiment 20, the dimensional accuracy between sub-substrates 52 in the inspection process 100 is maintained nearly at same level as before dividing in dividing process 99, and it is possible to prevent faulty inspection in the inspection process 100.

Inspection process 100 is located in the downstream from dividing process 99. Inspection process 100 is executed by inspecting device 38 shown in FIG. 35. In the inspection process 100, the electric characteristic of VCO is inspected in particular. Here, the oscillation frequency of VCO is once measured in laser trimming process 93. However, VCO generally varies in oscillation frequency with cover 55 fitted. Accordingly, the oscillation frequency is again inspected in the inspection process 100. And, the inspection result of each VCO in the inspection process 100 is also stored in memory 124.

Pallet 123 in the preferred embodiment 20 has memory 124, and with various manufacturing data and electric characteristics in each process written in memory 124, the data can be used in the inspection process 100 and it is possible to improve the productivity. For example, storing the oscillation frequency value of each VCO in laser trimming process 93 described earlier, it is possible to exclude the inspection with respect to defective adjustment of oscillation frequency in accordance with the data in the inspection process 100. That is, storing the information rejected somewhere in a process before the inspection process 100, re-inspection is not needed for the rejected VCO, and it is possible to shorten the time required for the inspection.

Marking process 101 is located in the downstream from inspection process 100. In marking process 101, the product No. and production lot No. are printed by laser marking on the upper surface of cover 55. The information of accepted or rejected VCO is stored in memory 124. The information is read, and accepted VCO is marked. Thus, since only accepted ones are marked, it is easy to visually check for accepted and rejected VCO.

Peeling process 102 is located in the downstream from marking process 101, which is a step of removing each VCO from pallet 123. And, to remove VCO, the other main surface 52b of sub-substrate 52 is attracted by a nozzle or the like to remove VCO from adhesive sheet 121. Adhesive sheet 121 corresponds to adhesive sheet 603 shown in the preferred embodiment 16. However, by reading the data of inspection results in the inspection process 100 which are stored in memory 124, accepted ones can be easily removed from sheet 121. Peeling process 102 is executed by peeling device 39 shown in FIG. 35.

Also, reading the characteristic data of each VCO such as oscillation frequency stored in memory 124 mounted on pallet 123, it is possible to divide VCO accepted in the inspection process 100 into some groups according to the characteristic data.

When VCO is manually removed from sheet 121 by the operator, accepted ones can be discriminated because they are marked in the marking process 101, and there is no fear of removing rejected ones by mistake, enabling precise removal of accepted ones.

Packaging process 103 is located in the downstream from peeling process 102, which is a step of packaging, taping and the like, completed VCO removed from pallet 123 in peeling process 102.

In this case, even when accepted ones are mixed with rejected ones, it is possible to prevent the occurrence of trouble such as packaging those rejected in the inspection process 100 because rejected ones are not marked.

Repair process 104 is a step of repairing rejected ones not removed from pallet 123 in peeling process 102. In repair process 104, sub-substrate 52 is removed, leaving cover 55 on pallet 123, and electronic component 53 on sub-substrate 52 is replaced. And, in this condition, after checking the oscillation frequency of VCO, it is again fitted and soldered to cover 55 left on pallet 123, and again delivered to the inspection process 100.

In this case, since the information of rejected ones is stored in memory 124, the inspection of repair items can be easily performed by reading the information.

Those rejected in the inspection process 100 which are left on the pallet in peeling process 102 can be re-inspected in the inspection process 100. In that case, changing the inspection standards for inspection process 100, it is possible to easily classify for example according to the electric characteristics without memory 124 in pallet 123. For example, in VCO, it is easy to discriminate those nearly equivalent in oscillation frequency.

As described above, according to the module manufacturing method of the present invention, since dividing process 99 is inserted between sheet affixing process 98 and inspection process 100, each VCO is in a state of being arranged on pallet 123 in the inspection process 100. That is, adjoining VCOs are electrically isolated from each other and independent, but they are mechanically connected to each other by adhesive sheet 121. Accordingly, trouble caused in dividing process 99 can be inspected in the inspection process 100, and it is possible to realize high-quality VCO.

Further, in the inspection process 100, VCO being affixed to pallet 123 is inspected, and therefore, the positional accuracy between the VCOs is excellent. Accordingly, the inspection can be easily executed in the inspection process 100, and it is possible to realize a module manufacturing method that may assure excellent productivity.

Also, since main substrate 81 is in a state of being completely separated and divided electrically and mechanically before execution of inspection process 100, it is not necessary in the manufacturing process of main substrate 81 to form a portion having no copper foil where sub-substrates 52 are separated from each other electrically and mechanically. Accordingly, in the manufacturing process of main substrate 81, such a step of forming a portion having no copper foil is not needed, and it is possible to make main-substrate 81 inexpensive and to realize low-cost VCO.

Preferred Embodiment 21

Figure 66:
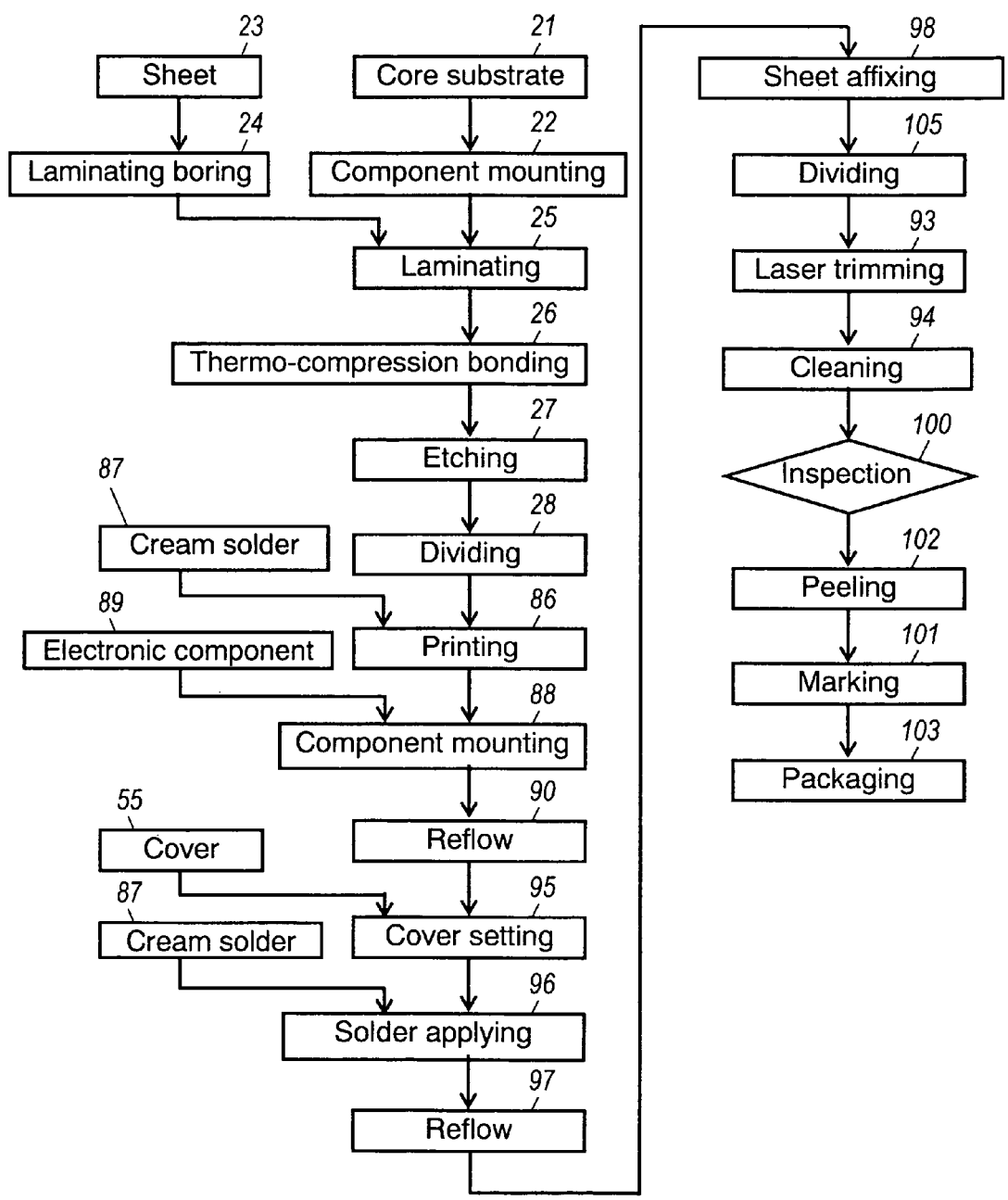
FIG. 66 is a module manufacturing process chart in the preferred embodiment 21 of the present invention.
Figure 67:
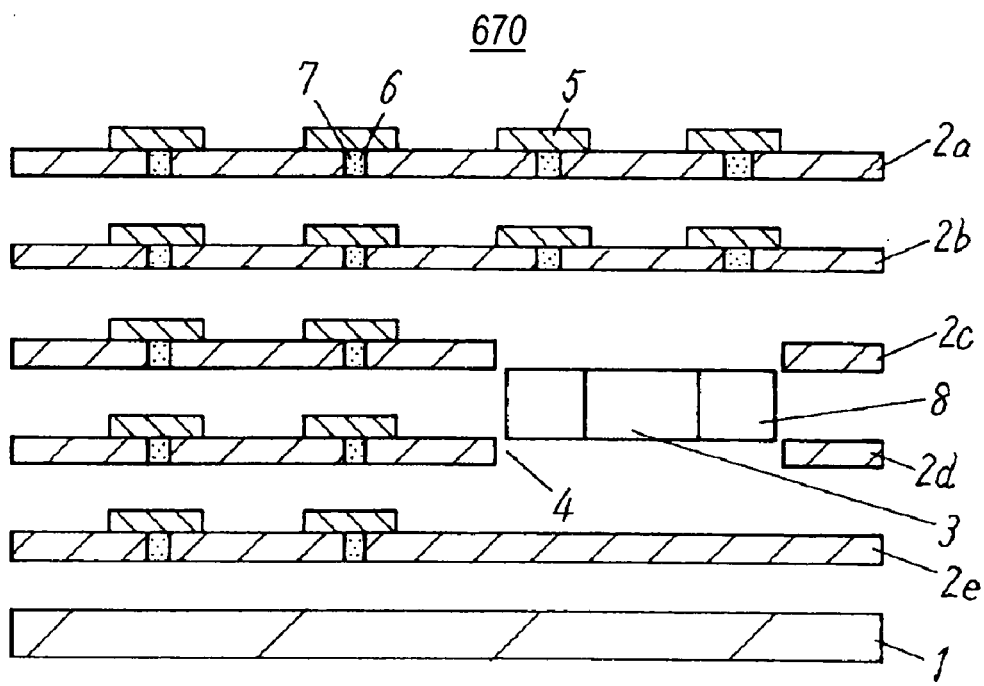
FIG. 67 is a sectional view showing an assembly of a conventional laminated circuit board.
Figure 68:
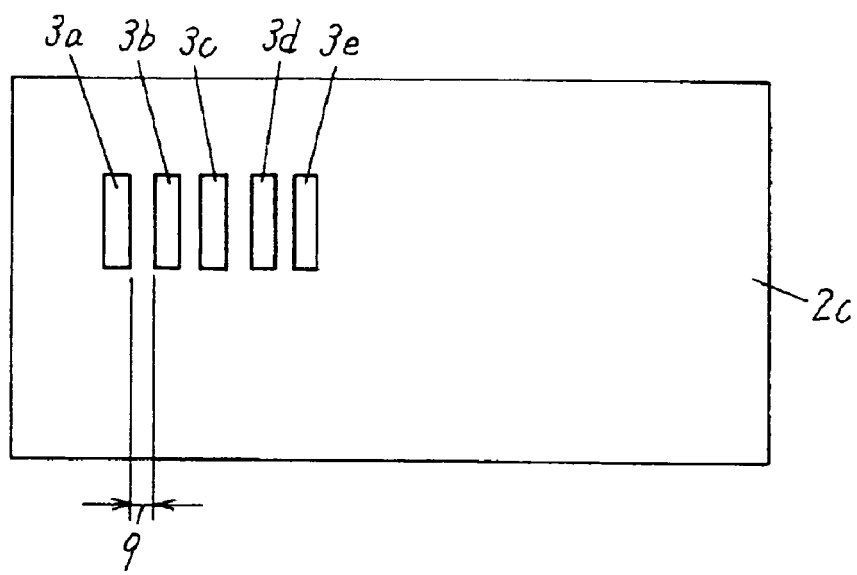
FIG. 68 is a plan view thereof.
Figure 69:
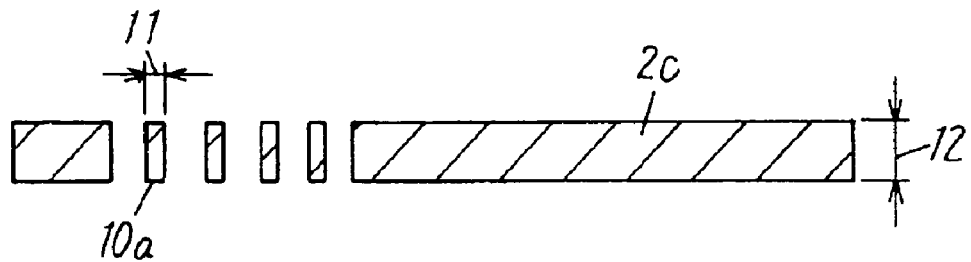
FIG. 69 is a sectional view thereof.
Figure 70:
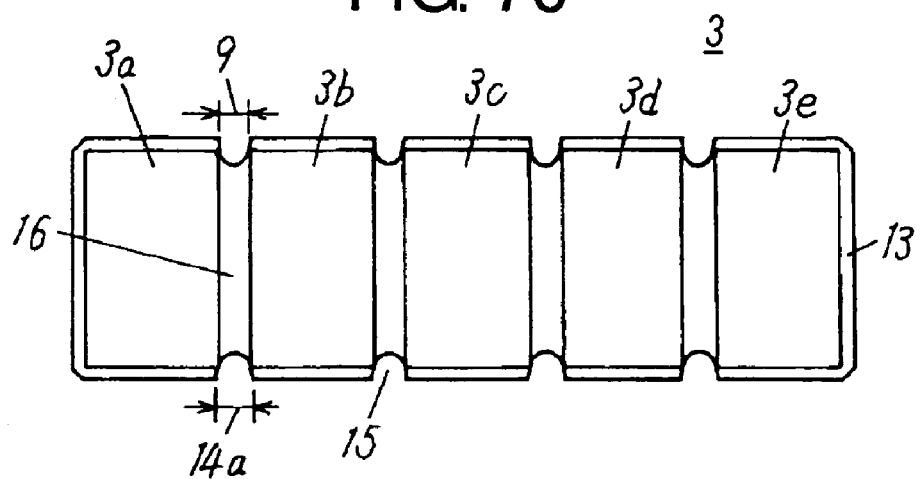
FIG. 70 is a plan view of an essential portion thereof.
Figure 71:
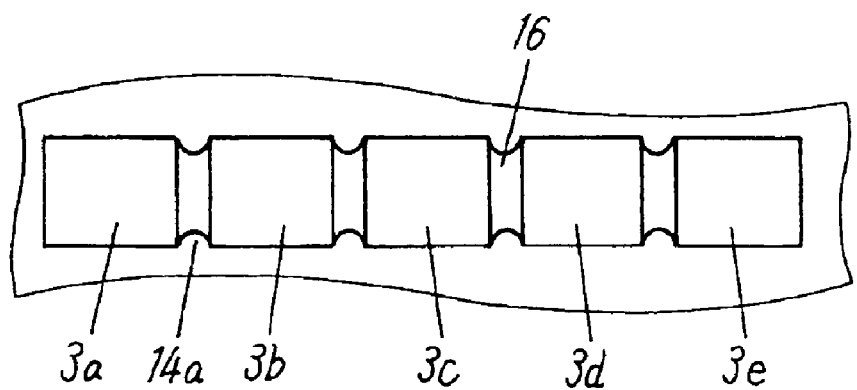
FIG. 71 is a sectional view of an essential portion thereof.

The preferred embodiment 21 will be described with reference to the drawings. FIG. 66 is a manufacturing process chart of a module manufacturing method in the preferred embodiment 21. In FIG. 66, those same as in FIG. 61 are given same reference numbers, and the description is simplified.

VCO in the preferred embodiment 21 is the one with pattern inductor 62 (see FIG. 37) disposed on the back side 52b of sub-substrate 52. Thus, the adjustment of inductance value of pattern inductor 62 can be made from the back side 52b.

In the preferred embodiment 21, as shown in FIG. 66, main substrate 81 with cream solder 87 printed in the printing process 86 is mounted with electronic component 89 in component mounting process 88, which is soldered in reflow process 90.

Next, cover setting process 95 is located in the downstream from reflow process 90, and cover 55 is set onto each sub-substrate 52. And, in the solder applying process 96 for applying cream solder, cream solder 87 is applied to leg 56 of cover 55 and soldered in reflow process 97. In this way, leg 56 of cover 55 is bonded solder 58 to the side of sub-substrate 52. And, VCO is affixed to pallet 123 in sheet affixing process 98 for affixing adhesive sheet 121 disposed in the downstream from reflow process 97.

Dividing process 105 is located in the downstream from sheet affixing process 98. In dividing process 105, main substrate 81 is divided in a state of being affixed to adhesive sheet 121 on pallet 123. In dividing process 105, both of connections 82a and 82b are divided. As a result, adjoining VCOs are electrically isolated from each other in a state of being arranged on pallet 123.

Each VCO is electrically isolated in the dividing process 105, and the oscillation frequency of VCO is adjusted in the laser trimming process 93 in the downstream from dividing process 105. Since pattern inductor 62 is disposed on the other main surface 52b of sub-substrate 52, trimming is executed with the other main surface 52b of sub-substrate 52 faced up.

Pattern inductor 62 is formed on the other main surface 52b of sub-substrate 52, but it is also preferable to be formed in the inner layer of sub-substrate 52. In this case, however, it is preferable to provide an opening opposing to the trimming portion of pattern inductor 62, exposing the trimming portion.

Thus, in the preferred embodiment 21, laser trimming can be executed from the other main surface 52b of sub-substrate 52, and it is not necessary to execute laser trimming process 93 before setting the cover 55. Accordingly, slitting process 91 and draining process 92 as shown in the preferred embodiment 20 are not needed, and it is possible to obtain inexpensive VCO because of less number of manufacturing processes.

Also, laser trimming process 93 for VCO is executed with cover 55 set in place. In the preferred embodiment 20 described earlier, since the oscillation frequency of VCO varies with cover 55 on or off in the laser trimming process 93, prospective adjustment is made, taking into account the deviation of oscillation frequency. Accordingly, the oscillation frequency after setting the cover 55 does not always become a desired oscillation frequency. However, in the preferred embodiment 21, the oscillation frequency of VCO is adjusted after setting the cover 55, and therefore, the oscillation frequency of VCO can be accurately adjusted to the desired frequency.

And cleaning process 94 is located in the downstream from laser trimming process 93. Solder balls generated in reflow process 90, 97 and trimming dust generated in laser trimming process 93 can be eliminated in the cleaning process 94. In the preferred embodiment 21, since the laminated circuit board is cleaned after reflow process 97, solder balls generated when cover 55 is soldered can be simultaneously eliminated.

Further, it is possible to eliminate dust such as dust from divided substrates in the dividing process 105, and therefore, VCO having stable oscillation frequency can be obtained. Also, in the preferred embodiment 21, since VCO is free of dust such as dust generated due to dividing, even when used in equipment having contacts, it hardly causes trouble to the contacts.

Inspection process 100 is located in the downstream from cleaning process 94. In the inspection process 100, electric characteristic and visual inspections of VCO are performed, and the inspection results are stored in memory 124. And, peeling process 102 is located in the downstream of inspection process 100, it reads the data of inspection results stored in memory 124 and removes accepted ones from pallet 123. And, marking process 101 is located in the downstream of peeling process 102. Marking is executed on VCO removed from pallet 123 in the peeling process 102. Thus, since marking is executed on accepted ones removed in the peeling process 102, it is possible to avoid trouble such as mixing of accepted ones and rejected ones.

Packaging process 103 is located in the downstream from marking process 101. In the packaging process 103, VCOs manufactured through the above processes are packaged. Since marking is executed only on accepted ones in the preferred embodiment 21 as well, it is possible to avoid such trouble that rejected ones are packaged in the packaging process 103.

INDUSTRIAL APPLICABILITY

In the laminated circuit board of the present invention, the sheet shape is maintained by woven or non-woven cloth, and the woven or non-woven cloth is impregnated with resin having heat fluidity, and therefore, sufficient resin is fully filled into the resin fluid filling portion, allowing no air or the like to remain therein. Accordingly, the electrical connections of electronic components will not be damaged due to stresses generated when the air or the like is thermally expanded, and it is possible to provide a laminated circuit board which can be mechanically firmly fixed.

Also, since electronic components are mounted in a substrate, they can be inspected in a state of being mounted in the substrate, and the non-defective percent after completion of the laminated circuit board is improved. Further, as resin softens during thermo-compression bonding, the resin is sufficiently filled into even narrow clearance.

Also, the laminated circuit board of the present invention is a laminated circuit board with sheet and substrate integrated by thermo-compression bonding, and around the electronic component formed in pattern, resin flowing out of the first sheet is filled into opening, causing the dielectric constant to become higher that at the first sheet main body, and the value of inductance can be increased. Also, the size can be reduced if not needed to increase the inductance value.

Also, the laminated circuit board of the present invention maintains the shape of sheet by woven or non-woven cloth, and the woven or non-woven cloth is impregnated with resin having heat fluidity, and therefore, sufficient resin is fully filled into the resin fluid filling portion, allowing no air or the like to remain therein. Accordingly, the electrical connections of electronic components will not be damaged due to stresses generated when the air or the like is thermally expanded, and the reliability of connections between the laminated circuit board and electronic component will be improved.

Also, electronic components are connected by reflow solder, assuring excellent productivity and high quality. Also, electronic components can be mounted in predetermined positions due to the self-alignment effect.

Further, since electronic components are mounted in a substrate, they can be inspected in a state of being mounted in the substrate, and the non-defective percent after completion of the laminated circuit board is improved. Also, as resin softens during thermo-compression bonding, the resin is sufficiently filled into even narrow clearance.

Also, in the laminated circuit board of the present invention, a plurality of fine electronic components are arranged with narrow pitches in one opening of the sheet of a laminated circuit board, and therefore, the electronic components can be mounted in high density. As a result, it will contribute to miniaturization.

Further, since electronic components are mounted in a substrate, they can be inspected in a state of being mounted in the substrate, and the non-defective percent after completion of the laminated circuit board is improved. Also, as resin softens during thermo-compression bonding, the resin is sufficiently filled into even narrow clearance.

Further, in the manufacturing method for a laminated circuit board of the present invention, electronic components are mounted in a substrate before integrating the substrate and sheet, and therefore, it is not necessary to execute positioning of the electronic component and the substrate when integrating the substrate and sheet. Accordingly, it is very easy to assemble.

Also, since the sheet is provided with opening having clearance against electronic component, it is easy to assemble even when electronic component protruding from the substrate is mounted.

Further, since electronic components are mounted in a substrate, they can be inspected in a state of being mounted in the substrate, and the non-defective percent after completion of the laminated circuit board is improved.

Also, in the manufacturing method for a laminated circuit board of the present invention, around the electronic component formed in pattern, resin flowing out of the sheet is filled into opening, causing the dielectric constant to become higher than at the first sheet main body, and the value of inductance of electronic component formed in pattern can be increased. Also, the size can be reduced if not needed to increase the inductance value.

Further, in the module manufacturing method of the present invention, a dividing process is inserted before an inspection process, and trouble generated in the dividing process can be inspected in the inspection process and it is possible to realize a high-quality module.

Furthermore, since the dividing process is provided before the inspection process, and a sheet affixing process is provided before the dividing process, sub-substrates affixed to a sheet are in a state of being connected to each other in the inspection process, and adjoining sub-substrates are electrically isolated from each other. Accordingly, they can be inspected together on a laminated circuit board basis in the inspection process, and it is possible to realize a module manufacturing method that may assure excellent productivity.

Also, in the module manufacturing method of the present invention, the value of coil inductance is adjusted by laser trimming from the opposite side of the component mounting side of electronic component, and therefore, the adjustment can be made after setting the cover. Accordingly, it is not necessary to again perform fine adjustment.

In addition, in the module manufacturing device of the present invention, since the main substrate of the module maintains the sheet shape by woven or non-woven cloth, and the woven or non-woven cloth is impregnated with resin having heat fluidity, sufficient resin is fully filled into the resin fluid filling portion, allowing no air or the like to remain therein. Accordingly, the electrical and mechanical connections will not be affected due to stresses generated when the air or the like is thermally expanded, thereby improving the reliability of the laminated circuit board and electronic components.

Also, since a dividing device is inserted before an inspecting device, trouble generated in the dividing device can be inspected by the inspecting device and it is possible to realize a high-quality module.

As described above, in a laminated circuit board, its manufacturing method, a module manufacturing method using the laminated circuit board, and its manufacturing device of the present invention, the electrical and mechanical connections between the land and electronic component disposed on the laminated circuit board are improved in reliability, and the industrial applicability is very high.

The invention claimed is:

1. A laminated circuit board with electronic components buried therein, comprising a substrate on which a land disposed on one main surface thereof is connected and fixed to an electrode of the electronic component by using a connecting and fixing material, a first sheet laminated on one main surface of the substrate and provided with a filling portion by fluid resin at an outer periphery of the electronic component, wherein the first sheet is provided with an opening having clearance against the outer periphery of the electronic component at a portion corresponding to the electronic component and is formed from plate-like woven or non-woven cloth impregnated with heat-fluid resin, and the first sheet and the substrate are integrated by thermo-compression bonding, and after the land is led to the other main surface at the opposite side of one main surface of the substrate by means of a first inner-via, it is again led to one main surface of the substrate by means of a second inner-via and is connected to a pattern formed on one main surface of the substrate.

2. The laminated circuit board of claim 1, wherein the first sheet and the substrate are thermally compressed at a temperature lower than the melting point temperature of the connecting and fixing material.

3. The laminated circuit board of claim 1, wherein thermosetting resin is used for the first sheet.

4. The laminated circuit board of claim 1, wherein the first sheet has an opening eccentrically to the electronic component.

5. The laminated circuit board of claim 1, wherein a second sheet is disposed on one main surface of the first sheet, and one main surface of the second sheet is coated with copper foil.

6. The laminated circuit board of claim 1, wherein tin-, silver- and copper-based solder is used as the connecting and fixing material.

7. The laminated circuit board of claim 1, wherein conductive adhesive having thermosetting property is used as the connecting and fixing material.

8. The laminated circuit board of claim 1, wherein the first sheet is formed by laminating a plurality of sheets being uniform in thickness.

9. The laminated circuit board of claim 1, wherein the thickness of the first sheet is higher than the height of the electronic component.

10. The laminated circuit board of claim 1, wherein the opening of the first sheet has a taper widening out toward the substrate.

11. The laminated circuit board of claim 1, wherein the first sheet is formed by laminating a plurality of sheets, and a hole forming the opening gradually becomes smaller as it is more away from the substrate.

12. The laminated circuit board of claim 1, wherein the first sheet is formed with a pattern on at least any one of one main surface and the other main surface thereof, and there is provided a via-hole through the first sheet, and a filler, paste-like mixture of conductive powder and resin, is filled into the via-hole.

13. The laminated circuit board of claim 12, wherein the first sheet has a plurality of layers formed by laminating a plurality of sheets, and each layer has a conductive path, and a via-hole formed by a pseudo-resistor connects between the conductive paths.

14. The laminated circuit board of claim 1, wherein the first sheet is formed by laminating a plurality of sheets; an inductor is formed on one main surface of one sheet out of the first sheets; a hole is formed in the upper and lower sheets which sandwich the inductor therebetween; and dielectric of small dielectric constant is filled into the hole, and its outside is grounded.

15. The laminated circuit board of claim 1, wherein a plurality of electric circuit blocks are formed on a substrate, and the first sheet is formed with a hole in order to partition the electric circuit blocks, and the hole is filled with a magnetic material.

16. The laminated circuit board of claim 1, wherein a high-frequency circuit block including an inductor is formed on the substrate, and a second hole is formed in the first sheet opposing to the inductor, and the second hole is filled with a magnetic material.

17. The laminated circuit board of claim 16, wherein a resist layer is disposed on one main surface of the inductor, and magnetic material is placed on the resist layer.

18. The laminated circuit board of claim 1, wherein a circuit pattern is formed on one main surface of a substrate, and the length of the circuit pattern is in reverse proportion to the square root of specific dielectric constant of the first sheet.

19. The laminated circuit board of claim 1, wherein clearance between the outer periphery of electronic component and the wall of opening is greater than the thickness of the first sheet.

20. The laminated circuit board of claim 1, wherein the electronic component is formed in pattern on one main surface of the substrate.

21. The laminated circuit board of claim 1, further comprising, a pattern inductor disposed in the vicinity of the electronic component, wherein the first sheet is provided with a filling portion by fluid resin at the outer periphery of the pattern inductor and the electronic component, wherein the electronic component is connected by reflow solder, and the first sheet is provided with opening having clearance between the electronic component and the outer periphery of the pattern inductor at a portion corresponding to the electronic component and the pattern inductor.

22. The laminated circuit board of claim 21, wherein the first sheet and the substrate are thermally compressed at a temperature lower than the melting point of the connecting and fixing material.

23. The laminated circuit board of claim 1, wherein the electronic component is formed by a plurality of electronic components and the electronic components are arranged with narrow pitches.

24. The laminated circuit board of claim 23, wherein the first sheet and the substrate are thermally compressed at a temperature lower than the melting point of the connecting and fixing material.

25. The laminated circuit board of claim 24, wherein thermosetting resin is used for the first sheet.

* * * * *